US010622078B2

United States Patent
Norman et al.

(10) Patent No.: US 10,622,078 B2
(45) Date of Patent: Apr. 14, 2020

(54) SYSTEM CONTROLLER AND METHOD FOR DETERMINING THE LOCATION OF THE MOST CURRENT DATA FILE STORED ON A PLURALITY OF MEMORY CIRCUITS

(71) Applicant: SUNRISE MEMORY CORPORATION, Los Gatos, CA (US)

(72) Inventors: Robert D. Norman, Pendleton, OR (US); Eli Harari, Saratoga, CA (US)

(73) Assignee: SUNRISE MEMORY CORPORATION, Fremont, CA (US)

( * ) Notice: Subject to any disclaimer, the term of this patent is extended or adjusted under 35 U.S.C. 154(b) by 0 days.

(21) Appl. No.: 16/107,306

(22) Filed: Aug. 21, 2018

(65) Prior Publication Data

US 2019/0006015 A1 Jan. 3, 2019

Related U.S. Application Data

(60) Division of application No. 15/248,420, filed on Aug. 26, 2016, now Pat. No. 10,121,553, which is a (Continued)

(51) Int. Cl.
*G11C 16/34* (2006.01)
*G11C 11/56* (2006.01)
(Continued)

(52) U.S. Cl.
CPC ...... *G11C 16/3431* (2013.01); *G11C 11/5628* (2013.01); *G11C 11/5635* (2013.01);
(Continued)

(58) Field of Classification Search
CPC ............ G11C 16/3431; G11C 16/0416; G11C 16/0491; G11C 11/5635; G11C 11/5628;
(Continued)

(56) References Cited

U.S. PATENT DOCUMENTS 6,434,053 B1 8/2002 Fujiwara
6,946,703 B2 9/2005 Ryu et al.
(Continued)

OTHER PUBLICATIONS

International Search Report and Written Opinion, PCT/US2018/038373, dated Sep. 11, 2018.
(Continued)

*Primary Examiner* — Jerome Leboeuf
(74) *Attorney, Agent, or Firm* — Edward C. Kwok; VLP Law Group, LLP

(57) ABSTRACT

A memory circuit that is organized into memory pages includes control circuitry for (a) associating a designated one or more memory pages to a data file and associating with the data file a unique identifier index number generated by a system controller; and associating a time-stamp with the unique identifier index number every time the data file is stored or updated in the memory circuit, wherein all unique identifier index numbers for all files stored in the memory circuit are stored in a lookup table in the memory circuit with the latest time-stamp and the location in the memory circuit at which the file is stored.

16 Claims, 35 Drawing Sheets

Related U.S. Application Data continuation of application No. 15/220,375, filed on Jul. 26, 2016, now Pat. No. 9,892,800.

(60) Provisional application No. 62/363,189, filed on Jul. 15, 2016, provisional application No. 62/260,137, filed on Nov. 25, 2015, provisional application No. 62/235,322, filed on Sep. 30, 2015.

(51) Int. Cl.

| | | |
|---|---|---|
| *H01L 29/10* | (2006.01) | |
| *G11C 16/04* | (2006.01) | |
| *H01L 29/08* | (2006.01) | |
| *H01L 29/786* | (2006.01) | |
| *H01L 29/92* | (2006.01) | |
| *H01L 27/11582* | (2017.01) | |
| *G11C 16/10* | (2006.01) | |
| *H01L 21/28* | (2006.01) | |
| *H01L 29/66* | (2006.01) | |
| *H01L 29/792* | (2006.01) | |
| *H01L 27/11565* | (2017.01) | |

(52) U.S. Cl.
CPC ...... *G11C 11/5642* (2013.01); *G11C 16/0416* (2013.01); *G11C 16/0466* (2013.01); *G11C 16/0483* (2013.01); *G11C 16/0491* (2013.01); *G11C 16/10* (2013.01); *H01L 27/11582* (2013.01); *H01L 29/0847* (2013.01); *H01L 29/1037* (2013.01); *H01L 29/40117* (2019.08); *H01L 29/66833* (2013.01); *H01L 29/78633* (2013.01); *H01L 29/7926* (2013.01); *H01L 29/92* (2013.01); *H01L 27/11565* (2013.01)

(58) Field of Classification Search
CPC ............ G11C 16/0466; G11C 16/0483; G11C 11/5642; H01L 29/7926; H01L 29/66833; H01L 21/28282; H01L 29/92; H01L 27/11582; H01L 29/0847; H01L 29/1037; H01L 29/78633; H01L 27/11565
See application file for complete search history.

(56) References Cited

U.S. PATENT DOCUMENTS

| | | |
|---|---|---|
| 8,630,114 B2 | 1/2014 | Lue |
| 9,892,800 B2 | 2/2018 | Harari |
| 10,074,667 B1 | 9/2018 | Higashi |
| 10,121,553 B2 | 11/2018 | Harari |
| 2001/0030340 A1 | 10/2001 | Fujiwara |
| 2001/0053092 A1 | 12/2001 | Kosaka et al. |
| 2004/0246807 A1* | 12/2004 | Lee .................. G11C 5/02 365/230.05 |
| 2005/0128815 A1 | 6/2005 | Ishikawa et al. |
| 2006/0155921 A1* | 7/2006 | Gorobets ............ G06F 12/0246 711/103 |
| 2008/0239812 A1 | 10/2008 | Naofumi et al. |
| 2009/0157946 A1* | 6/2009 | Arya .................. G06F 13/4239 711/103 |
| 2009/0237996 A1 | 9/2009 | Kirsch et al. |
| 2009/0279360 A1 | 11/2009 | Peter et al. |
| 2009/0316487 A1 | 12/2009 | Lee et al. |
| 2010/0124116 A1 | 5/2010 | Takashi et al. |
| 2011/0208905 A1* | 8/2011 | Shaeffer ................ G11C 16/10 711/103 |
| 2012/0182801 A1 | 7/2012 | Lue |
| 2012/0243314 A1 | 9/2012 | Takashi |
| 2014/0151774 A1 | 6/2014 | Rhie |
| 2014/0340952 A1 | 11/2014 | Ramaswamy et al. |
| 2016/0314042 A1* | 10/2016 | Plants ................. G06F 11/1068 |
| 2017/0092370 A1 | 3/2017 | Harari |
| 2018/0269229 A1 | 9/2018 | Or-Bach et al. |

OTHER PUBLICATIONS

PCT Search Report and Written Opinion, PCT/US2019/014319, dated Apr. 15, 2019.
Partial European Search Report EP 16869049.3, pp. 1-12, dated Jul. 1, 2019.

* cited by examiner (EMB-1)

(EMB-1)

(EMB-2)

(EMB-3)

(EMB-3)

(h-w)

(p- CHG)

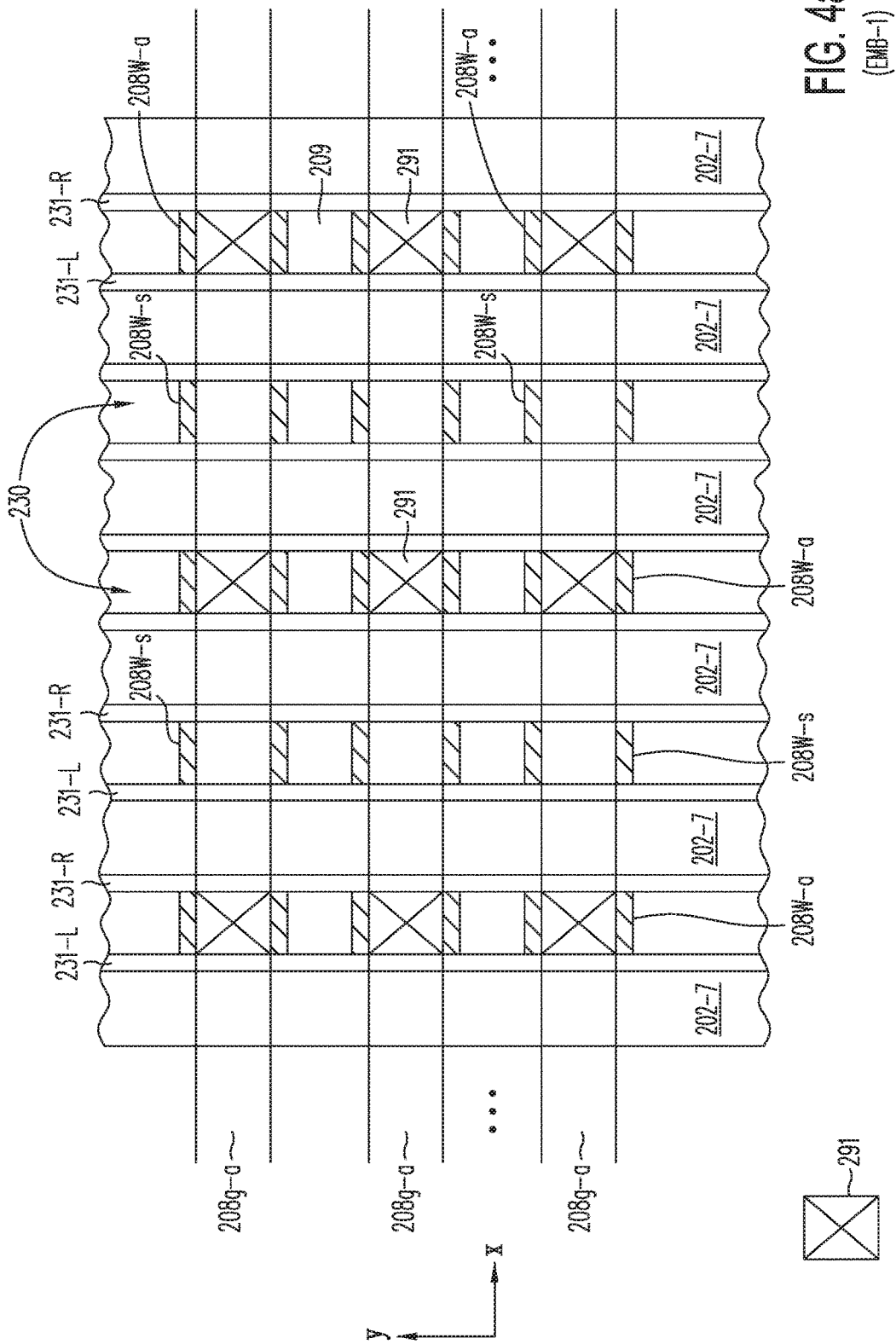

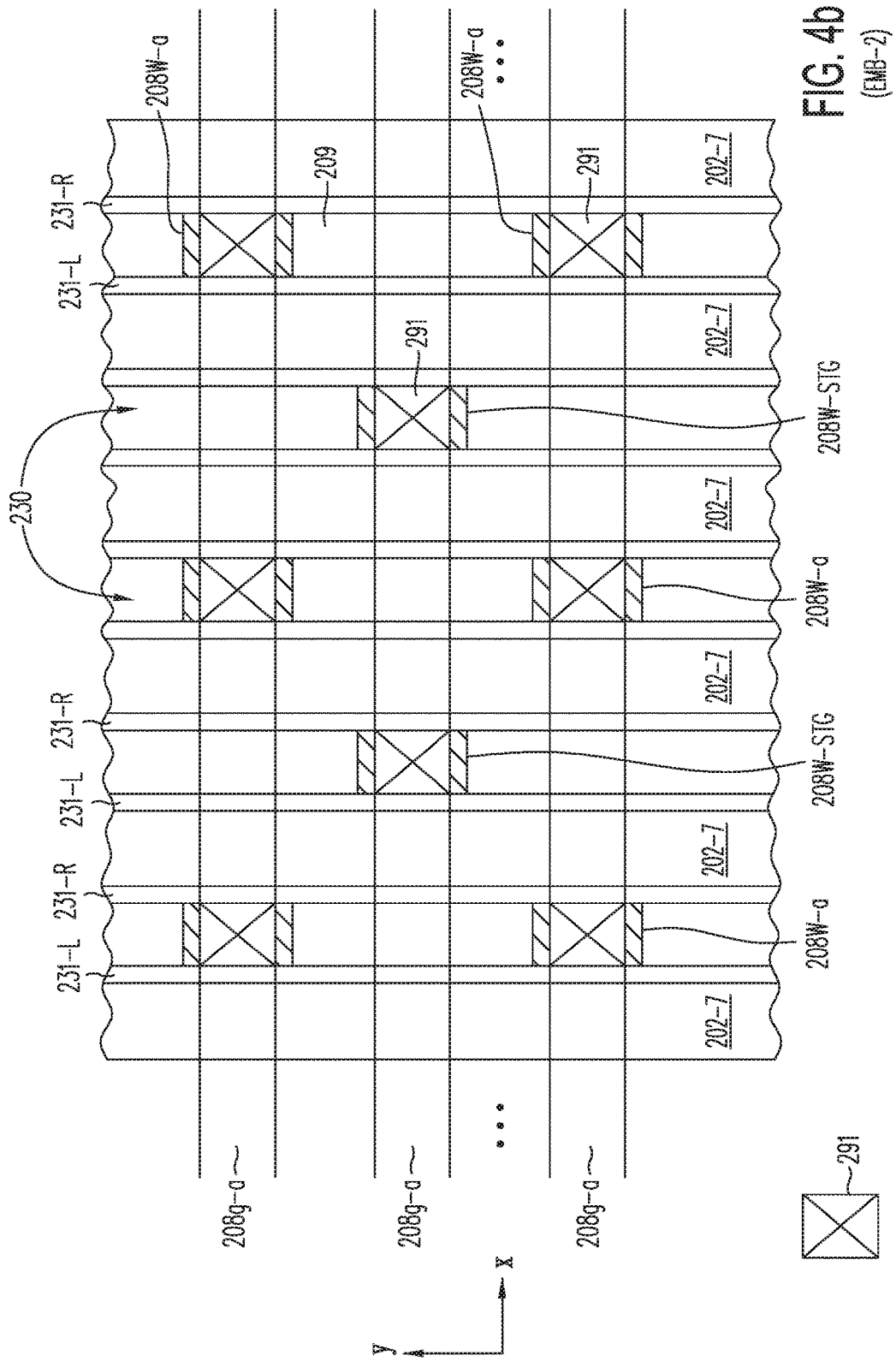

(EMB-3)

(EMB-3)

(EMB-1A)

(EMB-3A)

(EMB-3A)

(EMB-3A)

(EMB-3A)

(EMB-3A)

SYSTEM CONTROLLER AND METHOD FOR DETERMINING THE LOCATION OF THE MOST CURRENT DATA FILE STORED ON A PLURALITY OF MEMORY CIRCUITS

CROSS REFERENCE TO RELATED APPLICATIONS

The present invention is a divisional application of U.S. non-provisional patent application ("Non-provisional application I"), Ser. No. 15/248,420, entitled "Capacitive-Coupled Non-Volatile Thin-Film Transistor Strings in Three Dimensional Arrays," filed on Aug. 26, 2016, which is related to and claims priority of (i) U.S. provisional application ("Provisional Application I"), Ser. No. 62/235,322, entitled "Multi-gate NOR Flash Thin-film Transistor Strings Arranged in Stacked Horizontal Active Strips With Vertical Control Gates," filed on Sep. 30, 2015; (ii) U.S. provisional patent application ("Provisional application II"), Ser. No. 62/260,137, entitled "Three-dimensional Vertical NOR Flash Thin-film Transistor Strings," filed on Nov. 25, 2015; (iii) U.S. non-provisional patent application ("Non-Provisional application II"), Ser. No. 15/220,375, "Multi-Gate NOR Flash Thin-film Transistor Strings Arranged in Stacked Horizontal Active Strips With Vertical Control Gates," filed on Jul. 26, 2016; and (vi) U.S. provisional patent application ("Provisional application III"), Ser. No. 62/363,189, entitled "Capacitive Coupled Non-Volatile Thin-film Transistor Strings," filed Jul. 15, 2016. The disclosures of Provisional application I, Provisional application II, Non-Provisional patent application I, Non-Provisional patent application II, and Provisional application IV are hereby incorporated by reference in their entireties.

BACKGROUND OF THE INVENTION

1. Field of the Invention

The present invention relates to high-density memory structures. In particular, the present invention relates to high-density, low read-latency memory structures formed by interconnected thin-film storage elements (e.g., stacks of thin-film storage transistors, or "TFTs", organized as NOR-type TFT strings or "NOR strings").

2. Discussion of the Related Art

In this disclosure, memory circuit structures are described. These memory circuit structures may be fabricated on planar semiconductor substrates (e.g., silicon wafers) using conventional fabrication processes. To facilitate clarity in this description, the term "vertical" refers to the direction perpendicular to the surface of a semiconductor substrate, and the term "horizontal" refers to any direction that is parallel to the surface of that semiconductor substrate.

A number of high-density non-volatile memory structures, sometimes referred to as "three-dimensional vertical NAND strings," are known in the prior art. Many of these high-density memory structures are formed using thin-film storage transistors (TFTs) formed out of deposited thin-films (e.g., polysilicon thin-films), and organized as arrays of "memory strings." One type of memory strings is referred to as NAND memory strings or simply "NAND strings". A NAND string consists of a number of series-connected TFTs. Reading or programming any of the series-connected TFTs requires activation of all series-connected TFTs in the NAND string. Under this NAND arrangement, the activated TFTs that are not read or programmed may experience undesirable program-disturb or read-disturb conditions. Further, TFTs formed out of polysilicon thin films have much lower channel mobility—and therefore higher resistivity—than conventional transistors formed in a single-crystal silicon substrate. The higher series resistance in the NAND string limits the number of TFTs in a string in practice to typically no more than 64 or 128 TFTs. The low read current that is required to be conducted through a long NAND string results in a long latency.

Another type of high density memory structures is referred to as the NOR memory strings or "NOR strings." A NOR string includes a number of storage transistors each of which is connected to a shared source region and a shared drain region. Thus, the transistors in a NOR string are connected in parallel, so that a read current in a NOR string is conducted over a much lesser resistance than the read current through a NAND string. To read or program a storage transistor in a NOR string, only that storage transistor needs to be activated (i.e., "on" or conducting), all other storage transistors in the NOR string may remain dormant (i.e., "off" or non-conducting). Consequently, a NOR string allows much faster sensing of the activated storage transistor to be read. Conventional NOR transistors are programmed by a channel hot-electron injection technique, in which electrons are accelerated in the channel region by a voltage difference between the source region and the drain region and are injected into the charge-trapping layer between the control gate and the channel region, when an appropriate voltage is applied to the control gate. Channel hot-electron injection programming requires a relatively large electron current to flow through the channel region, therefore limiting the number of transistors that can be programmed in parallel. Unlike transistors that are programmed by hot-electron injection, in transistors that are programmed by Fowler-Nordheim tunneling or by direct tunneling, electrons are injected from the channel region to the charge-trapping layer by a high electric field that is applied between the control gate and the source and drain regions. Fowler-Nordheim tunneling and direct tunneling are orders of magnitude more efficient than channel hot-electron injection, allowing massively parallel programming; however, such tunneling is more susceptible to program-disturb conditions.

3-Dimensional NOR memory arrays are disclosed in U.S. Pat. No. 8,630,114 to H. T Lue, entitled "Memory Architecture of 3D NOR Array", filed on Mar. 11, 2011 and issued on Jan. 14, 2014.

U.S. patent Application Publication US2016/0086970 A1 by Haibing Peng, entitled "Three-Dimensional Non-Volatile NOR-type Flash Memory," filed on Sep. 21, 2015 and published on Mar. 24, 2016, discloses non-volatile NOR flash memory devices consisting of arrays of basic NOR memory groups in which individual memory cells are stacked along a horizontal direction parallel to the semiconductor substrate with source and drain electrodes shared by all field effect transistors located at one or two opposite sides of the conduction channel.

Three-dimensional NAND memory structures are disclosed, for example, in U.S. Pat. No. 8,878,278 to Alsmeier et al. ("Alsmeier"), entitled "Compact Three Dimensional Vertical NAND and Methods of Making Thereof," filed on Jan. 30, 2013 and issued on Nov. 4, 2014. Alsmeier discloses various types of high-density NAND memory structures, such as "terabit cell array transistor" (TCAT) NAND arrays (FIG. 1A), "pipe-shaped bit-cost scalable" (P-BiCS) flash memory (FIG. 1B) and a "vertical NAND" memory string structure. Likewise, U.S. Pat. No. 7,005,350 to Walker et al. ("Walker I"), entitled "Method for Fabricating Programmable Memory Array Structures Incorporating Series-Connected Transistor Strings," filed on Dec. 31, 2002 and issued on Feb. 28, 2006, also discloses a number of three-dimensional high-density NAND memory structures.

U.S. Pat. No. 7,612,411 to Walker ("Walker II"), entitled "Dual-Gate Device and Method" filed on Aug. 3, 2005 and issued on Nov. 3, 2009, discloses a "dual gate" memory structure, in which a common active region serves independently controlled storage elements in two NAND strings formed on opposite sides of the common active region.

U.S. Pat. No. 6,744,094 to Forbes ("Forbes"), entitled "Floating Gate Transistor with Horizontal Gate Layers Stacked Next to Vertical Body" filed on May 3, 2004 and issued on Oct. 3, 2006, discloses memory structures having vertical body transistors with adjacent parallel horizontal gate layers.

U.S. Pat. No. 6,580,124 to Cleaves et al, entitled "Multigate Semiconductor Device with Vertical Channel Current and Method of Fabrication" filed on Aug. 14, 2000 and issued on Jun. 17, 2003, discloses a multi-bit memory transistor with two or four charge storage mediums formed along vertical surfaces of the transistor.

A three-dimensional memory structure, including horizontal NAND strings that are controlled by vertical polysilicon gates, is disclosed in the article "Multi-layered Vertical gate NAND Flash Overcoming Stacking Limit for Terabit Density Storage" ("Kim"), by W. Kim at al., published in the 2009 Symposium on VLSI Tech. Dig. of Technical Papers, pp 188-189. Another three-dimensional memory structure, also including horizontal NAND strings with vertical polysilicon gates, is disclosed in the article, "A Highly Scalable 8-Layer 3D Vertical-gate (VG) TFT NAND Flash Using Junction-Free Buried Channel BE-SONOS Device," by H. T. Lue et al., published in the 2010 Symposium on VLSI: Tech. Dig. Of Technical Papers, pp. 131-132.

U.S. Pat. No. 8,026,521 to Zvi Or-Bach et al, entitled "Semiconductor Device and Structure," filed on Oct. 11, 2010 and issued on Sep. 27, 2011 to Zvi-Or Bach et al discloses a first layer and a second layer of layer-transferred mono-crystallized silicon in which the first and second layers include horizontally oriented transistors. In that structure, the second layer of horizontally oriented transistors overlays the first layer of horizontally oriented transistors, each group of horizontally oriented transistors having side gates.

In the memory structures discussed herein, stored information is represented by the stored electric charge, which may be introduced using any of a variety of techniques. For example, U.S. Pat. No. 5,768,192 to Eitan, entitled "Memory Cell Utilizing Asymmetrical Charge-trapping," filed on Jul. 23, 1996 and issued on Jun. 16, 1998, discloses NROM type memory transistor operation based on the hot electron channel injection technique.

Transistors that have a conventional non-volatile memory transistor structure but short retention times may be referred to as "quasi-volatile." In this context, conventional non-volatile memories have data retention time exceeding tens of years. A planar quasi-volatile memory transistor on single crystal silicon substrate is disclosed in the article "High-Endurance Ultra-Thin Tunnel Oxide in Monos Device Structure for Dynamic Memory application", by H. C. Wann and C. Hu, published in IEEE Electron Device letters, Vol. 16, No. 11, November 1995, pp 491-493. A quasi-volatile 3-D NOR array with quasi-volatile memory is disclosed in the U.S. Pat. No. 8,630,114 to H. T Lue, mentioned above.

SUMMARY

According to one embodiment of the present invention, an array of memory cells includes TFTs formed in stacks of horizontal active strips running parallel to the surface of a silicon substrate and control gates in vertical local word lines running along one or both sidewalls of the active strips, with the control gates being separated from the active strips by one or more charge-storage elements. Each active strip includes at least a channel layer formed between two shared source or drain layers. The TFTs are organized as NOR strings, The TFTs associated with each active strip may belong to one or two NOR strings, depending on whether one or both sides of each active strip are used.

In one embodiment, only one of the shared source or drain layers in an active strip is connected by a conductor to a supply voltage through a select circuit, while the other source or drain layer is held at a voltage determined by the quantity of charge that is provided to that source or drain layer. Prior to a read, write or erase operation, some or all of the TFTs in a NOR string along the active strip that are not selected for the read, write or erase operation act as a strip capacitor, with the channel and source or drain layers of the active strip providing one capacitor plate and the control gate electrodes in the TFTs of the NOR string that are referenced to a ground reference providing the other capacitor plate. The strip capacitor is pre-charged before the read, write or erase operation by turning on one or more TFTs ("pre-charge TFT") momentarily to transfer charge to the strip capacitor from the source or drain layer that is connected by conductor to a voltage source. Following the pre-charge operation, the select circuit is deactivated, so that the pre-charged source or drain layer is held floating at substantially the pre-charged voltage. In that state, the charged strip capacitor provides a virtual reference voltage source for the read, write, or erase operation. This pre-charged state enables massively parallel read, write or erase operations on a large number of addressed TFTs. In this manner, TFT of many NOR strings on one or more active strips in one or more blocks of a memory array may be read, written or erased concurrently. In fact, blocks in a memory array can be pre-charged for program or erase operations, while other blocks in the memory array can be pre-charged for read operations concurrently.

In one embodiment, TFTs are formed using both vertical side edges of each active strip, with vertical local word lines being provided along both the vertical side edges of the active strips. In that embodiment, double-density is achieved by having the local word lines along one of vertical edges of an active strip contacted by horizontal global word lines provided above the active strip, while the local word lines along the other vertical edge of the active strip are contacted by horizontal global word lines provided beneath the active strip. All global word lines may run in a direction transverse to the direction along the lengths of the corresponding active strips. Even greater storage density may be achieved by storing more than one bit of data in each TFT.

Organizing the TFTs into NOR strings in the memory array—rather than the prior art NAND strings—results in (i) a reduced read-latency that approaches that of a dynamic random access memory (DRAM) array, (ii) reduced sensitivities to read-disturb and program-disturb conditions that are known to be associated with long NAND strings, (iii) reduced power dissipation and a lower cost-per-bit relative to planar NAND or 3-D NAND arrays, and (iv) the ability to read, write or erase TFTs on multiple active strips concurrently to increase data throughput.

According to one embodiment of the present invention, variations in threshold voltages within NOR strings in a block may be compensated by providing electrically programmable reference NOR strings within the block. Effects on a read operation due to background leakage currents inherent to NOR strings can be substantially eliminated by comparing the sensed result of the TFT being read and that of a concurrently read TFT in a reference NOR string. In other embodiments, the charge-storing element of each TFT may have its structure modified to provide a high write/erase cycle endurance (albeit, a lower data retention time that requires periodic refreshing). In this detailed description, such TFTs having a higher write/erase cycle endurance but a shorter retention time than the conventional memory TFTs (e.g., TFTs in conventional NAND strings) are referred to as being "quasi-volatile." However, as these quasi-volatile TFTs require refreshing significantly less frequently than a conventional DRAM circuit, the NOR strings of the present invention may be used in lieu of DRAM in some applications. Using the NOR strings of the present invention in DRAM applications allows a substantially lower cost-per-bit figure of merit, as compared to the conventional DRAMs, and a substantially lower read-latency, as compared to conventional NAND strings.

According to some embodiments of the present invention, the active strips are manufactured in a semiconductor process in which the source or drain layers, and the channel layers are formed and annealed individually for each plane in the stack. In other embodiments, the source or drain layers are annealed either individually or collectively (i.e., in a single step for all the source or drain layers), prior to concurrently forming the channel layers in a single step.

The present invention is better understood upon consideration of the detailed description below, in conjunction with the accompanying drawings.

BRIEF DESCRIPTION OF THE DRAWINGS

FIG. 1a-2 shows conceptualized memory structure in which the memory cells of memory array or block 100 of FIG. 1a-1 are alternatively organized into pages (e.g., page 113), slices (e.g., slice 114) and columns (e.g., column 115), according to one embodiment of the present invention.

FIG. 2b-1 shows semiconductor structure 220a having N$^+$ sublayers 221 and 223 and P$^-$ sublayer 222; semiconductor structure 220a may be used to implement any of active layers 202-0 to 202-7 of FIG. 2a, in accordance with one embodiment of the present invention.

FIG. 2b-2 shows semiconductor structure 220b, which adds metallic sublayer 224 to semiconductor structure 220a of FIG. 2b-1; metallic sublayer 224 is formed adjacent N$^+$ sublayer 223, in accordance with one embodiment of the present invention.

FIG. 2b-3 shows semiconductor structure 220c, which adds metallic sublayers 224 to semiconductor structure 220a of FIG. 2b-1, metallic sublayers 224 are each formed adjacent to either one of N$^+$ sublayers 221 or one of N$^+$ sublayers 223, in accordance with one embodiment of the present invention.

FIG. 2b-4 shows semiconductor structure 220a of FIG. 2b-1, after partial annealing by a shallow rapid laser anneal step (represented by laser apparatus 207), in accordance with one embodiment of the present invention.

FIG. 2b-5 shows semiconductor structure 220d of FIG. 2b-1, after inclusion of additional ultra-thin sublayers 221-d and 223-d to semiconductor structure 220a of FIG. 2b-1, according to one embodiment of the present invention.

FIG. 2d illustrates forming trenches 230 in structure 200 of FIG. 2a, in a cross section in an X-Y plane through active layer 202-7 in one portion of semiconductor structure 200 of FIG. 2a.

FIG. 2i-1 shows a three-dimensional view of horizontal active layers 202-4 to 202-7 of embodiment EMB-1 of FIG. 2i, with local word lines 208W-s or local pre-charge word lines 208-CHG connected to global word lines 208g-s, and local word lines 208W-a connected to global word lines 208g-a, and showing each active layer as having its N$^+$ layer 223 (acting as a drain region) connected through select circuits to any of voltage supplies (e.g., $V_{ss}$, $V_{bl}$, $V_{pgm}$, $V_{inhibit}$, and $V_{erase}$), with decoding, sensing and other circuits arranged either adjacent or directly underneath the memory arrays; these circuits are represented schematically by circuitry 206-0 and 206-1 in substrate 201.

FIG. 2k-1 shows embodiment EMB-3 of FIG. 2k, in which optional P-doped pillars 290 are provided to fill part or all of isolation trenches 209, so as to selectively connect P⁻ sublayers 222 to substrate circuits; P-doped pillars 290 may supply back-bias voltage $V_{bb}$ or erase voltage $V_{erase}$ to P⁻ sublayers 222 (see, also, FIGS. 3a and 4c).

FIG. 4a is a cross section in the X-Y plane of embodiment EMB-1 of FIGS. 2i and 2i-1, showing contacts 291 connecting local word lines 208W-a to global word lines 208g-a at the top of the memory array; likewise, local word lines 208W-s are connected to global word lines 208g-s (not shown) running at the bottom of the memory array substantially parallel to the top global word line.

FIG. 4b is a cross section in the X-Y plane of embodiment EMB-2 of FIG. 2j, showing contacts 291 connecting local word lines 208W-a and staggered local word lines 208W-STG to either top global word lines 208g-a only, or alternatively, to bottom global word lines only (not shown) in a staggered configuration of TFTs along both sides of each active strip.

FIG. 5h-1 shows cross section 500 in the Z-X plane, showing active strips immediately prior to etching the sacrificial SAC1 material between N⁺ sublayers 521 and 522, in accordance with one embodiment of the present invention.

FIG. 5h-2 shows cross section 500 of FIG. 5h-1, after sideway selective etching of the SAC1 material (along the direction indicated by reference numeral 537) to form selective support spines out of the SAC1 material (e.g., spine SAC1-a), followed by filling the recesses with P⁻ doped material (e.g., P⁻ doped polysilicon) and over the sidewalls of the active strips, according to one embodiment of the present invention.

FIG. 5h-3 shows cross section 500 of FIG. 5h-2, after removal of the P⁻ material from areas 525 along the sidewalls of the active strips, while leaving P⁻ sublayer 522 in the recesses, in accordance with one embodiment of the present invention; FIG. 5h-3 also shows removal of isolation materials from trenches 530, formation of charge-trapping layer 531 and local word lines 208-W, thus forming transistors $T_L$585 and $T_R$585 on opposite sides of the active strips.

FIG. 6b also shows (i) programmable reference slice 114-Ref (indicated by area A) in quadrant Q3 similarly providing corresponding reference TFTs for slice 114 in mirror image quadrant Q1, sharing sense amplifiers SA(b), and (ii) programmable reference plane 110-Ref in quadrant Q2 providing corresponding reference TFTs to plane 110 in mirror image quadrant Q1, sharing sense amplifiers SA(c), and also providing corresponding reference TFTs for NOR strings in the same quadrant (e.g., NOR string 112).

FIG. 6c also show spare planes 117, which may be used to provide replacement or substitution NOR strings or pages in quadrant Q2.

FIG. 7 demonstrates an erase operation in which electrons trapped in storage material 531 (e.g., in regions 577 and 578) are removed to N⁺ sublayer 521 and N⁺ sublayer 523, assisted by fringing electric field 574.

DETAILED DESCRIPTION OF THE PREFERRED EMBODIMENTS

Figures 1, 1A:
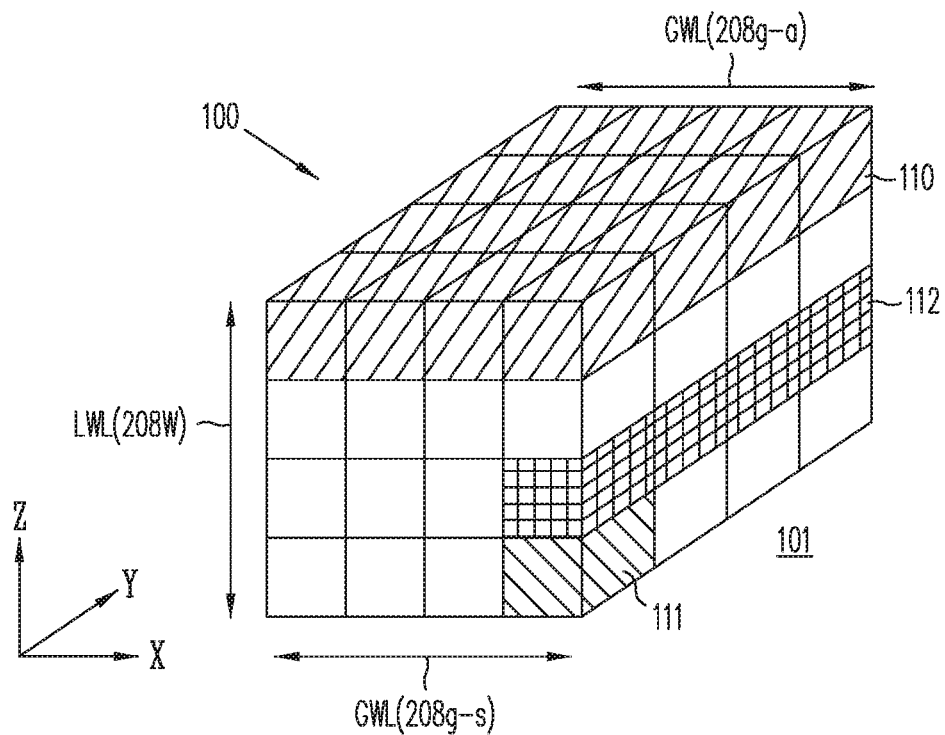
FIG. 1a-1 is a conceptualized memory structure which illustrates an array of memory cells being organized into planes (e.g., plane 110) and active strips (e.g., active strip 112) in one memory array or block 100 formed on substrate 101, according to embodiments of the present invention.
Figures 1, 1A, 2:
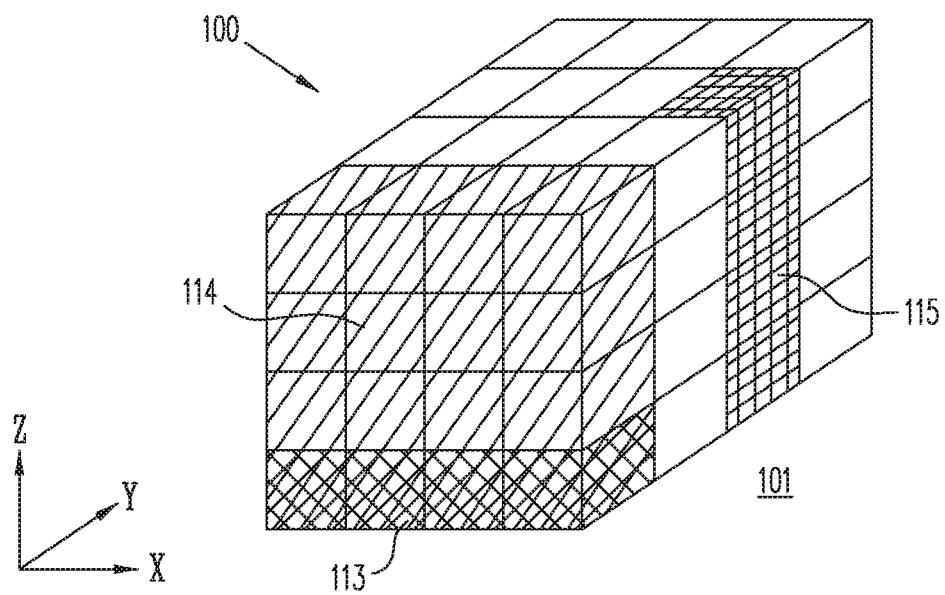

FIGS. 1a-1 and 1a-2 show conceptualized memory structure 100, illustrating in this detailed description an organization of memory cells according to embodiments of the present invention. As shown in FIG. 1a-1, memory structure 100 represents a 3-dimensional memory array or block of memory cells formed in deposited thin-films fabricated over a surface of substrate layer 101. Substrate layer 101 may be, for example, a conventional silicon wafer used for fabricating integrated circuits, familiar to those of ordinary skill in the art. In this detailed description, a Cartesian coordinate system (such as indicated in FIG. 1a-1) is adopted solely for the purpose of facilitating description. Under this coordinate system, the surface of substrate layer 101 is considered a plane which is parallel to the X-Y plane. Thus, as used in this description, the term "horizontal" refers to any direction parallel to the X-Y plane, while the term "vertical" refers to the Z-direction. As shown, block 100 consists of four planes (e.g., plane 110) stacked in the vertical direction one on top of, and isolated from, each other. Each plane consists of horizontal active strips of NOR strings (e.g., active strip 112). Each NOR string includes multiple TFTs (e.g., TFT 111) formed side-by-side along the active strip, with thin-film transistor current flowing in the vertical direction, as described in further detail below. Unlike prior art NAND strings, in the NOR string of the present invention, writing, reading or erasing one of the TFTs in the NOR string does not require activating other TFTs in the NOR string. Accordingly, each NOR string is randomly addressable and, within such a NOR string, each TFT is randomly accessible.

Plane 110 is shown as one of four planes that are stacked on top of each other and isolated from each other. Along the length of horizontal active strip 112 are formed side-by-side TFTs (e.g., TFT 111). In FIG. 1a-1, for illustrative purpose only, each plane has four horizontal active strips that are isolated from each other. Both the plane and the NOR strings are individually addressable.

FIG. 1a-2 introduces additional randomly addressable units of memory cells: "columns," "pages" and "slices". In FIG. 1a-2, each column (e.g., column 115) represents TFTs of multiple NOR strings that share a common control gate or local word line, the NOR strings are formed along active strips of multiple planes. Note that, as a conceptualized structure, memory structure 100 is merely an abstraction of certain salient characteristics of a memory structure of the present invention. Although shown in FIG. 1a-1 as an array of 4×4 active strips, each having four TFTs along their respective lengths, a memory structure of the present invention may have any number of TFTs along any of the X-, Y- and Z-directions. For example, there may be 1, 2, 4, 8, 16, 32, 64 ... planes of strings in the Z direction, 2, 4, 8, 16, 32, 64, ... active strips of NOR strings along the X-direction, and each NOR string may have 2, 4, 8, 16, ... 8192 or more side-by-side TFTs in the Y-direction. The use of numbers that are integer powers of 2 (i.e., $2^n$, where n is an integer) follows a customary practice in conventional memory design. It is customary to access each addressable unit of memory by decoding a binary address. Thus, for example, a memory structure of the present invention may have M NOR strings along each of the X and Z directions, with M being a number that is not necessarily $2^n$, for any integer n. TFTs of structure 100 of the present invention can be read, programmed or erased simultaneously on individual page or individual slice basis. (As shown in FIG. 1a-2, a "page" refers to a row of TFTs along the Y-direction; a "slice" refers to an organization of contiguous memory cells that extend along both the X- and Z-directions and one memory cell deep along the Y-direction). An erase operation can also be performed in one step for entire memory block 100.

As a conceptualized structure, memory structure 100 is not drawn to scale in any of the X-, Y-, and Z-directions.

Figure 1B:
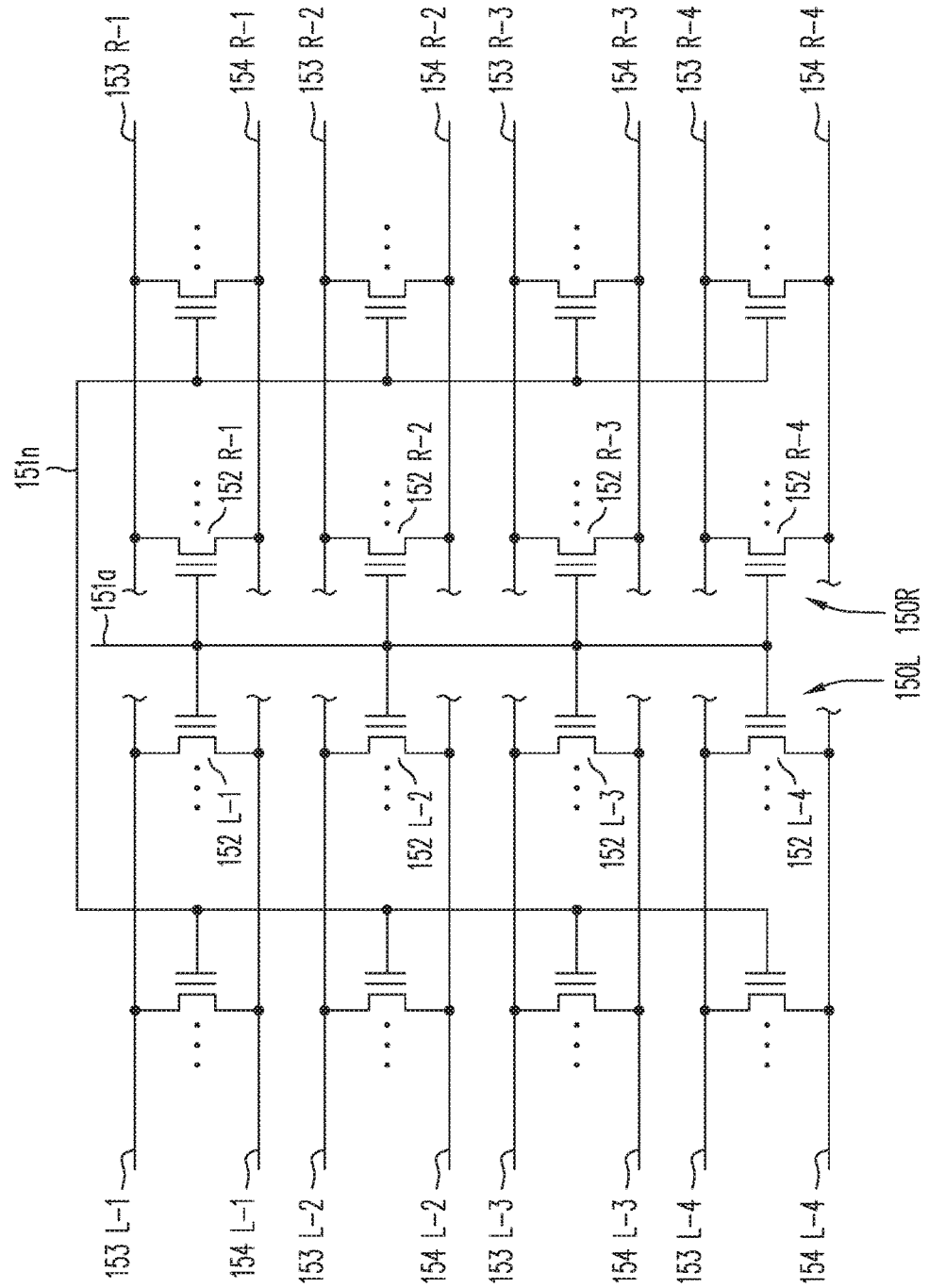
FIG. 1b shows a basic circuit representation of four NOR string pairs, each NOR string pair being located in a respective one of four planes, according to one embodiment of the present invention; corresponding TFTs of each NOR string share common vertical local word lines.

FIG. 1b shows a basic circuit representation of four NOR string pairs, each NOR string pair being located in a respective one of four planes, according to one embodiment of the present invention; corresponding TFTs of each NOR string share common local word lines (e.g., local word line 151n). The detailed structure of this configuration is discussed and illustrated below in conjunction with FIG. 2k. As shown in FIG. 1b, this basic circuit configuration includes four NOR string pairs on four separate planes (e.g., NOR strings 150L and 150R in plane 159-4) that are provided in adjacent columns 115 of memory structure 100 sharing a common local word line.

As shown in FIG. 1b, NOR strings 150L and 150R may be NOR strings formed along two active strips located on opposite sides of shared local word line 151a. TFTs 152R-1 to 152R-4 and 152L-1 to 152L-4 may be TFTs located in the four active strips and the four active strips on opposite sides of local word line 151a, respectively. In this embodiment, as illustrated in greater detail below in conjunction with FIG. 2k and FIG. 4c, a greater storage density may be achieved by having a shared vertical local word line control TFTs of adjacent active strips. For example, local word line 151a controls TFTs 152R-1, 152R-2, 152R-3 and 152R-4 from four NOR strings located on four planes, as well as TFTs 152L-1, 152L-2, 152L-3 and 152L-4 from four adjacent NOR strings on corresponding planes. As discussed in greater detail below, in some embodiments, the parasitic capacitance C intrinsic to each NOR string (e.g., the distributed capacitance between the common N$^+$ source region or N$^+$ drain region of a NOR string and its multiple associated local word lines) may be used as a virtual voltage source, under some operating conditions, to provide source voltage $V_{ss}$.

Figure 1C:
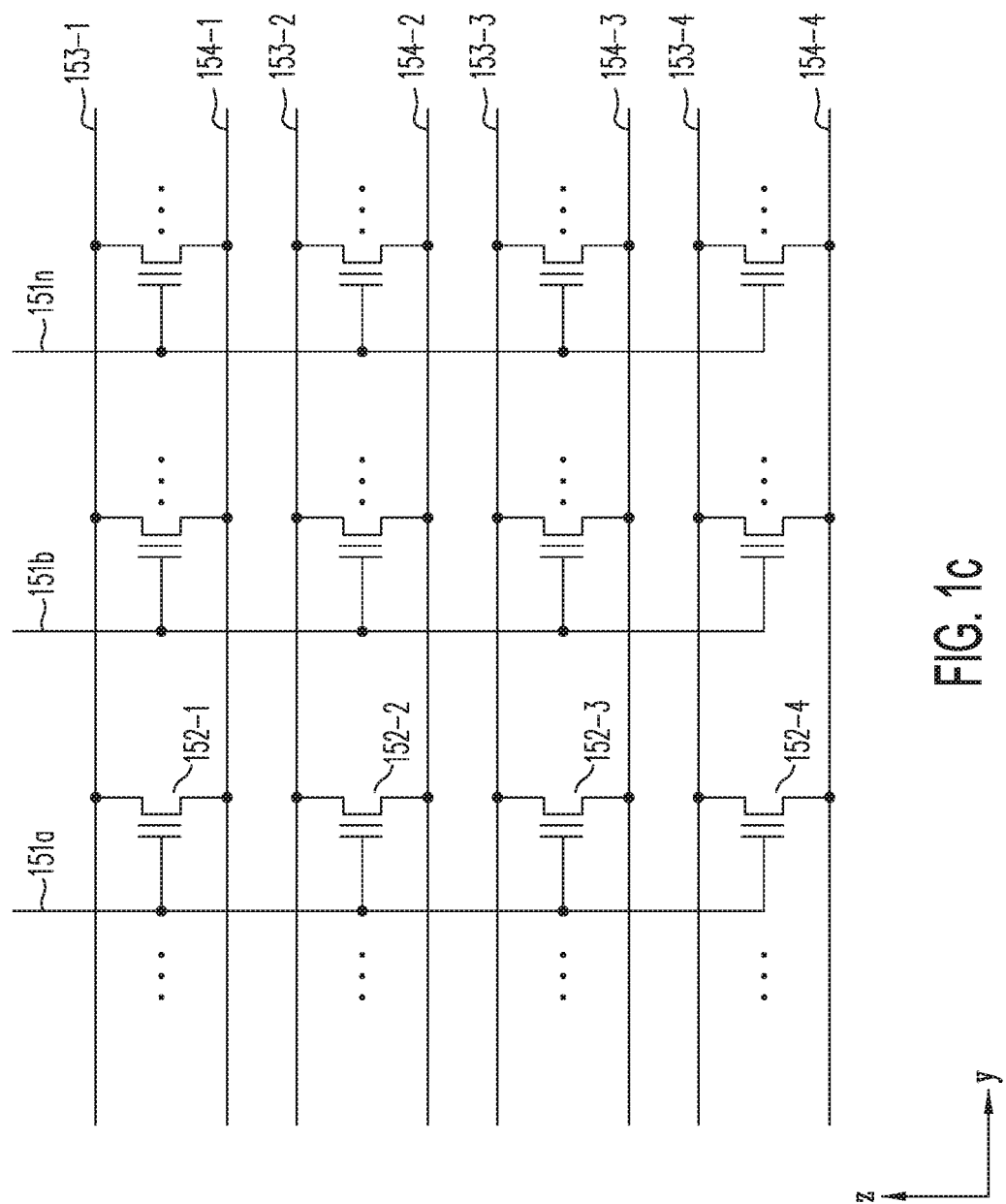
FIG. 1c shows a basic circuit representation of four NOR strings, each NOR string being located in a respective one of four planes, according to one embodiment of the present invention; corresponding TFTs of each NOR string share common local word lines.

FIG. 1c shows a basic circuit representation of four NOR strings, each NOR string being located in a respective one of four planes, according to one embodiment of the present invention. In FIG. 1c, corresponding TFTs of each NOR string share common local word lines. Each NOR string may run horizontally along the Y-direction, with storage elements (i.e., TFTs) connected between source line 153-m and drain or bit lines 154-m, where m is the index between 1 to 4 of the corresponding active strip, with drain-source transistor currents flowing along the Z-direction. Corresponding TFTs in the 4 NOR strings share corresponding one of local word lines 151-n, where n is the index of a local word line. The TFTs in the NOR strings of the present invention are variable threshold voltage thin-film storage transistors that may be programmed, program-inhibited, erased, or read using conventional programming, inhibition, erasure and read voltages. In one or more embodiments of the present invention, the TFTs are implemented by thin-film storage transistors that are programmed or erased using Fowler-Nordheim tunneling or direct tunneling mechanisms. In another embodiment, channel hot-electron injection may be used for programming.

Process Flow

Figure 2A:
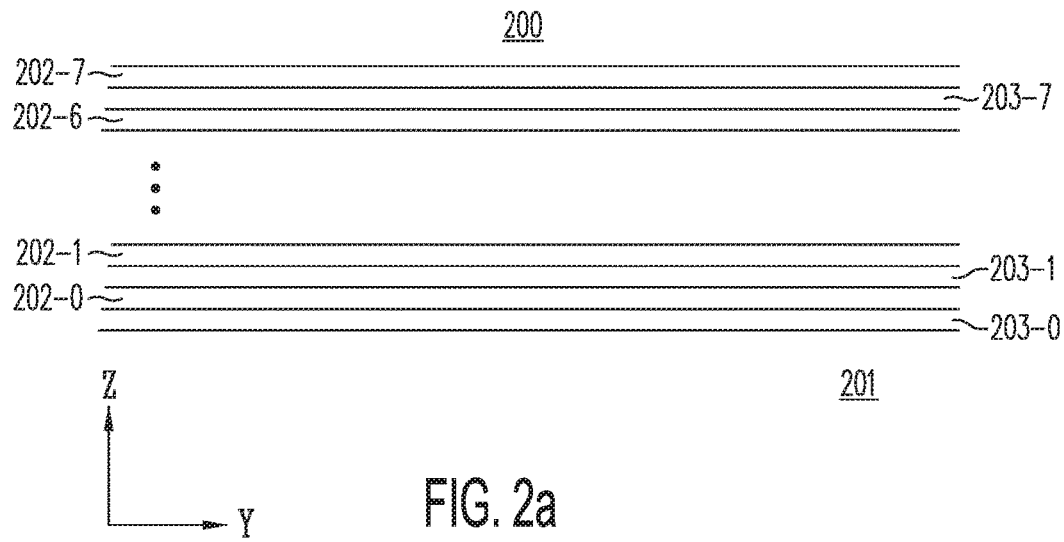
FIG. 2a shows a cross section in a Y-Z plane of semiconductor structure 200, after active layers 202-0 to 202-7 (each separated from the next active layer respectively by isolation layers 203-0 to 203-7) have been formed on semiconductor substrate 201, but prior to formation of individual active strips, in accordance with one embodiment of the present invention.

FIG. 2a shows a cross section in a Y-Z plane of semiconductor structure 200, after active layers 202-0 to 202-7 (each separated from the next active layer respectively by isolation layers 203-0 to 203-7) have been formed on semiconductor substrate 201, but prior to formation of individual active strips, in accordance with one embodiment of the present invention. Semiconductor substrate 201 represents, for example, a P$^-$ doped bulk silicon wafer on which support circuits for memory structure 200 may be formed prior to forming the active layers. Such support circuits, which may be formed alongside contacts 206-0 and 206-1 in FIGS. 2c and 2i-1, may include both analog and digital circuits. Some examples of such support circuits include shift registers, latches, sense amplifiers, reference cells, power supply lines, bias and reference voltage generators, inverters, NAND, NOR, Exclusive-Or and other logic gates, input/output drivers, address decoders (e.g., bit line and word line decoders), other memory elements, sequencers and state machines. These support circuits may be formed out of the building blocks for conventional devices (e.g., N-wells, P-wells, triple wells, N$^+$, P$^+$ diffusions, isolation regions, low and high voltage transistors, capacitors, resistors, vias, interconnects and conductors), as is known to those of ordinary skill in the art.

After the support circuits have been formed in and on semiconductor substrate 201, isolation layer 203-0 is provided, which may be a deposited or grown thick silicon oxide, for example.

Next, in some embodiments, one or more layers of interconnect may be formed, including "global word lines," which are further discussed below. Such metallic interconnect lines (e.g., global word line landing pads 264 of FIG. 2c, discussed below) may be provided as horizontal long narrow conductive strips running along a predetermined direction that may be perpendicular to the active NOR strings to be formed at a later step. To facilitate discussion in this detailed description, the global word lines are presumed to run along the X-direction. The metallic interconnect lines may be formed by applying photo-lithographical patterning and etching steps on one or more deposited metal layers. (Alternatively these metallic interconnect lines can be formed using a conventional damascene process, such as a copper or Tungsten damascene process). A thick oxide is deposited to form isolation layer 203-0, followed by a planarization step using conventional chemical mechanical polishing (CMP) techniques.

Active layers 202-0 to 202-7 are then successively formed, each active layer being electrically insulated from the previous active layer underneath by a corresponding one of isolation layers 203-1 to 203-7. In FIG. 2a, although eight active layers are shown, any number of active layers may be provided. In practice, the number of active layers may depend on the process technology, such as availability of a well-controlled anisotropic etching process that allows cutting through a tall stack of the active layers to reach semiconductor substrate 201. Each active layer is etched at an etching step that preferentially cuts through the planes as discussed below to form a large number of parallel active strips each running along the Y-direction.

Figures 1, 2B:
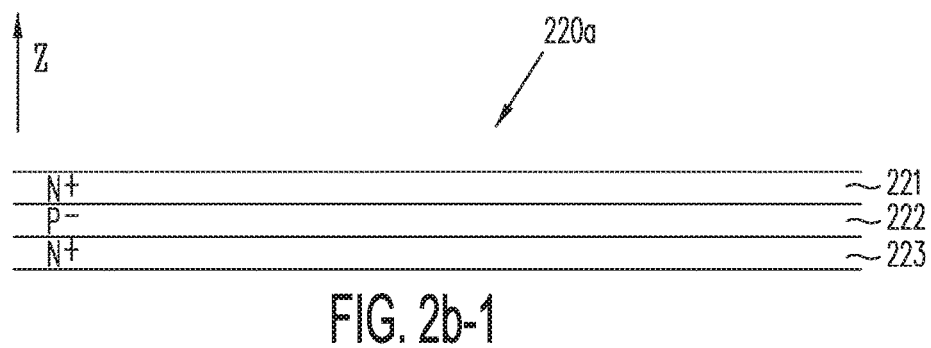
Figures 2, 2B:
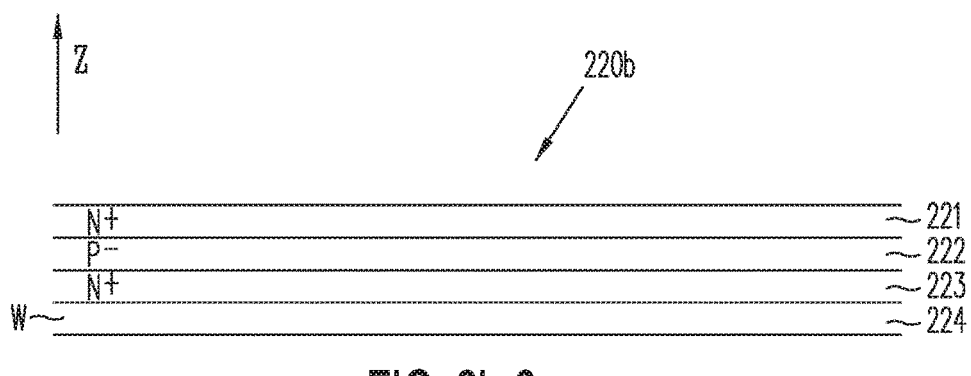

FIG. 2b-1 shows semiconductor structure 220a having N$^+$ sublayers 221 and 223 and P$^-$ sublayer 222. Semiconductor structure 220a may be used to implement any of active layers 202-0 to 202-7 of FIG. 2a, in accordance with one embodiment of the present invention. As shown in FIG. 2b-1, active layer 220a includes deposited sublayers 221-223 of polysilicon. In one implementation, sublayers 221-223 may be deposited successively in the same process chamber without removal in between. Sublayer 223 may be formed by depositing 10-100 nm of in-situ doped N$^+$ polysilicon. Sublayers 222 and 221 may then be formed by depositing undoped or lightly doped polysilicon or amorphous silicon, in the thickness range of 10-100 nm. Sublayer 221 (i.e., the top portion of the deposited polysilicon) is then $N^+$ doped. $N^+$ dopant concentrations in sublayers 221 and 223 should be as high as possible, for example between $1\times10^{20}/cm^3$ and $1\times10^{21}/cm^3$, to provide the lowest possible sheet resistivity in $N^+$ sublayers 221 and 223. The $N^+$ doping may be achieved by either (i) a low-energy shallow high-dose ion implantation of phosphorus, arsenic or antimony, or (ii) in-situ phosphorus or arsenic doping of the deposited polysilicon, forming a 10-100 nm thick $N^+$ sublayer 221 on top. Low-dose implantations of boron ($P^-$) or phosphorus ($N^-$) ions may also be carried out at energies sufficient to penetrate the implanted or in-situ doped $N^+$ sublayer 221 into sublayer 222 lying between $N^+$ sublayer 221 and $N^+$ sublayer 223, so as to achieve an intrinsic enhancement mode threshold voltage in the resulting TFTs. The boron or $P^-$ dopant concentration of sublayer 222 can be in the range of $1\times10^{16}/cm^3$ to $1\times10^{18}/cm^3$; the actual boron concentration in sublayer 222 determines the native transistor turn-on threshold voltage, channel mobility, $N^+P^-N^+$ punch-through voltage, $N^+P^-$ junction leakage and reverse diode conduction characteristics, and channel depletion depth under the various operating conditions for the $N^+P^-N^+$ TFTs formed along active strips 202-0 to 202-7.

Thermal activation of the $N^+$ and $P^-$ implanted species and recrystallization of sublayers 221, 222 and 223 should preferably take place all at once after all active layers 202-0 to 202-7 have been formed, using a conventional rapid thermal annealing technique (e.g., at 700° C. or higher) or a conventional rapid laser annealing technique, thereby ensuring that all active layers experience elevated temperature processing in roughly the same amount. Caution must be exercised to limit the total thermal budget, so as to avoid excessive diffusion of the dopants out of $N^+$ sublayer 223 and sublayer 221, resulting in eliminating form the TFTs $P^-$ sublayer 222, which acts as a channel region. $P^-$ sublayer 222 is required to remain sufficiently thick, or sufficiently P-doped to avoid $N^+P^-N^+$ transistor punch-through or excessive leakage between $N^+$ sublayer 221 and $N^+$ sublayer 223.

Alternatively, $N^+$ and $P^-$ dopants of each of active layers 202-0 to 202-7 can be activated individually by shallow rapid thermal annealing using, for example, excimer laser anneal (ELA) at an ultraviolet wavelength (e.g., 308 nanometer). The annealing energy which is absorbed by the polysilicon or amorphous silicon to partially melt sublayer 221 and part or all of sublayer 222, optionally penetrating into sublayer 223 to affect volume 205 (see FIG. 2b-4) without unduly heating other active layers lying below sublayer 223 of the annealed active layer 220a.

Although the use of successive layer-by-layer excimer laser shallow rapid thermal anneal is more costly than a single deep rapid thermal anneal step, ELA has the advantage that the localized partial melting of polysilicon (or amorphous silicon) can result in recrystallization of annealed volume 205 to form larger silicon polycrystalline grains having substantially improved mobility and uniformity, and reduced TFT leakage due to reduced segregation of $N^+$ dopants at the grain boundaries of the affected volume. The ELA step can be applied either to $P^-$ sublayer 222 and $N^+$ sublayer 223 before formation of $N^+$ sublayer 221 above it, or after formation of a sufficiently thin $N^+$ sublayer 221 to allow recrystallization of both sublayers 221 and 222 and, optionally, sublayer 223. Such shallow excimer laser low-temperature anneal technique is well-known to those of ordinary skill in the art. For example, such technique is used to form polysilicon or amorphous silicon films in solar cell and flat panel display applications. See, for example, H. Kuriyama et al. "Comprehensive Study of Lateral Grain Growth in Poly-Si Films by Excimer Laser Annealing (ELA) and its applications to Thin Film Transistors", Japanese Journal of Applied Physics, Vol. 33, Part 1, Number 10, 20 Aug. 1994, or "Annealing of Silicon Backplanes with 540 W Excimer Lasers", technical publication by Coherent Inc. on their website.

The thickness of $P^-$ sublayer 222 roughly corresponds to the channel length of the TFTs to be formed, which may be as little as 10 nm or less over long active strips. In one embodiment (see FIG. 2b-5), it is possible to control the channel length of the TFT to less than 10 nm, even after several thermal process cycles, by depositing an ultra-thin (from one or a few atomic layers to 3 nm thick) film of silicon nitride (e.g., SiN or $Si_3N_4$), or another suitable diffusion-blocking film following the formation of $N^+$ sublayer 223 (see sublayer 223-d in FIG. 2b-5). A second ultra-thin film of silicon nitride, or another suitable diffusion-blocking film (see 221-d in FIG. 2b-5), may optionally be deposited following deposition of $P^-$ sublayer 222, before depositing $N^+$ sublayer 221. The ultra-thin dopant diffusion-blocking layers 221-d and 223-d can be deposited by chemical vapor deposition, atomic layer deposition or any other suitable means (e.g., high pressure nitridization at low temperature). Each ultra-thin dopant diffusion-blocking layer acts as a barrier that prevents the $N^+$ dopants in $N^+$ sublayers 221 and 223 from diffusing into $P^-$ sublayer 222, yet are sufficiently thin to only marginally impede the MOS transistor action in the channel region between $N^+$ sublayer 221 (acting as a source) and $N^+$ sublayer 223 (acting as a drain). (Electrons in the surface inversion layer of sublayer 222 readily tunnel directly through the ultra-thin silicon nitride layers, which are too thin to trap such electrons). These additional ultra-thin dopant diffusion-blocking layers increase the manufacturing cost, but may serve to significantly reduce the cumulative leakage current from the multiple TFTs along the active strips that are in the "off" state. However, if that leakage current is tolerable then these ultra-thin layers can be omitted.

NOR strings having long and narrow $N^+$ sublayers 223 and $N^+$ sublayers 221 may have excessively large line resistance (R), including the resistance of narrow and deep contacts to the substrate. Reduced line resistance is desirable, as it reduces the "RC delay" of a signal traversing a long conductive strip. (RC delay is a measure of the time delay that is given by the product of the line resistance R and the line capacitance C). Reduced line resistance also reduces the "IR voltage drop" across a long and narrow active strip. (The IR voltage drop is given by the product of the current I and the line resistance R). To significantly reduce the line resistance, an optional conductive sublayer 224 may be added to each active strip adjacent one or both of $N^+$ sublayers 221 or 223 (e.g., sublayer 224, labeled as W in FIGS. 2b-2 and 2b-3). Sublayer 224 may be provided by one or more deposited metal layers. For example, sublayer 224 may be provided by depositing 1-2 nm thick layer of TiN followed by depositing a 1-40 nm thick layer of tungsten, a similar refractory metal, or a polycide or silicide (e.g., nickel silicide). Sublayer 224 is more preferably in the 1-20 nm thickness range. Even a very thin sublayer 224 (e.g., 2-5 nm) can significantly reduce the line resistance of a long active strip, while allowing the use of less heavily doped $N^+$ sublayers 21 and 223.

Figures 2, 2B, 3:
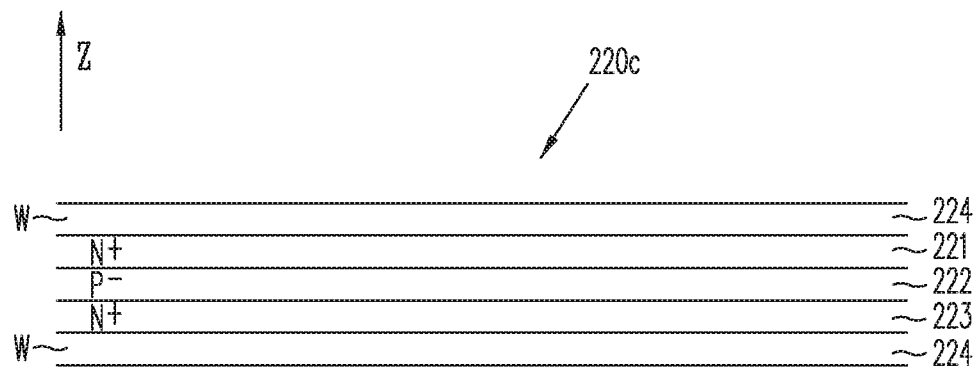
Figures 2, 2B, 3, 4:
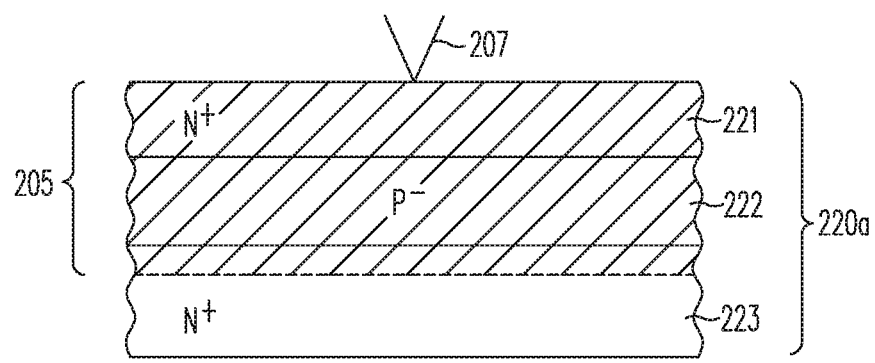
Figures 2, 2B, 3, 4, 5:
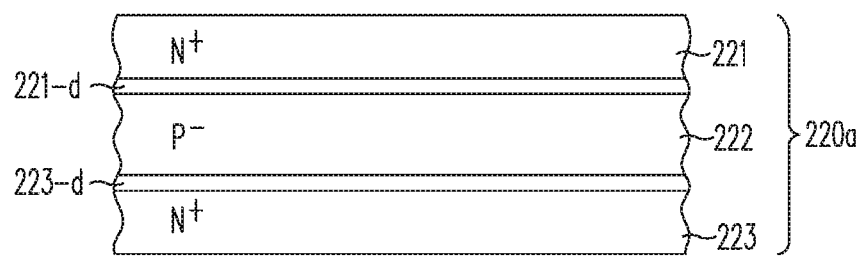
Figure 2C:
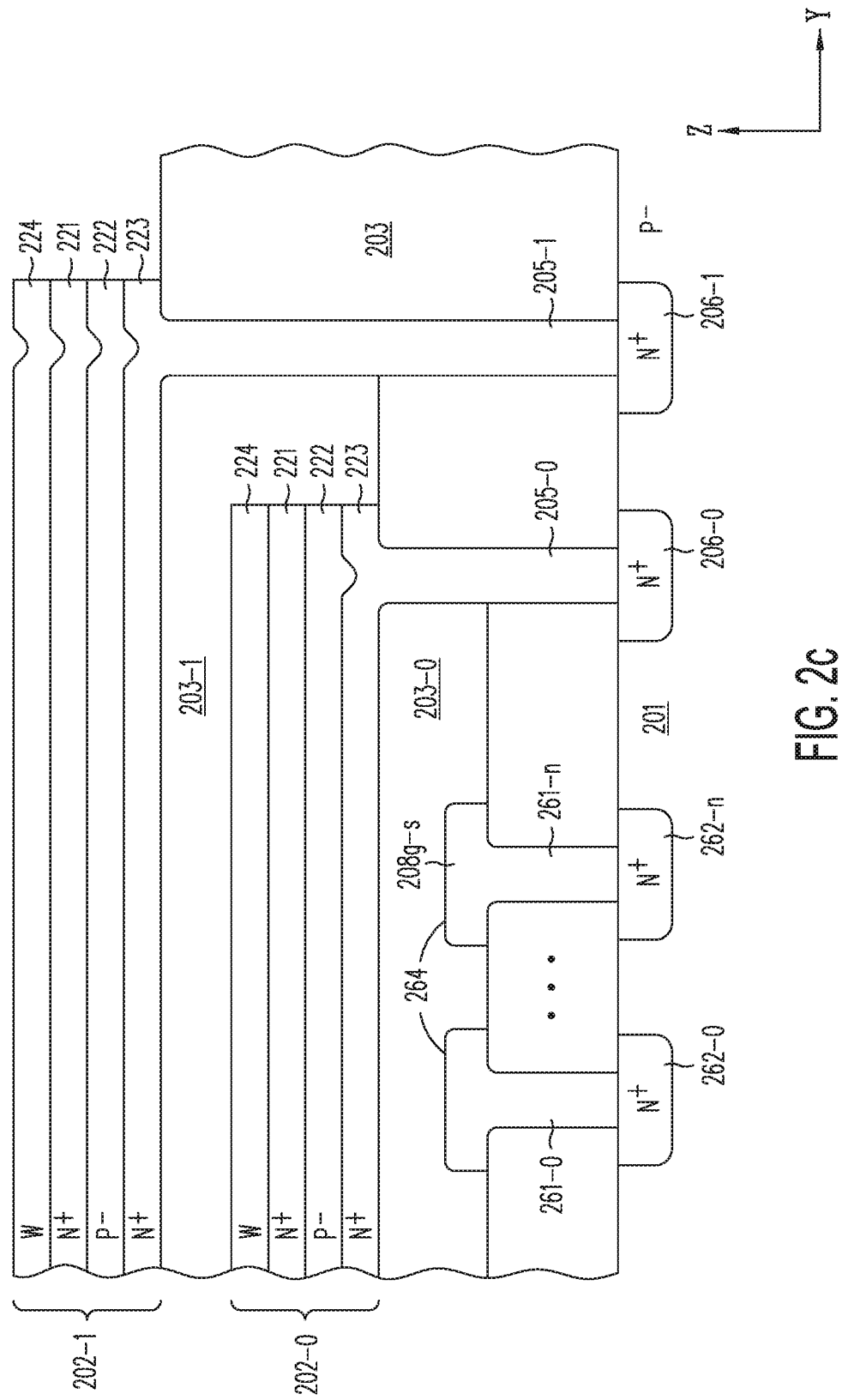
FIG. 2c shows cross section in a Y-Z plane of structure 200 of FIG. 2a through buried contacts 205-0 and 205-1, which connect N$^+$ sublayers 223 of active layers 202-0 and 202-1 to circuitry 206-0 and 206-1 in semiconductor substrate 201.

As shown in FIG. 2c, the conductor inside contact opening 205-1 can become quite long for a tall stack, thereby adversely increasing the line resistance. In that case, metallic sublayer layer 224 (e.g., a tungsten layer) may preferably be included below sublayer 223, so as to substantially fill contact opening 205-1, rather than placing it above N+ sublayer 221, as is shown in FIG. 2c. Including metal sublayer 224 in each of active layers 202-0 to 202-7 may, however, increase cost and complexity of the manufacturing process, including the complication that some of the metallic materials are relatively more difficult to etch anisotropically than materials such as polysilicon, silicon oxide or silicon nitride. However, metallic sublayer 224 enables use of considerably longer active strips, which results in superior array efficiency.

In the embodiments where no metallic sublayers 224 are incorporated, there are several tradeoffs that can be made: for example, longer active strips are possible if the resultant increased read latency is acceptable. In general, the shorter the active strip, the lower the line resistance and therefore the shorter the latency. (The trade-off is in array efficiency). In the absence of metallic sublayer 224, the thickness of N+ sublayers 221 and 223 can be increased (for example to 100 nanometers) to reduce the intrinsic line resistance, at the expense of a taller stack to etch through. The line resistance can be further reduced by increasing the N+ doping concentration in N+ sublayers 221 and 223 and by applying higher anneal temperatures in excess of 1,000° C. (e.g, by rapid thermal anneal, deep laser anneal or shallow excimer laser anneal) to enhance recrystallization and dopant activation and to reduce dopant segregation at the grain-boundaries.

Shorter active strips also have superior immunity to leakage between N+ sublayer 223 and N+ sublayer 221. A thicker N+ sublayer provides reduced strip line resistance and increased strip capacitance, which is desirable for dynamic sensing (to be discussed below). The integrated circuit designer may opt for a shorter active strip (with or without metal sublayer 224) when low read latency is most valued. Alternatively, the strip line resistance may be reduced by contacting both ends of each active strip, rather than just at one end.

Block-formation patterning and etching steps define separate blocks in each of the active layers formed. Each block occupies an area in which a large number (e.g., thousands) of active strips running in parallel may be formed, as discussed below, with each active strip running along the Y-direction, eventually forming one or more NOR strings that each provide a large number (e.g., thousands) of TFTs.

Each of active layers 202-0 to 202-7 may be successively formed by repeating the steps described above. In addition, in the block-formation patterning and etching steps discussed above, each next higher active layer may be formed with an extension slightly beyond the previous active layer (see, e.g., as illustrated in FIG. 2c, discussed below, layer 202-1 extends beyond layer 202-0) to allow the upper active layer to access its specific decoders and other circuitry in semiconductor substrate 201 through designated buried contacts.

As shown in FIG. 2c, buried contacts 205-0 and 205-1 connect contacts 206-0 and 206-1 in semiconductor substrate 201, for example, to the local bit lines or source lines formed out of N+ sublayer 223 in each of active layers 202-0 and 202-1. Buried contacts for active layers 202-2 to 202-7 (not shown) may be similarly provided to connect active layers 202-2 to 202-7 to contacts 206-2 to 206-7 in semiconductor substrate 201 in an inverted staircase-like structure in which the active layer closest to the substrate has the shortest buried contact, while the active layer furthest from the substrate has the longest buried contact. Alternatively, in lieu of buried contacts, conductor-filled vias extending from the top of the active layers may be etched through isolation layers 203-0 and 203-1. These vias establish electrical contact from substrate circuitry 206-0, for example, to top N+ sublayers 221-0 (or metal sublayer 224, if provided). The vias may be laid out in a "staircase" pattern with the active layer closest the substrate connected by the longest via, and the active layer closest to the top connected by the shortest via. The vias (not shown) have the advantage that more than one plane can be contacted in one masking-and-etch step, as is well-known to a person of ordinary skill in the art.

Through a switch circuit, each of contacts 206-0 to 206-7 may apply a pre-charge voltage $V_{bl}$ to the respective bit line or source line of the corresponding NOR strings or, during a read operation, may be connected to an input terminal of a sense amplifier or a latch. The switch circuit may selectively connect each of contacts 206-0 to 206-7 to any of a number of specific voltage sources, such as a programming voltage ($V_{pgm}$), inhibit voltage ($V_{inhibit}$), erase voltage ($V_{erase}$), or any other suitable predetermined or pre-charge reference voltage $V_{bl}$ or $V_{ss}$. In some embodiments, discussed below, taking advantage of the relatively large parasitic distributed capacitance along a bit line or source line in an active strip, a virtual voltage reference (e.g., a virtual ground, providing ground voltage $V_{ss}$) may be created in the source line (i.e., N+ sublayer 221) of each active strip by pre-charging the source line, as discussed below. The virtual ground eliminates the need for hard-wiring N+ sublayer 221 to a voltage source in the substrate, making it possible to use the staircase via structure described above to connect each active strip from the top to the substrate. Otherwise, it would be impossible to separately connect N+ sublayer 221 and N+ sublayer 223 of each active strip from the top to the substrate, as the via material will short the two sublayers.

FIG. 2c also shows buried contacts 261-0 to 261-n for connecting global word lines 208g-s—which are to be formed running along the X-direction—to contacts 262-0 to 262-n in semiconductor substrate 201. Global word lines 208g-s are provided to connect corresponding local word lines 208W-s yet to be formed (see, e.g., FIG. 2i) to circuits 262-n in substrate 201. Landing pads 264 are provided on the global word lines to allow connection to local word lines 208W-s, which are yet to be formed vertically on top of horizontally running global word lines 208g-s. Through a switch circuit and a global word line decoder, each of global word line contacts 262-0 to 262-n may be selectively connected, either individually, or shared among several global word lines, to any one of a number of reference voltage sources, such as stepped programming voltages ($V_{program}$), program-inhibit voltage ($V_{inhibit}$), read voltages ($V_{read}$) and erasure voltages ($V_{erase}$).

The buried contacts, the global word lines and the landing pads may be formed using conventional photo-lithographical patterning and etching steps, followed by deposition of one or more suitable conductors or by alloying (e.g., tungsten metal, alloy or tungsten silicide).

After the top active layer (e.g., active layer 202-7) is formed, trenches are created by etching through the active layers to reach the bottom global word lines (or semiconductor substrate 201) using a strip-formation mask. The strip-formation mask consists of a pattern in a photoresist layer of long narrow strips running along the Y-direction. Sequential anisotropic etches etch through active layers 202-7 to 202-0, and dielectric isolations layers 203-7 to 203-0. As the number of active layers to be etched, which is eight in the example of FIG. 2c (and, more generally may be 16, 32, 64 or more), a photoresist mask may not be sufficiently robust to hold the strip-formation pattern through the numerous etches necessary to etch through to beyond the lowest active layer. Thus, reinforced masks using a hard mask material (e.g., carbon or a metal) may be required, as is known to those of ordinary skill in the art. Etching terminates at the dielectric isolation layer above the landing pads of the global word lines. It may be advantageous to provide an etch-stop barrier film (e.g., an aluminum oxide film) to protect the landing pads during the trench etch sequence.

Figure 2D:
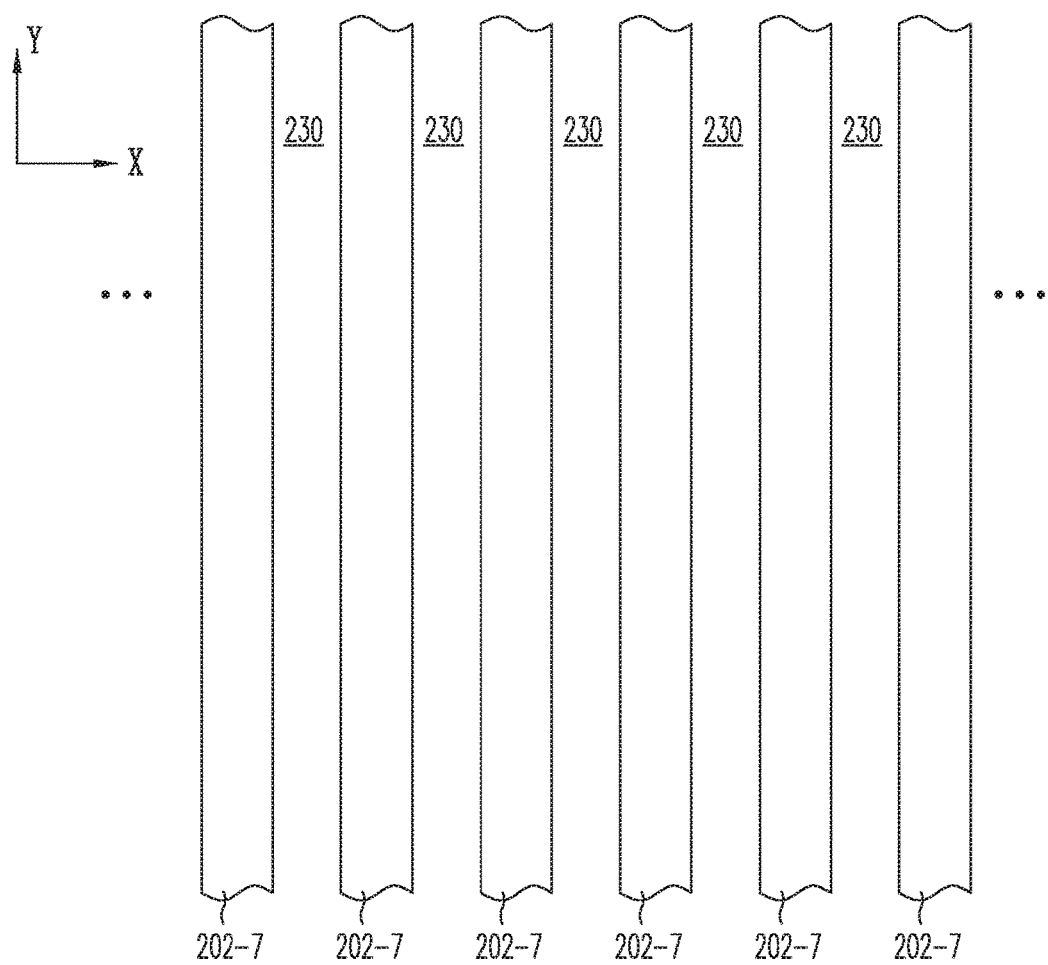

FIG. 2d illustrates forming trenches 230 in structure 200 of FIG. 2a, in a cross section in an X-Y plane through active layer 202-7 in one portion of semiconductor structure 200 of FIG. 2a. Between adjacent trenches 230 are high aspect-ratio, long and narrow active strips in the different active layers. To achieve the best etch result, etch chemistry may have to be changed when etching through the materials of the different sublayers, especially in embodiments where metal sublayers 224 are present. The anisotropy of the multi-step etch is important, as undercutting of any sublayer should be avoided, and so that an active strip in the bottom active layer (e.g., an active strip in active layer 202-0) has approximately the same width and gap spacing to an adjacent active strip as the corresponding width and gap spacing in an active strip in the top active layer (i.e., an active strip of active layer 202-7). Naturally, the greater the number of active layers in the stack to be etched, the more challenging is the design of the successive etches. To alleviate the difficulty associated with etching through a large number of active layers (e.g., 32), etching may be conducted in groups of layers, say 8, as discussed in Kim, referenced above, at pp. 188-189.

Thereafter, one or more charge-trapping layers are conformally deposited or grown on the sidewalls of the active strips in trenches 230. The charge-trapping layer is formed by first chemically depositing or growing a thin tunneling dielectric film of a 2-10 nm thickness (e.g., a silicon dioxide layer, a silicon oxide-silicon nitride-silicon oxide ("ONO") triple layer, a bandgap engineered nitride layer or a silicon nitride layer), preferably 3 nm or less, followed by deposition of a 4-10 nm thick layer of charge-trapping material (e.g., silicon nitride, silicon-rich nitride or oxide, nanocrystals, nanodots embedded in a thin dielectric film, or isolated floating gates), which is then capped by a blocking dielectric film. The blocking dielectric film may be a 5-15 nm thick layer consisting of, for example, an ONO layer, or a high dielectric constant film (e.g., aluminum oxide, hafnium oxide or some combination thereof). The storage element to be provided can be SONOS, TANOS, nanodot storage, isolated floating gates or any suitable charge-trapping sandwich structures known to those of ordinary skill in the art.

Figure 2E:
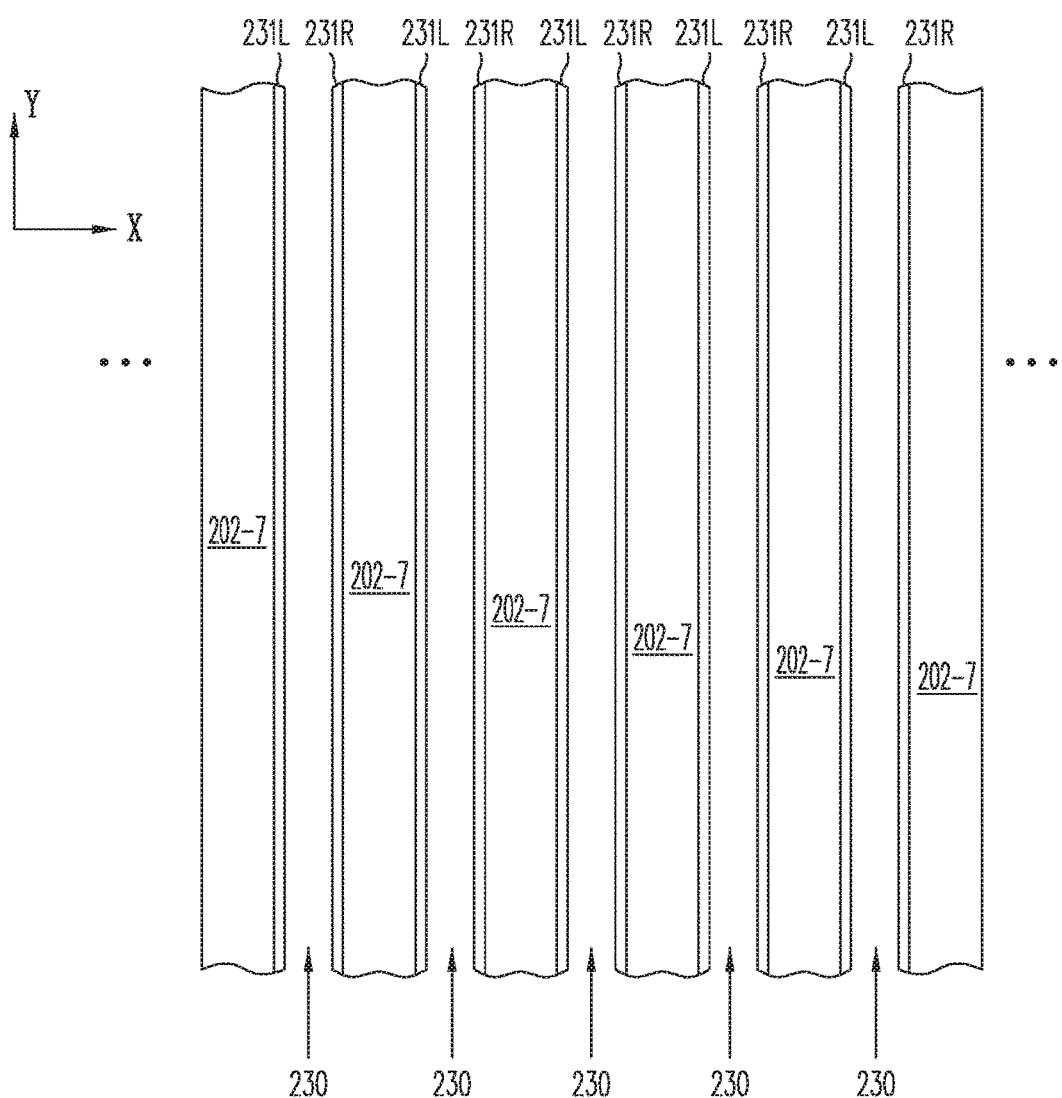
FIG. 2e illustrates, in one portion of semiconductor structure 200 of FIG. 2a, depositing charge-trapping layers 231L and 231R on opposite side walls of the active strips along trenches 230 in a cross section in an X-Y plane through active layer 202-7.

Trenches 230 are formed sufficiently wide to accommodate the storage elements on the two opposing sidewalls of the adjoining active strips, plus the vertical local word lines to be shared between the TFT's on these opposite sidewalls. FIG. 2e illustrates, in one portion of semiconductor structure 200 of FIG. 2a, depositing charge-trapping layers 231L and 231R on opposite side walls of the active strips along trenches 230 in a cross section in an X-Y plane through active layer 202-7.

Contact openings to the bottom global word lines are then photo-lithographically patterned at the top of layer 202-7 and exposed by anisotropically etching through the charge-trapping materials at the bottom of trenches 230, stopping at the bottom global word line landing pads (e.g., global word line landing pads 264 of FIG. 2c). In one embodiment, to be described in conjunction with FIG. 2i below, only alternate rows of trenches 230 (e.g., the rows in which the word lines formed therein are assigned odd-numbered addresses) are etched down to the bottom global word lines. In some embodiments, etching is preceded by a deposition of an ultra-thin sacrificial film (e.g. a 2-5 nm thick polysilicon film) to protect the vertical surface of the blocking dielectric on the sidewalls of trenches 230 during the anisotropic etch of the charge-trapping material at the bottom of trenches 230. The remaining sacrificial film can be removed by a short-duration isotropic etch.

Figure 2F:
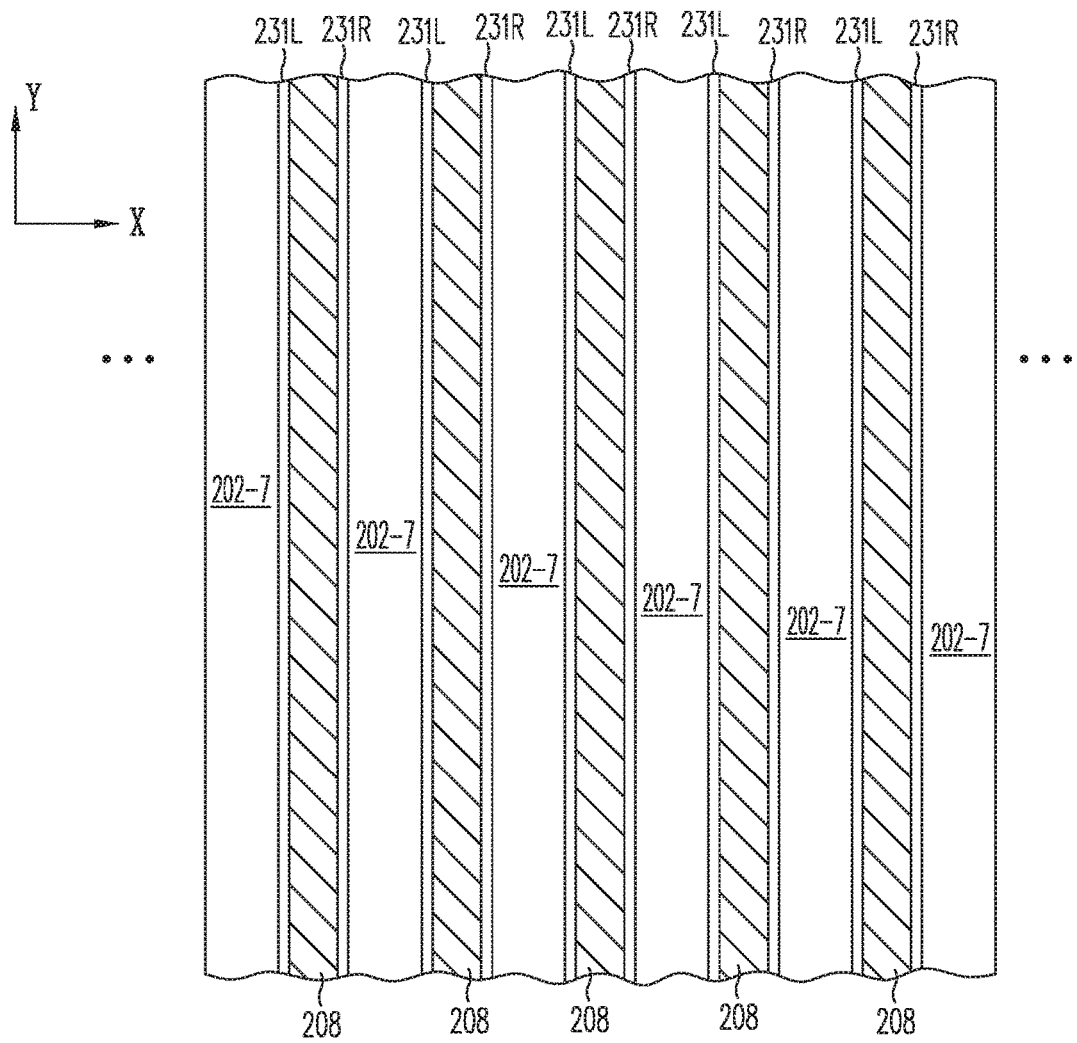
FIG. 2f illustrates depositing conductor 208 (e.g., N$^+$ or P$^+$ doped polysilicon or metal) to fill trenches 230 of FIG. 2e.

Thereafter, doped polysilicon (e.g., $P^+$ polysilicon or $N^+$ polysilicon) may be deposited over the charge-trapping layers to form the control gates or vertical local word lines. $P^+$ doped polysilicon may be preferable because of its higher work function compared to $N^+$ doped polysilicon. Alternatively, a metal with a high work function relative to $SiO_2$ (e.g., tungsten, tantalum, chrome, cobalt or nickel) may be used to form the vertical local word lines. Trenches 230 may now be filled with the $P^+$ doped polysilicon or the metal. In the embodiment of FIG. 2i, discussed below, the doped polysilicon or metal in alternate rows of trenches 230 (i.e., the rows to host local word lines 208W-s that are assigned odd-numbered addresses) is in ohmic contact with the bottom global word lines 208g-s. The polysilicon in the other ones of trenches 230 (i.e., the rows to host local word lines 208W-a that are assigned even-numbered addresses) are isolated from the bottom global word lines. (These local word lines are to be later contacted by top global word lines 208g-a routed above the top active layer). The photoresist and hard mask may now be removed. A CMP step may then be used to remove the doped polysilicon from the top surface of each block. FIG. 2f illustrates depositing conductor 208 (e.g., polysilicon or metal) to fill trenches 230 of FIG. 2e.

Figure 2G:
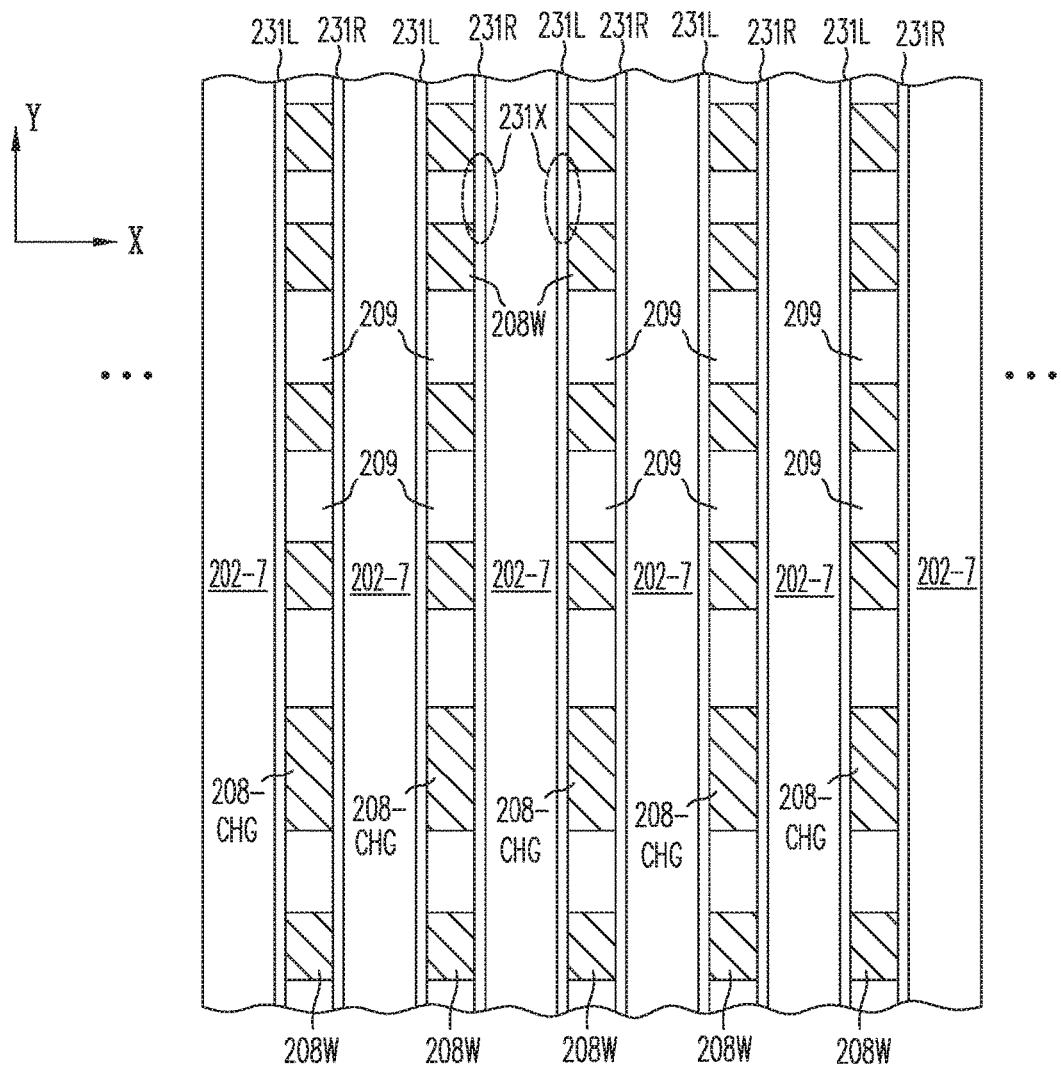
FIG. 2g shows, after photo-lithographical patterning and etching steps on the semiconductor structure of FIG. 2f, achieving local conductors ("word lines") 208W and pre-charge word lines 208-CHG by removing exposed portions of the deposited conductor 208, and filling the resulting shafts 209 with an insulation material or alternatively, leaving the shafts as air gap isolation.

FIG. 2g shows, after photo-lithographical patterning and etching steps on the semiconductor structure of FIG. 2f, achieving local conductors ("word lines") 208W and pre-charge word lines 208-CHG by removing exposed portions of the deposited conductor 208, and filling the resulting shafts 209 with an insulation material or alternatively, leaving the shafts as air gap isolation. As removing doped polysilicon in this instance is a high aspect-ratio etch step in a confined space, a hard mask material (e.g., carbon or metal) may be required, using the technique described above. The resulting shafts 209 may be filled with insulating material or may be left as air gaps to reduce parasitic capacitance between adjacent local word lines. The mask pattern that exposes the doped polysilicon for excavation are parallel strips that run along the X-direction, so that they coincide with the global word lines 208g-a that are required to be formed to contact local word lines 208W-a (see FIG. 2i) and local pre-charge word lines 208-CHG.

In FIG. 2g, portions 231X of charge-trapping layers 231L and 231R adjacent insulation shafts 209 remain after the removal of the corresponding portions of deposited polysilicon 208W. In some embodiments, portions 231X of charge-trapping layers 231L and 231R may be removed by a conventional etching process step prior to filling shafts 209 with insulation material or air gap. Etching of the charge-trapping materials in the shafts may be carried out concurrently with the removal of the doped polysilicon, or subsequent to it. A subsequent etch would also remove any fine polysilicon stringers left behind by the anisotropic etch; these polysilicon stringers may cause undesirable leakage paths, serving as resistive leakage paths between adjacent local word lines. Removing part or all such charge-trapping materials at portions 231X eliminates parasitic edge TFTs as well as impeding potential lateral diffusion of trapped charge between adjacent TFTs along the same NOR string. Partial removal of portions 231X can be accomplished by a short-duration isotropic etch (e.g., a wet etch or a plasma etch), which removes the blocking dielectric film and part or all of the charge-trapping material not protected by the local word lines.

Figure 2H:
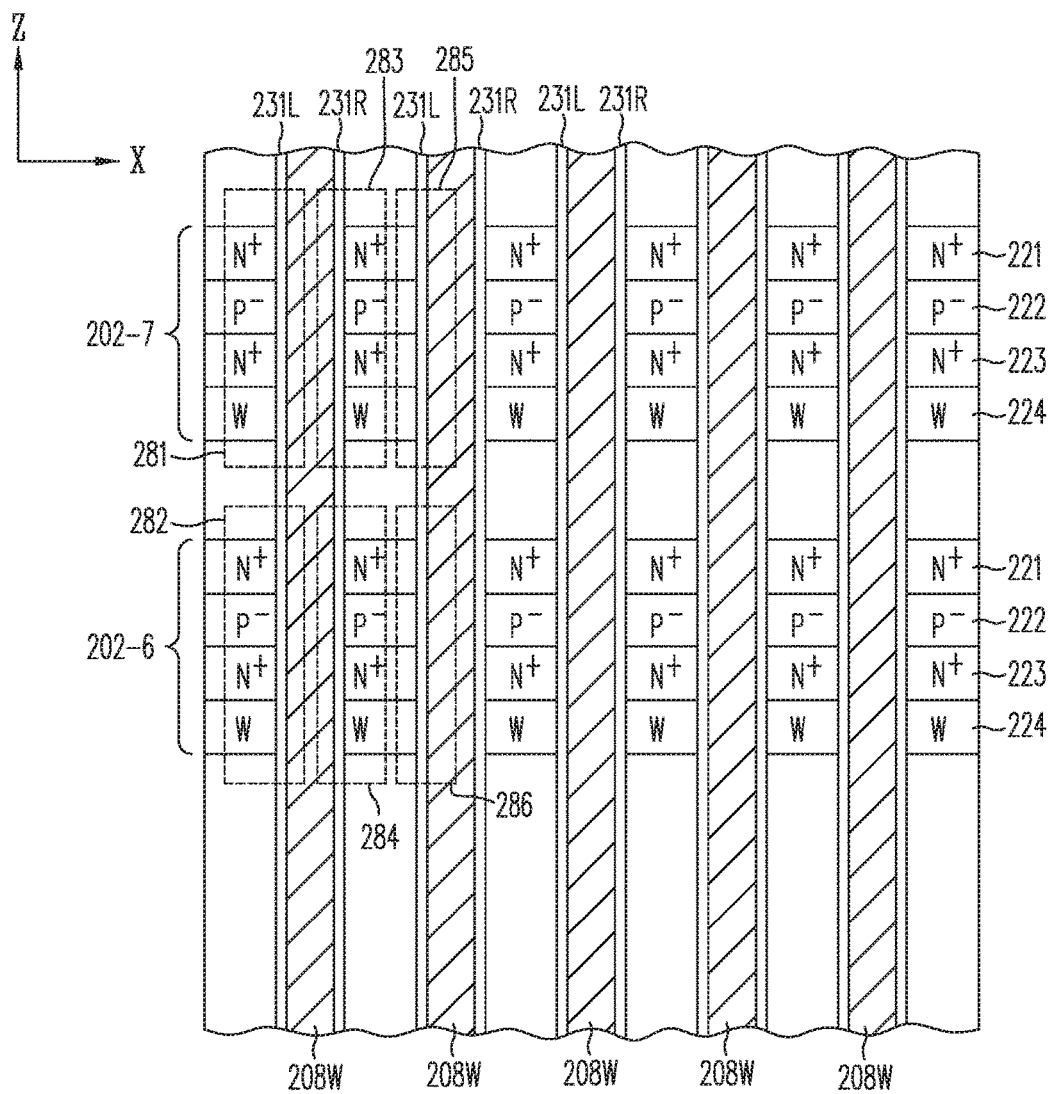
FIG. 2h shows a cross section in the Z-X plane through a row of local word lines 208W of FIG. 2g, showing active strips in active layers 202-7 and 202-6.
Figure 2I:
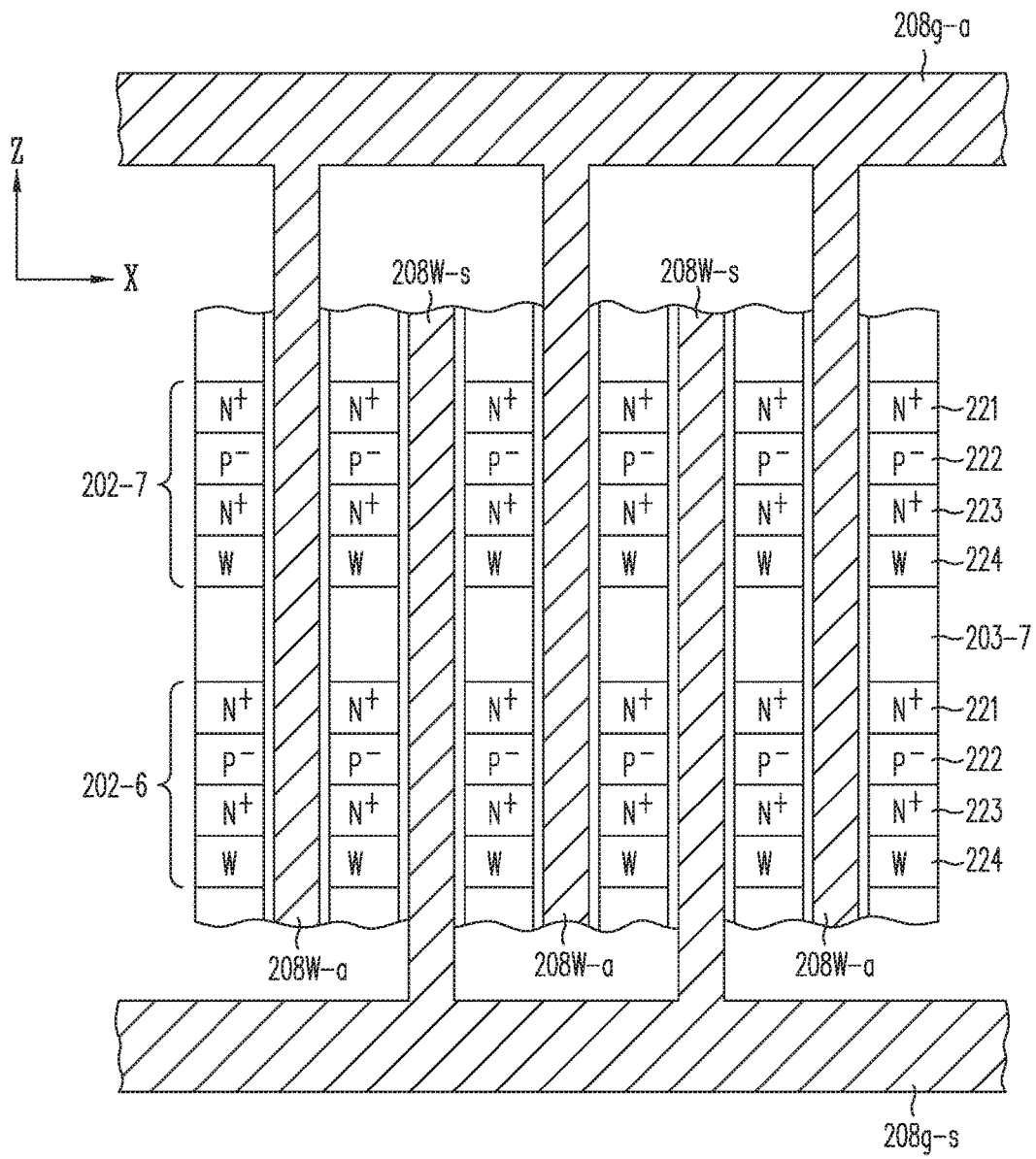
FIG. 2i shows embodiment EMB-1 of the present invention, in which local word lines 208W of FIG. 2h are each connected to either one of global word lines 208g-a (routed in one or more conductive layers provided above active layers 202-0 to 202-7), or one of global word lines 208g-s (routed in one or more conductive layers provided below the active layers and between active layer 202-0 and substrate 201) (see, also, FIG. 4a).
Figures 1, 2I:
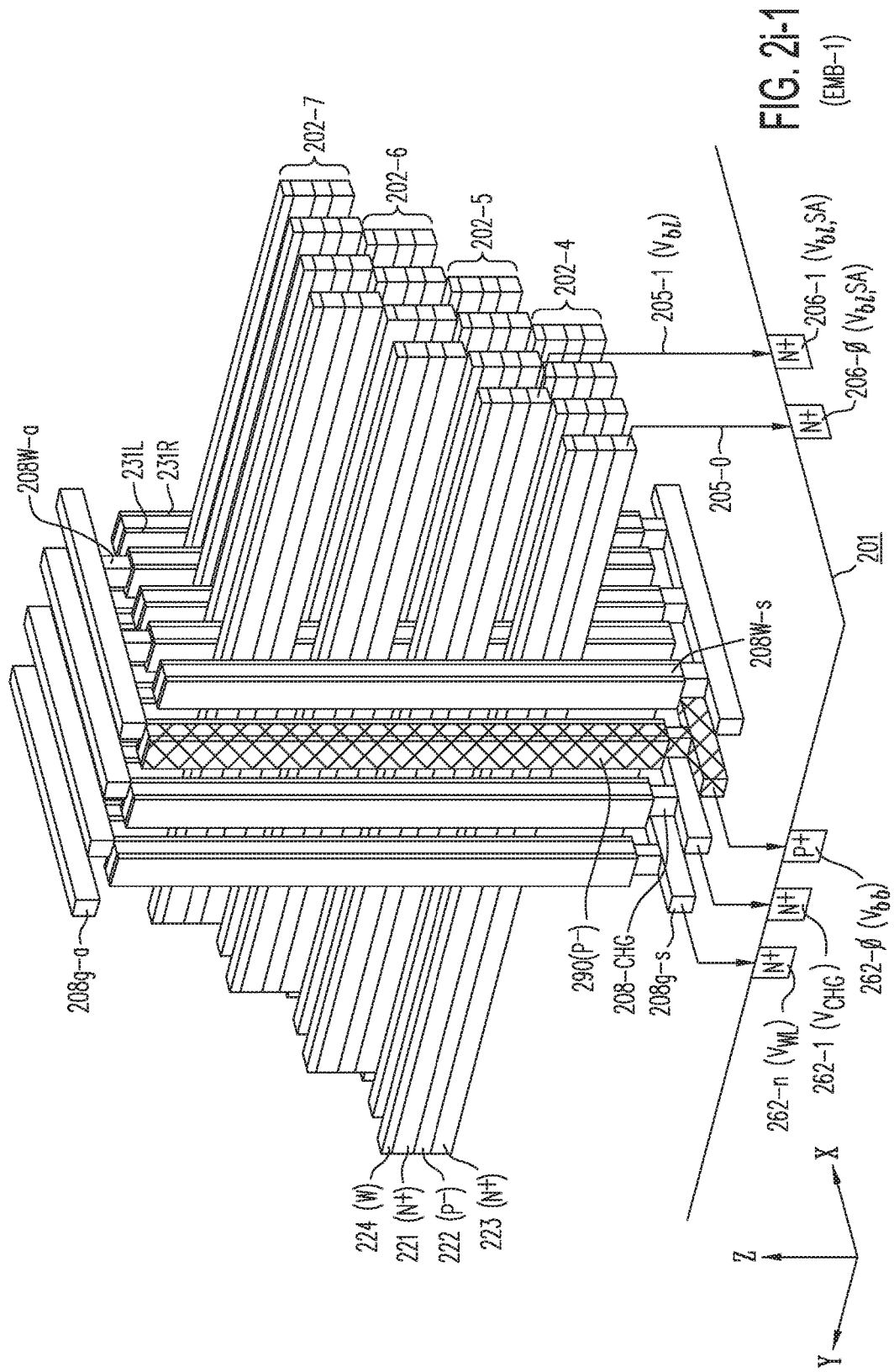

FIG. 2h shows a cross section in the Z-X plane through a row of local word lines 208W of FIG. 2g, showing active strips in active layers 202-7 and 202-6. As shown in FIG. 2h, each active layer includes $N^+$ sublayer 221, $P^-$ sublayer 222, and $N^+$ sublayer 223 (low-resistivity metal layer 224 is optional). In one embodiment, $N^+$ sublayer 221 (e.g., a source line) is hard-wire connected to ground reference voltage $V_{ss}$ (shown in FIG. 3a as ground reference voltage 280) and $N^+$ sublayer 223 (e.g., a bit line) is connected to a contact in substrate 201 according to the method illustrated in FIG. 2c. Thus, local word line 208W, the portion of active layer 202-7 or 202-6 facing word line 208W and the charge-trapping layer 231L between word line 208W and that portion of active layer 202-7 or 202-6 form the storage elements (e.g., storage TFTs 281 and 282) in FIG. 2h. Facing TFTs 281 and 282 on the opposite side of local word line 208W are TFTs 283 and 284 respectively, incorporating therein charge-trapping layer 231R. On the other side of the active strips 202-6 and 202-7 providing TFTs 283 and 284 are TFTs 285 and 286. Accordingly, the configuration shown in FIG. 2h represents the highest packing density configuration for TFTs, with each local word line shared by the two active strips along its opposite sides, and with each active strip being shared by the two local word lines along its two opposite side edges. Each local word line 208W may be used to read, write or erase the charge stored in the designated one of the TFTs formed in each of active layers 202-0 to 202-7, located on either charge-trapping portion 231L or 231R, when a suitable voltage is imposed.

$N^+$ sublayer 223 (i.e., a bit line) can be charged to a suitable voltage required for an operation of the TFTs at hand (e.g., program voltage $V_{prog}$, inhibition voltage $V_{inhibit}$, erase voltage $V_{erase}$, or the read reference voltage $V_{bl}$). During a read operation, any of TFTs 281-286 that are in the "on" state conduct current in the vertical or Z-direction between sublayers 221 and 223.

As shown in the embodiment of FIG. 2h, optional metal sublayer 224 reduces the resistance of $N^+$ sublayer 223, so as to facilitate fast memory device operations. In other modes of operations, $N^+$ sublayer 221 in any of active layers 202-0 to 202-7 may be left floating. In each active layer, one or more of the local word lines (referred to as a "pre-charge word line"; e.g., pre-charge word lines 208-CHG in FIG. 2g) may be used as a non-memory TFT. When a suitable voltage is applied to the pre-charge word lines (i.e., rendering the pre-charge TFT conducting), each pre-charge word line momentarily inverts its channel sublayer 222, so that $N^+$ sublayer 221 (the source line) may be pre-charged to the pre-charge voltage $V_{ss}$ in $N^+$ sublayer 223, which is supplied from voltage source $V_{bl}$ in the substrate. When the voltage on the pre-charge word line is withdrawn, (i.e., when the pre-charge TFT is returned to its non-conducting state) and all the other word lines on both sides of the active strip are also "off", device operation may proceed with $N^+$ sublayer 221 left electrically charged to provide a virtual voltage reference at the pre-charged voltage $V_{ss}$ (typically ~0V) because the distributed parasitic capacitor formed between the $N^+$ sublayer 221 and its multiple local word lines is sufficiently large to hold its charge long enough to support the program, program-inhibit or read operation (see below). Although the TFTs in a NOR string may also serve as pre-charge TFTs along each NOR string, to speed up the pre-charge for read operations (read pre-charge requires lower word line voltages of typically less than ~5 volts), some of the memory TFTs (e.g., one in every 32 or 64 memory TFTs along the NOR string) may also be activated. It is preferable that, at least for high voltage pre-charge operations, TFTs that are dedicated entirely to serve as pre-charge TFTs are provided, as the they are more tolerant of program-disturb conditions than the memory TFTs.

Alternatively, in one embodiment to be described below (e.g., embodiment EMB-3 shown in FIGS. 2k and 2k-1), each local word line 208W may be used to read, write or erase the TFTs formed in each of active layers 202-0 to 202-7, located on either charge-trapping portions 231L or 231R, when a suitable voltage is imposed. However, as shown in FIG. 2k, only one of the two sides of each active strip in active layers 202-0 to 202-7 is formed as storage TFTs, thereby eliminating the need for both bottom and top global word lines in this specific embodiment.

An isolation dielectric or oxide may then be deposited and its surface planarized. Contacts to semiconductor substrate 201 and to local word lines 208W may then be photolithographically patterned and etched. Other desirable back-end processing beyond this step is well known to a person of ordinary skill in the art.

SOME SPECIFIC EMBODIMENTS OF THE PRESENT INVENTION

In embodiment EMB-1, shown in FIGS. 2i and 4a, each of local word lines 208W is connected to either one of global word lines 208g-a (routed in one or more layers provided above active layers 202-0 to 202-7), or one of global word lines 208g-s (routed in one or more layers provided below the active layers between active layer 202-0 and substrate 201). Local word lines 208W-s that are coupled to bottom global word lines 208g-s may be assigned odd addresses, while local word lines 208W-a coupled to the top global word lines 208g-a may be assigned even addresses, or vice versa. FIG. 4a is a cross section in the X-Y plane of embodiment EMB-1 of FIGS. 2i and 2i-1, showing contacts 291 connecting local word lines 208W-a to global word lines 208g-a at the top of the memory array. Likewise, local word lines 208W-s are connected to global word lines 208g-s (not shown) running at the bottom of the memory array substantially parallel to the top global word line.

FIG. 2i-1 shows a three-dimensional view of horizontal active layers 202-4 to 202-7 of embodiment EMB-1 of FIG. 2i, with local word lines 208W-s or local pre-charge word lines 208-CHG connected to global word lines 208g-s and local word lines 208W-a connected to global word lines 208g-a, and showing each active layer as having its $N^+$ layer 223 (acting as a drain region) connected through select circuits to any of voltage supplies (e.g., $V_{ss}$, $V_{bl}$, $V_{pgm}$, $V_{inhibit}$, and $V_{erase}$), decoding, sensing and other circuits arranged either adjacent or directly underneath the memory arrays. The substrate circuitry is represented schematically by 206-0 and 206-1 in substrate 201.

Each active strip is shown in FIG. 2i-1 with its $N^+$ sublayer 223 connected to substrate contacts 206-0 and 206-1 ($V_{bl}$), and P- sublayer 222 (channel region) connected to substrate back-bias voltage ($V_{bb}$) source 290 through circuitry 262-0. $N^+$ sublayer 221 and optional low resistivity metallic sublayer 224 may be hard-wired (see, e.g., ground reference connections 280 in FIG. 3a) to a $V_{ss}$ voltage supply, or alternatively, it may be left floating, after being pre-charged momentarily to virtual source voltage $V_{ss}$ through local pre-charge word line 208-CHG. Global word lines 208g-a at the top of the memory array and global word lines 208g-s at the bottom of the memory array may make contact with vertical local word lines 208W-a and 208W-s and pre-charge word lines 208-CHG. Charge-trapping layers 231L and 231R are formed between the vertical local word lines and the horizontal active strips, thus forming non-volatile memory TFTs at the intersection of each horizontal active strip and each vertical word line, on both sides of each active strip. Not shown are isolation layers between active strips on different planes and between adjacent active strips within the same plane.

N+ sublayer 221 is either hard-wire connected to a ground voltage (not shown), or is not directly connected to an outside terminal and left floating, or pre-charged to a voltage (e.g., a ground voltage) during a read operation. Pre-charging may be achieved by activating local pre-charge word lines 208-CHG. P− sublayer 222 of each active layer (providing the channel regions of TFTs) is optionally selectively connected through pillars 290 (described below) to supply voltage $V_{bb}$ in substrate 201. Metallic sublayer 224 is an optional low resistivity conductor, provided to reduce the resistivity of active layers 202-4 to 202-7. To simplify, interlayer isolation layers 203-0 and 203-1 of FIG. 2c are not shown.

Global word lines 208g-a on top of the memory array are formed by depositing, patterning and etching a metal layer following the formation of contacts or vias. Such a metal layer may be provided by, first, forming a thin tungsten nitride (TiN) layer, followed by forming a low resistance metal layer (e.g., metallic tungsten). The metal layer is then photo-lithographically patterned and etched to form the top global word lines. (Alternatively, these global word lines may be provided by a copper damascene process.) In one implementation, these global word lines are horizontal, running along the X-direction and electrically connecting the contacts formed in the isolation oxide (i.e., thereby contacting local word lines 208W-a or 208W-CHG) and with the contacts to semiconductor substrate 201 (not shown). Other mask and etch process flows known to those of ordinary skill in the art are possible to form even and odd addressed local word lines and connect them appropriately to their global word lines, either from the top of the memory array through the top global word lines or from the bottom of the memory array through the bottom global word lines (and, in some embodiments, from both top and bottom global word lines).

Figure 2J:
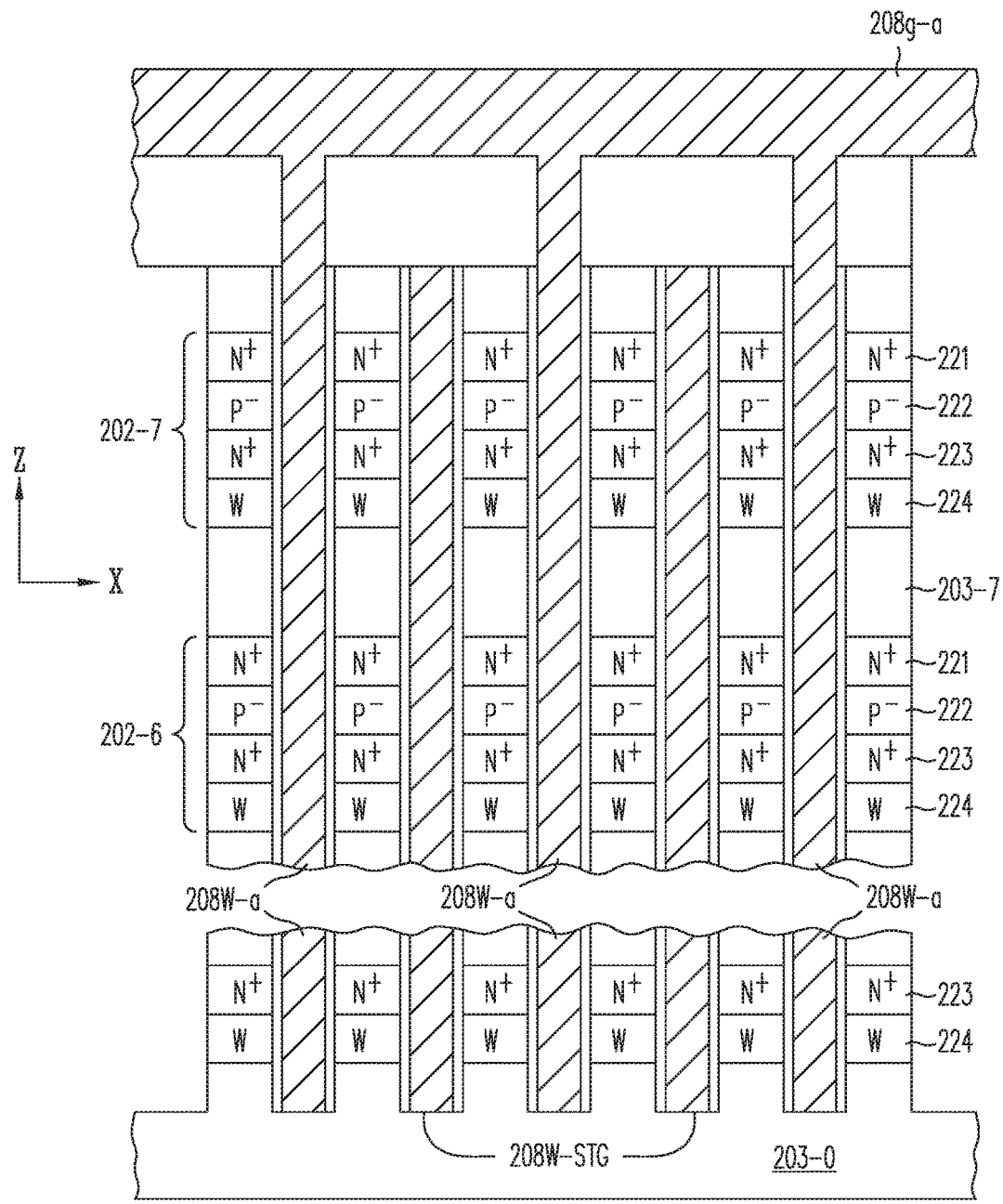
FIG. 2j shows embodiment EMB-2 of the present invention, in which only top global word lines 208g-a are provided—i.e., without any bottom global word lines; in embodiment EMB-2, local word lines 208W-STG along one edge of an active strip are staggered with respect to the local word lines 208W-a along the opposite edge of the active strip (see, also, FIG. 4b).
Figure 2K:
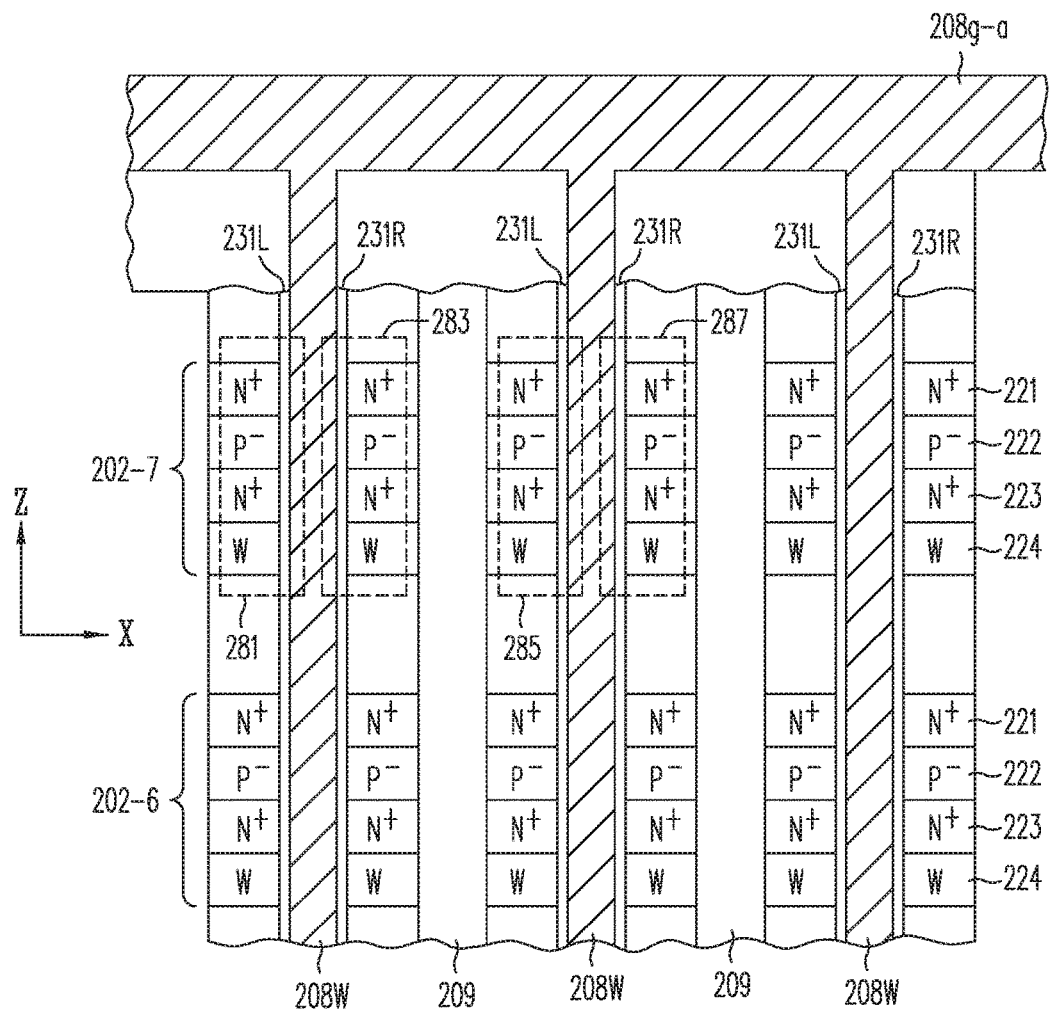
FIG. 2k shows embodiment EMB-3 of the present invention, in which each of local word lines 208W controls a pair of TFTs (e.g., TFTs 281 and 283) formed in opposing side walls of adjacent active strips and their respective adjacent charge-trapping layers (e.g., trapping layers 231L and 231R); isolation trenches 209 are etched to isolate each TFT pair (e.g., TFTs 281 and 283) from adjacent TFT pairs (e.g., TFTs 285 and 287) (see, also, FIG. 4c).
Figures 1, 2K:
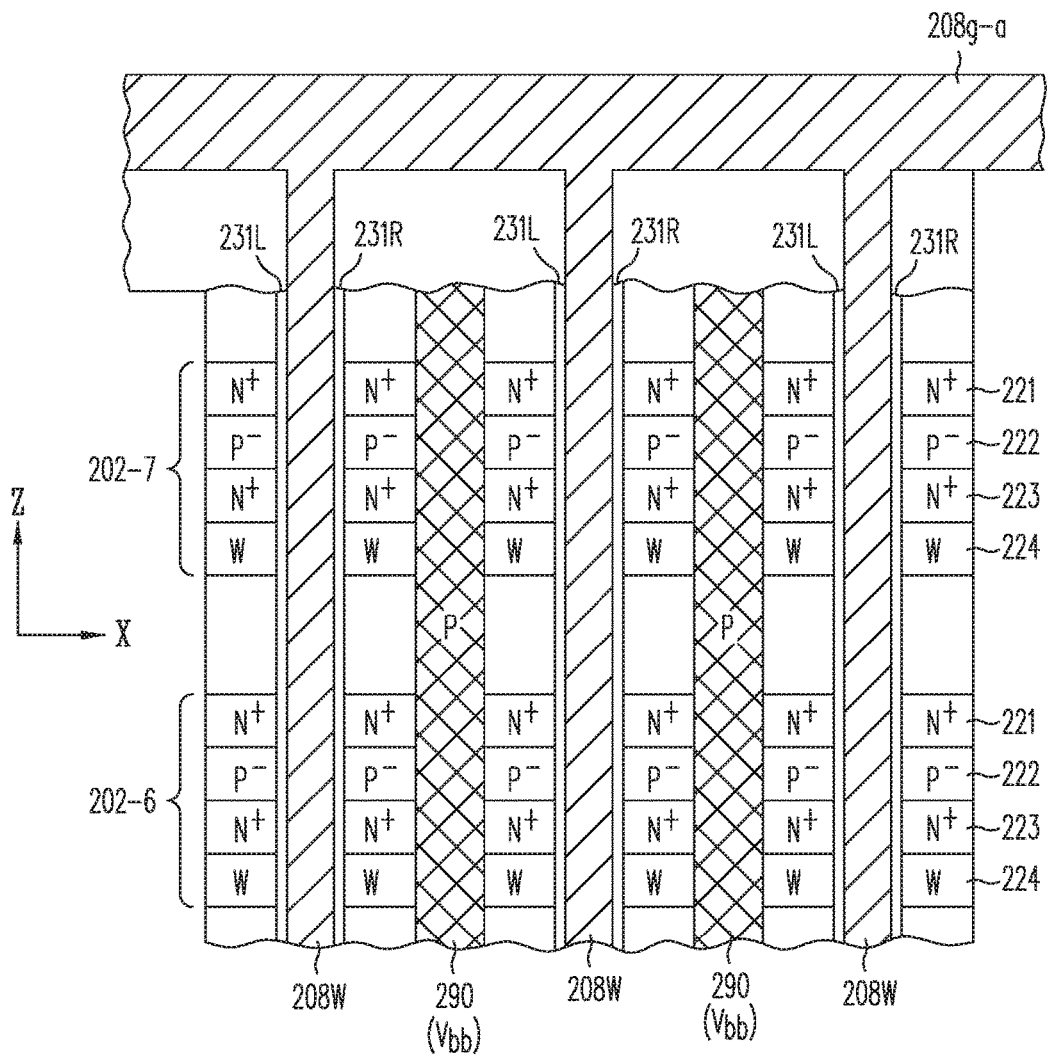

FIG. 2j shows embodiment EMB-2 of the present invention, in which only top global word lines 208g-a are provided—i.e., without any bottom global word lines. In embodiment EMB-2, pre-charge local word lines 208W-STG along one edge of an active strip are staggered with respect to the local word lines 208W-a along the opposite edge of the active strip (see, also, FIG. 4b). FIG. 4b is a cross section in the X-Y plane of embodiment EMB-2 of FIG. 2j, showing contacts 291 connecting local word lines 208W-a and staggered local word lines 208W-STG to either top global word lines 208g-a only, or alternatively, to bottom global word lines only (not shown) in a staggered configuration of TFTs along both sides of each active strip.

Staggering the local word lines simplifies the process flow by eliminating the process steps needed to form the bottom global word lines (or the top global word lines, as the case may be). The penalty for the staggered embodiment is the forfeiting of the double-density TFTs inherent in having both edges of each active strip provide TFTs within one pitch of each global word line. Specifically, in embodiment EMB-1 of FIG. 2i and corresponding FIG. 4a, in which both top and bottom global word lines are provided, two TFTs may be included in each active strip of each active layer within one pitch of a global word line (i.e., in each active strip, one TFT is formed using one sidewall of the active strip, and controlled from a bottom global word line, the other TFT is formed using the other sidewall of the active strip, and controlled from a top global word line). (A pitch is one minimum line width plus a required minimum spacing between adjacent lines). By contrast, as shown in FIG. 2j and corresponding FIG. 4b, in embodiment EMB-2, only one TFT may be provided within one global word line pitch in each active layer. The local word lines 208W at the two sides of each active strip are staggered relative to each other to allow space for the two global word line pitches required to contact them both.

FIG. 2k shows embodiment EMB-3 of the present invention, in which each of local word lines 208W controls a pair of TFTs (e.g., TFTs 281 and 283) formed in opposing side walls of adjacent active strips and their respective adjacent charge-trapping layers (e.g., trapping layers 231L and 231R). Isolation trenches 209 are etched to isolate each TFT pair (e.g., TFTs 281 and 283) from adjacent TFT pairs (e.g., TFTs 285 and 287) (see, also, FIG. 4c). As shown in FIG. 2k, each TFT is formed from one or the other of a dual-pair of active strips located on opposite side of a shared local word line, with each dual-pair of active strips separated from similarly formed adjacent dual-pairs of active strips by isolation trenches 209 which, unlike trenches 230 do not provide for TFTs on the opposite edges of each active strip (see, FIG. 4c). Trenches 209 may be filled with a dielectric isolation material (e.g., silicon dioxide, or charge-trapping material 231), or be left as an air gap. There is no accommodation therein for a local word line.

Figure 4C:
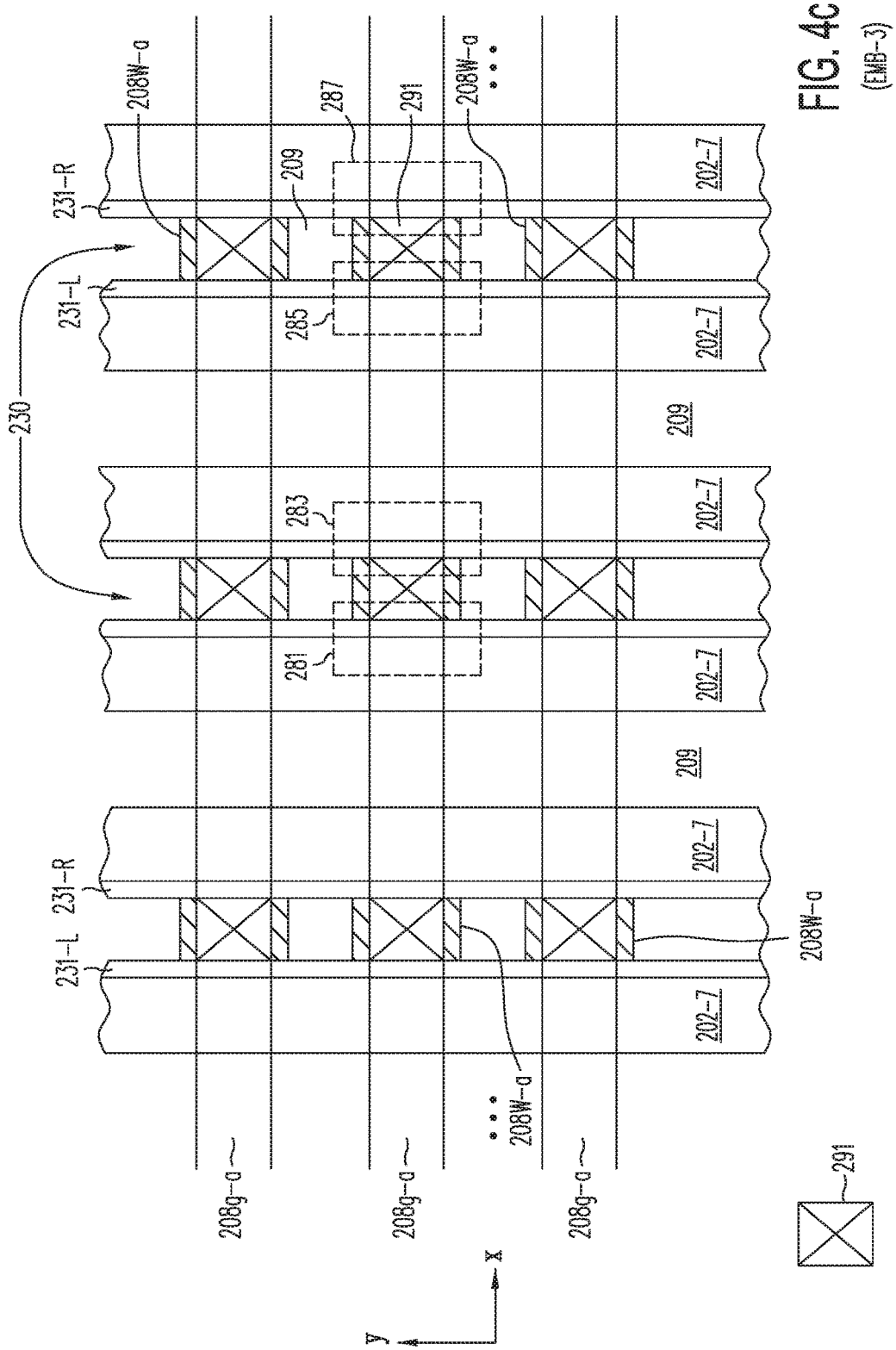
FIG. 4c is a cross section in the X-Y plane of embodiment (EMB-3) of FIGS. 2k and 2k-1, showing contacts 291 connecting local word lines 208W-a to global word lines 208g-a at the top of the memory array, or alternatively, to global word lines 208g-s at the bottom of the array (not shown), with isolation trenches 209 separating TFT pair 281 and 283 from TFT pair 285 and 287 on adjacent active strips in active layer 202-7.

FIG. 4c is a cross section in the X-Y plane of embodiment (EMB-3) of FIGS. 2k and 2k-1, showing contacts 291 connecting local word lines 208W-a to global word lines 208g-a at the top of the memory array, or alternatively, to global word lines 208g-s at the bottom of the array (not shown), with isolation trenches 209 separating TFT pair 281 and 283 from TFT pair 285 and 287 on adjacent active strips in active layer 202-7.

Figure 3A:
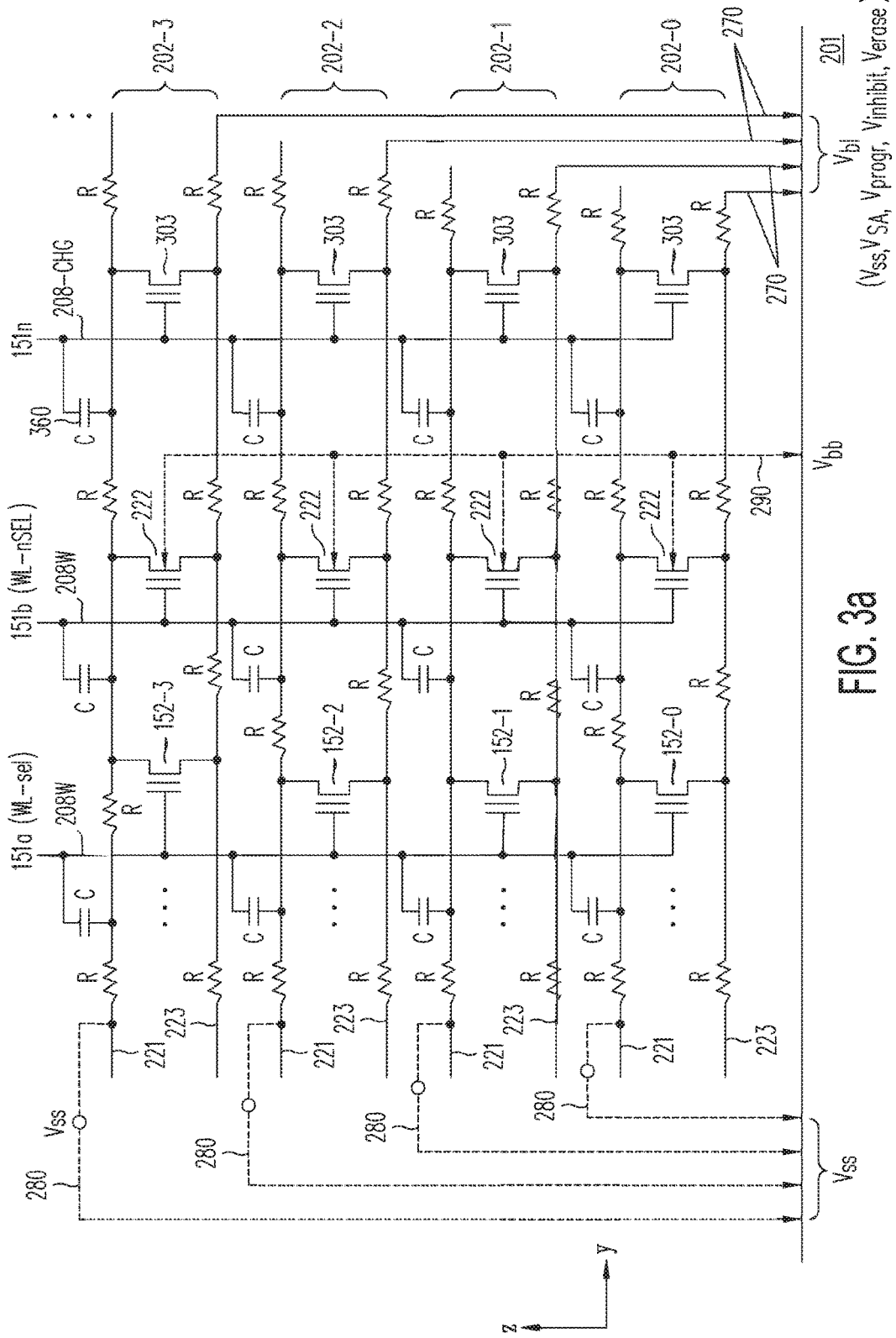
FIG. 3a illustrates the methods and circuit elements used for setting source voltage $V_{ss}$ in N⁺ sublayers 221; specifically, source voltage $V_{ss}$ may be set through hard-wire decoded source line connections 280 (shown in dashed line) or alternatively, by activating pre-charge TFTs 303 and decoded bit line connections 270 to any one of voltage sources for bit line voltages $V_{ss}$, $V_{bl}$, $V_{pgm}$, $V_{inhibit}$ and $V_{erase}$.
Figure 4D:
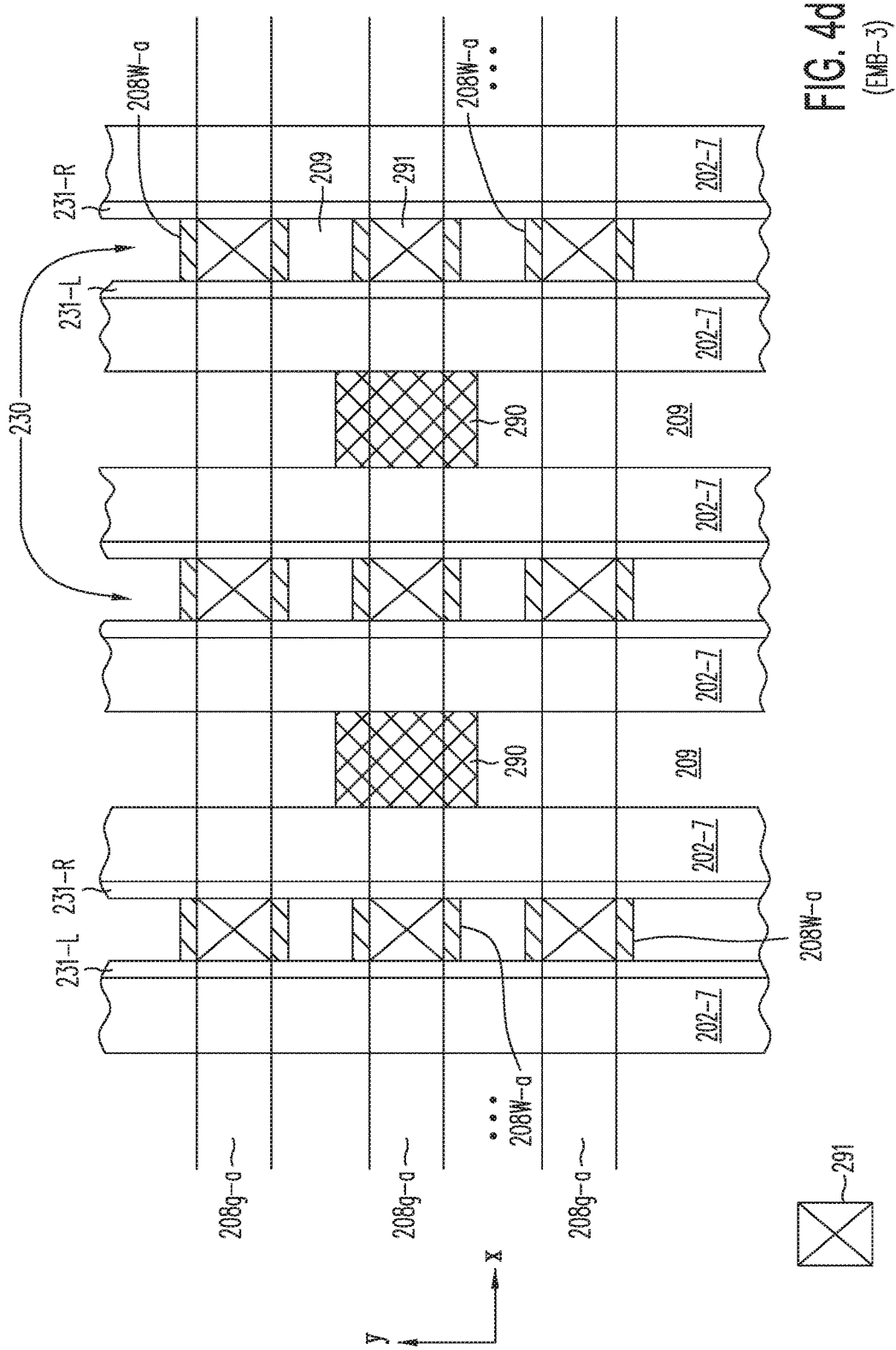
FIG. 4d is a cross section in the X-Y plane of embodiment EMB-3 of FIGS. 2k and 2k-1 through active layer 202-7, additionally including one or more optional P-doped pillars 290 which provide to P⁻ sublayers 222, selectively, substrate back-bias voltage $V_{bb}$ and erase voltage $V_{erase}$.

Alternatively, isolation trenches 209 can include pillars of P− doped polysilicon (e.g., pillars 290 in FIG. 2k-1 and FIG. 4d) connected to the substrate to provide back-bias supply voltage $V_{bb}$ (also shown as vertical connections 290 in FIG. 3a). Pillars 290 supply back-bias voltages (e.g., $V_{bb}$~0V to 2V) during read operations to reduce sub-threshold source-drain leakage currents. Alternatively, pillar 290 may supply back-bias voltage $V_{bb}$ and an erase voltage $V_{erase}$ (~12V to 20V) during erase operations. Pillars 290 can be formed as isolated vertical columns as shown in FIG. 4d, or they can fill part or all of the length of each of trenches 209 (not shown). Pillars 290 contact P− sublayers 222 in all active layers 202-0 to 202-7. However, pillars 290 cannot be provided in embodiments where metallic sublayers 224 are provided because such an arrangement may result in paths of excessive leakage currents between different planes.

FIG. 4d is a cross section in the X-Y plane of embodiment EMB-3 of FIGS. 2k and 2k-1 through active layer 202-7, additionally including one or more optional P-doped pillars 290 which provide selectively substrate back-bias voltage $V_{bb}$ and erase voltage $V_{erase}$ to P− sublayers 222.

FIG. 3a illustrates the methods and circuit elements used for setting source voltage $V_{ss}$ in N+ sublayers 221. Specifically, source voltage $V_{ss}$ may be set through hard-wire decoded source line connections 280 (shown in dashed line) or alternatively, by activating pre-charge TFTs 303 and decoded bit line connections 270 to any one of bit line voltages $V_{ss}$, $V_{bl}$, $V_{pgm}$, $V_{inhibit}$ and $V_{erase}$. Alternatively, source reference voltage $V_{ss}$ may be accessed through a metal or $N^+$ doped polysilicon conductor connecting from the top of the memory array through staircase vias, in the manner commonly employed in prior art 3D NAND stacks. Each of the conductors in hard-wired connections 280 may be independently connected, so that the source voltages for different planes or within planes need not be the same. The requirement for hard-wired conductors to connect $N^+$ sublayer 221 to the reference voltage $V_{ss}$ necessitates additional patterning and etching steps for each of active layers 202-0 to 202-7, as well as additional address decoding circuitry, thereby increasing complexity and manufacturing cost. Hence in some embodiments, it is advantageous to dispense with the hard-wired source voltage $V_{ss}$ connections, by taking advantage of a virtual voltage source in the intrinsic parasitic capacitance of the NOR string, as discussed below.

Dynamic Operation of NOR Strings

The present invention takes advantage of the cumulative intrinsic parasitic capacitance that is distributed along each NOR string to dramatically increase the number of TFTs that can be programmed, read or erased in parallel in a single operation, while also significantly reducing the operating power dissipation, as compared to 3-D NAND flash arrays. As shown in FIG. 3a, local parasitic capacitor 360 (contributing to a cumulative capacitance C) exists at each overlap between a local word line (as one plate) and the $N^+/P^-/N^+$ active layer (as the other plate). For the TFTs of the NOR strings with minimum feature size of 20 nanometers, each local parasitic capacitor is approximately 0.005 femtofarads (each femtofarad is $1 \times 10^{-15}$ farad), too small to be of much use for temporary storage of charge. However, since there may be a thousand or more TFTs contributing capacitance from one or both sides of an active strip, the total distributed capacitance C of $N^+$ sublayer 221 (the source line) and $N^+$ sublayer 223 (the bit line) in a long NOR string can be in the range of ~1 to 20 femtofarads. This is also roughly the capacitance at sensing circuitry connected through connections 270 (e.g., voltage source $V_{bl}$).

Having the bit line capacitance of the NOR string almost the same value as the parasitic capacitance of the source line (where charge is temporarily stored) provides a favorable signal-to-noise ratio during a sensing operation. In comparison, a DRAM cell of the same minimum feature size has a storage capacitor of approximately 20 femtofarads, while its bit line capacitance is around 2,000 femtofarads, or 100 times that of its storage capacitor. Such mismatch in capacitance results in a poor signal-to-noise ratio and the need for frequent refreshes. A DRAM capacitor can hold its charge for typically 64 milliseconds, due to leakage of the capacitor's charge through the DRAM cell's access transistor. In contrast, the distributed source line capacitance C of a NOR string has to contend with charge leakage not just of one transistor (as in a DRAM cell), but the much larger charge leakage through the thousand or more parallel unselected TFTs. This leakage occurs in TFTs on word line 151b (WL-nsel) of FIG. 3a that share the same active strip as the one selected TFT on word line 151a (WL-sel) and reduces substantially the charge retention time on the distributed capacitance C of the NOR string to perhaps a few hundred microseconds, thus requiring measures to reduce or neutralize the leakage, as discussed below.

As discussed below, the leakage current due to the thousand or more transistors occurs during read operations. During program, program-inhibit or erase operations, both $N^+$ sublayers 221 and 223 are preferably held at the same voltage, therefore the leakage current between the two $N^+$ sublayers 221 and 223 is insignificant. During program, program-inhibit or erase operations, charge leakage from cumulative capacitance C flows primarily to the substrate through the substrate selection circuitry, which has very little transistor leakage, as it is formed in single crystal or epitaxial silicon. Nevertheless, even a 100-microsecond charge retention time is sufficient to complete the sub-100 nanosecond read operation or the sub-100 microsecond program operation (see below) of the selected TFT on the NOR string.

A TFT in a NOR string, unlike a DRAM cell, is a non-volatile memory transistor, so that, even if parasitic capacitor C of the NOR string is completely discharged, the information stored in the selected TFT remains intact in the charge storage material (i.e., charge-trapping layer 231). This is the case for all the NOR strings of embodiments EMB-1, EMB-2, and EMB-3. In a DRAM cell, however, the information would be forever lost without frequent refreshes. Accordingly, distributed capacitance C of a NOR string of the present invention is used solely to temporarily hold the pre-charge voltage on $N^+$ sublayers 221 and 223 at one of voltages $V_{ss}$, $V_{bl}$, $V_{progr}$, $V_{inhibit}$, or $V_{erase}$, and not used to store actual data for any of the TFTs in the NOR string. Pre-charge transistor 303 of FIG. 3a, controlled by word line 151n (i.e., word line 208-CHG), is activated momentarily immediately preceding each read, program, program-inhibit or erase operation to transfer voltage $V_{bl}$ (e.g., through connections 270) from the substrate circuitry (not shown) to $N^+$ sublayer 221. For example, voltage $V_{bl}$ can be set at ~0V to pre-charge $N^+$ sublayer 221 to a virtual ground voltage ~0V during a read operation, or to pre-charge both $N^+$ sublayers 221 and 223 to between ~5V and ~10V during a program inhibit operation.

The value of cumulative capacitance C may be increased by lengthening the NOR string to accommodate the thousands more TFTs along each side of the active strip, correspondingly increasing the retention time of pre-charge voltage $V_{ss}$ on $N^+$ sublayer 221. However, a longer NOR string suffers from an increased line resistance as well as higher leakage currents between $N^+$ sublayer 221 and $N^+$ sublayer 223. Such leakage currents may interfere with the sensed current when reading the one TFT being addressed with all other TFT's of the NOR string in their "off" (and somewhat leaky) states. Also, the potentially longer time it takes to pre-charge a larger capacitor during a read operation can conflict with the desirability for a low read latency (i.e., a fast read access time). To speed up the pre-charging of the cumulative capacitance C of a long NOR string, pre-charge TFTs may be provided spaced apart along either side of the active strip (e.g., once every 128, 256 or more TFTs).

Because the variable-threshold TFTs in a long NOR string are connected in parallel, the read operating condition for the NOR string should preferably ensure that all TFTs along both edges of an active strip operate in enhancement mode (i.e., they each have a positive threshold voltage, as applied between control gate 151n and voltage $V_{ss}$ at source 221). With all TFTs being in enhancement mode, the leakage current between $N^+$ sublayer 221 and $N^+$ sublayer 223 of the active strip is suppressed when all control gates on both sides of the active strip are held at, or below $V_{ss}$~0V. This enhancement threshold voltage can be achieved by providing $P^-$ sublayer 222 with a suitable dopant concentration (e.g., a boron concentration between $1\times10^{16}$ and $1\times10^{17}$ per cm$^3$ or higher, which results in an intrinsic TFT threshold voltage of between ~0.5 V and ~1 V).

In some implementations, it may be advantageous to use N$^-$ doped or undoped polysilicon or amorphous silicon to implement sublayer 222. With such a doping, some or all of the TFTs along an active string may have a negative threshold voltage (i.e., a depletion mode threshold voltage) and thus require some means to suppress the leakage current. Such suppression can be achieved by raising voltage $V_{ss}$ on N$^+$ sublayer 221 to ~1V to ~1.5V and voltage $V_{bl}$ on N$^+$ sublayer 223 to a voltage that is ~0.5V to ~2V above that of N$^+$ sublayer 221, while holding all local word lines at 0 volt. This set of voltages provides the same effect as holding the word line voltage at ~−1V to −1.5 volts with respect to N$^+$ sublayer 221 (the source line), and thus suppresses any leakage due to TFTs that are in a slightly depleted threshold voltage. Also, after erasing the TFTs of a NOR string, the erase operation may require a subsequent soft-programming step that shifts any TFT in the NOR string that has been over-erased into a depletion mode threshold voltage back into an enhancement mode threshold voltage.

Quasi-Volatile NOR Strings

Endurance is a measure of a storage transistor's performance degradation after some number of write-erase cycles. Endurance of less than around 10,000 cycles—i.e., performance being sufficiently degraded as to be unacceptable within 10,000 cycles—is considered too low for some storage applications requiring frequent data rewrites. However, the NOR strings of any of the embodiments EMB-1, EMB-2, and EMB-3 of this invention can use a material for their charge-trapping material 231L and 231R which provides a reduced retention times, but which significantly increases their endurance (e.g., reducing the retention time from many years to minutes or hours, while increasing the endurance from thousands to tens of millions of write/erase cycles). To achieve this greater endurance, for an ONO film or a similar combination of charge-trapping layers, for example, the tunnel dielectric layer, typically a silicon oxide film of thickness 5-10 nm, can be reduced to 3 nm or less, or replaced altogether with another dielectric film (e.g., silicon nitride or SiN), or can have no dielectric layer at all. Similarly, the charge-trapping material layer may be a CVD-deposited more silicon-rich silicon nitride (e.g., $Si_{1.0}N_{1.1}$) than conventional $Si_3N_4$. Under a modest positive control gate programming voltage, electrons will tunnel through the thinner tunnel dielectric by direct tunneling (as distinct from Fowler-Nordheim tunneling, which typically requires higher programming voltages) into the silicon nitride charge-trapping material layer where the electrons will be temporarily trapped for a period between a few minutes to a few days. The charge-trapping silicon nitride layer and the blocking layer of silicon oxide (or aluminum oxide or another high-K dielectric) will keep these electrons from escaping to the word lines, but these electrons will eventually leak back out to sublayers 221, 222, and 223 of the active strip, as electrons are negatively charged and therefor intrinsically repel each other.

A TFT resulting from these modifications is a low data retention TFT ("semi-volatile TFT" or "quasi-volatile TFT"). Such a TFT may require periodic write refreshes or read refreshes to replenish the lost charge. Because the quasi-volatile TFT of the present invention provides a DRAM-like fast read access time with a low latency, the resulting quasi-volatile NOR strings may be suitable for use in some applications that currently require DRAMs. The advantages of quasi-volatile NOR string arrays over DRAMs include: (i) a much lower cost-per-bit figure of merit because DRAMs cannot be readily built in three-dimensional blocks, and (ii) a much lower power dissipation, as the refresh cycles need only be run approximately once every few minutes or once every few hours, as compared to every ~64 milliseconds required in current DRAM technology.

The quasi-volatile NOR strings of the present invention appropriately adapt the program/read/erase conditions to incorporate the periodic data refreshes. For example, because each quasi-non-volatile NOR string is frequently read-refreshed or program-refreshed, it is not necessary to "hard-program" quasi-volatile TFTs to open a large threshold voltage window between the '0' and '1' states, as compared to non-volatile TFTs where a minimum 10 years data retention is required. Quasi-non-volatile threshold voltage window may be as little as 0.2V to 1V, as compared to 1V to 3V typical for TFTs that support 10 years' data retention. The reduced threshold voltage window allows such TFTs to be programmed at lower programming voltages and by shorter-duration programming pulses, which reduce the cumulative electric field stress on the dielectric layers, thereby extending endurance.

Mirror-Bit NOR Strings

According to another embodiment of the present invention, NOR string arrays may also be programmed by channel hot-electron injection, similar to that which is used in NROM/Mirror Bit transistors, known to those of ordinary skill in the art. In an NROM/Mirror Bit transistor, charge representing one bit is stored at one end of the channel region next to the junction with the drain region, and by reversing polarity of the source and drain, charge representing a second bit is programmed and stored at the opposite end of the channel region next to the source junction. Typical programming voltages are 5 volts at the drain terminal, 0 volt at the source terminal and 8 volts at the control gate. Reading both bits requires reading in reverse order the source and drain junctions, as is well known to those of ordinary skill in the art. However, channel hot-electron programming is much less efficient than tunnel programming, and therefore channel hot-electron programming does not lend itself to the massively parallel programming that is possible by tunneling. Furthermore, the relatively large programming current results in a large IR drop between the N$^+$ sublayers (i.e., between the source and drain regions), thereby limiting the length of the NOR string, unless hard-wire connections are provided to reduce line resistance, such as shown in FIG. 2b-2 or 2b-3. Erase operations in a NROM/Mirror Bit embodiment can be achieved using conventional NROM erase mechanism of band-to-band tunneling-induced hot-hole injection. To neutralize the charge of the trapped electrons, one may apply−5V on the selected word line, 0V on N$^+$ sublayer 221 (the source line) and 5V on N$^+$ sublayer 223 (the drain line). The channel hot-electron injection approach doubles NOR string bit-density, making it attractive for applications such as archival memory.

Embodiments Under a Streamlined Process Flow ("Process Flow A") for Simultaneous Formation of TFT Channels in Active Strips of Multiple Planes The process described above for forming embodiments EMB-1, EMB-2, and EMB-3 can be modified in an alternative but simplified process flow ("Process Flow A"), while improving TFT uniformity and NOR string performance across all active strips on multiple planes. In Process Flow A, P$^-$ sublayers 222 (i.e., the channels) are simultaneously formed in a single sequence for all active strips on all planes. This P$^-$ channel formation is done late in the manufacturing process flow, after all or most of the high temperature steps have been completed. Process Flow A is described below in conjunction with embodiments EMB-1 and EMB-3, but can be similarly applied to embodiment EMB-2 and other embodiments, and their derivatives. In the rest of the detailed description, embodiments manufactured under Process Flow A are identified by the suffix "A" appended to their identification. For example, a variation of embodiment EMB-1 manufactured under Process Flow A is identified as embodiment EMB-1A.

Figure 5A:
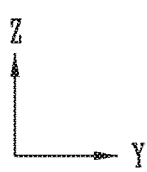
FIG. 5a shows a cross section through a Y-Z plane of semiconductor structure 500, after horizontal active layers 502-0 through 502-7 have been formed, one on top of each other, and isolated from each other by respective isolation layers 503-0 to 503-7 (of material ISL) on semiconductor substrate 201.

FIG. 5a shows a cross section through a Y-Z plane of semiconductor structure 500, after active layers 502-0 through 502-7 have been formed in a stack of eight planes, one on top of each other, and isolated from each other by respective isolation layers 503-0 to 503-7 of material ISL on semiconductor substrate 201. Relative to semiconductor structure 220a of FIG. 2b-1, sublayer 222 of each of active layers 502-0 to 502-7 is formed with, instead of P$^-$ polysilicon, sacrificial material SAC1. Isolation layers 503-0 to 503-7, formed with isolation material ISL (a dielectric material), separate the active layers on different planes. Sacrificial material SAC1 in sublayers 522-0 to 522-7 will eventually be etched away to make way for P$^-$ sublayers. The SAC1 material is selected such that it can be etched rapidly with a high etch selectivity, as compared to the etch rates of isolation material ISL and N$^+$ sublayers 523-0 to 523-7, and 521-0 to 521-7. The ISL material may be silicon oxide (e.g., SiO$_2$), deposited in the thickness range 20-100 nanometer, the N$^+$ sublayers may be heavily doped polysilicon, each layer in the thickness range of 20-100 nanometers, and the SAC1 material may be, for example, one or more of: silicon nitride, porous silicon oxide, and silicon germanium, in the thickness range 10-100 nanometers. Actual thickness used for each layer is preferably at the lower end of the range to keep to a minimum the total height of the multiple planes, which can be increasingly more difficult to etch anisotropically with 32, 64 or more stacked planes.

Figure 5B:
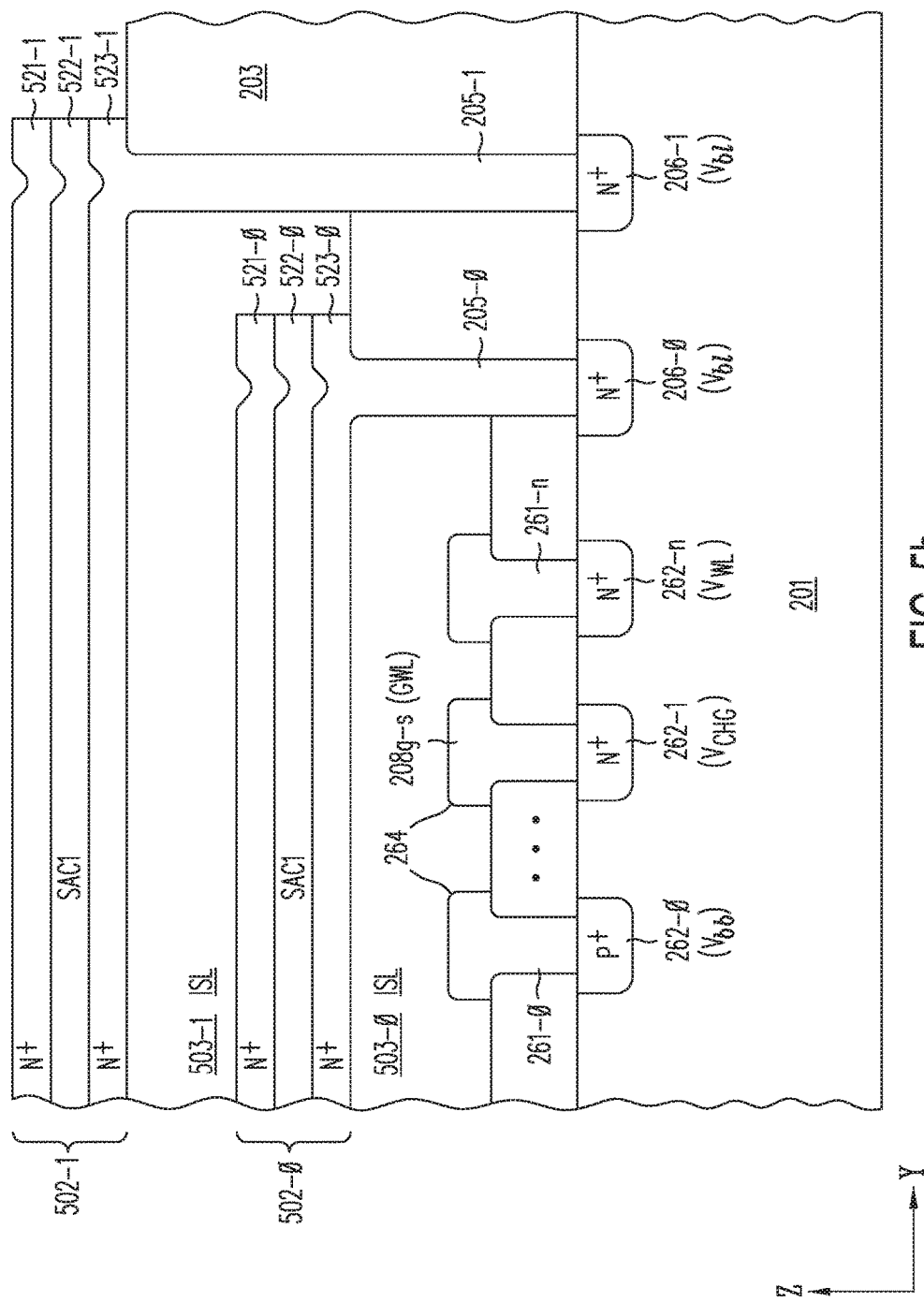
FIG. 5b is a cross section in a Y-Z plane through buried contacts 205-0 and 205-1, through which N⁺ sublayers 523-1 and 523-0 are respectively connected to circuitry 206-0 and 206-1 in semiconductor substrate 201.

FIG. 5b is a cross section in a Y-Z plane through buried contacts 205-0 and 205-1, through which N$^+$ sublayers 523-1 and 523-0 are connected to circuitry 206-0 and 206-1 in semiconductor substrate 201. Before active layers 502-0 through 502-7 are formed, buried contacts 205-0 are formed by etching into isolation layer 503-0, so that when N$^+$ sublayer 523-0 is deposited, electrical contact is created with circuitry 206-0 previously formed in substrate 201. An optional low resistivity thin metallic sublayer (e.g., TiN and tungsten) of typical thickness range between 5 and 20 nm can be deposited (not shown in FIG. 5b) before N+ sublayer 523-0 is deposited, so as to lower the line resistance. Low resistivity metallic plugs such as TiN followed by a thin layer of tungsten can be used to fill the buried contact openings to reduce contact resistance to the substrate. Active layer 502-0 is then etched into separate blocks, each of which will later be etched into individual active strips. Each higher plane of or active layer (e.g., active layer 502-1) extends beyond the active layers underneath and has its own buried contacts 205-1 connecting it to circuitry 206-1 in substrate 201.

Connecting active strips of each plane to substrate circuitry can be accomplished either by buried contacts from the bottom (e.g., buried contacts 205-0 and 205-1 connecting drain sublayers 523-0 and 523-1 to substrate circuitry 206-0 and 206-1 in FIG. 5b), or by conductor-filled vias from the top of the semiconductor structure (not shown), making electrical contacts to N$^+$ sublayers 521-0 and 521-1. Because either one of sublayers 523 and 521 in the same active strip may serve as source terminal or drain terminal for the TFTs in the corresponding NOR string, N$^+$ sublayers 521 or 523 in the same active strip are interchangeable. The vias are etched through the ISL material in isolation layers 503-0 to 503-7 by first forming a stair-stepped multi-plane pyramid-like structure (i.e., a structure in which the bottom plane extends furthest out), as is well known to a person of ordinary skill familiar with 3D3-D NAND via formation. This alternative contact-from-the-top scheme allows vias to be etched to reach more than one plane at a time, thus reducing the number of masking and contact etching steps, which is particularly useful when there are 32, 64 or more stacked planes. However, because sublayers 523 lie underneath of, and are masked by sublayers 521, it is not easy to contact sublayers 523 using stair-step vias from the top, as there is a risk that the conductor in the vias may electrically short sublayers 521 and 523.

According to one embodiment of the present invention, in one process, drain sublayers 523 are connected to the substrate circuitry from the bottom through buried contacts, while the source sublayers 521 are connected to the substrate circuitry either through hard-wire connections by conductor-filled vias from the top (e.g., connections 280 in FIG. 3a). Alternatively, and preferably, the source layers 521 may be connected to substrate circuitry by the buried contacts using TFTs in the NOR string that are designated as pre-charge TFTs (i.e., those TFTs that are used to charge the parasitic capacitance of the NOR string to provide a virtual voltage source). In this manner, the complexing of providing the vias or hard-wire conductors are avoided.

The discussion below focuses on NOR strings in which the source and drain sublayers connect to substrate circuitry through buried contacts in conjunction with pre-charge TFTs (as described above). This arrangement provides the drain and source sublayers appropriate voltages for read, program, program-inhibit and erase operations.

Next, all planes may be exposed to a high-temperature rapid thermal annealing and recrystallization step simultaneously applied to N$^+$ sublayers 521 and 523. This step can also be individually applied to each plane. Alternatively, rapid thermal annealing, laser annealing for all layers, or shallow laser anneal (e.g., ELA) on one or more planes at a time may also be used. Annealing reduces sheet resistivity of the N$^+$ sublayers by activating dopants, recrystallization and reducing dopant segregation at grain boundaries. Of note, because this thermal annealing step takes place before P$^-$ sublayer 522 is formed in any plane, the annealing temperature and duration can be quite high, even in excess of 1000° C., which is advantageous for lowering the resistivity of N$^+$ sublayers 521 and 523.

Figure 5C:
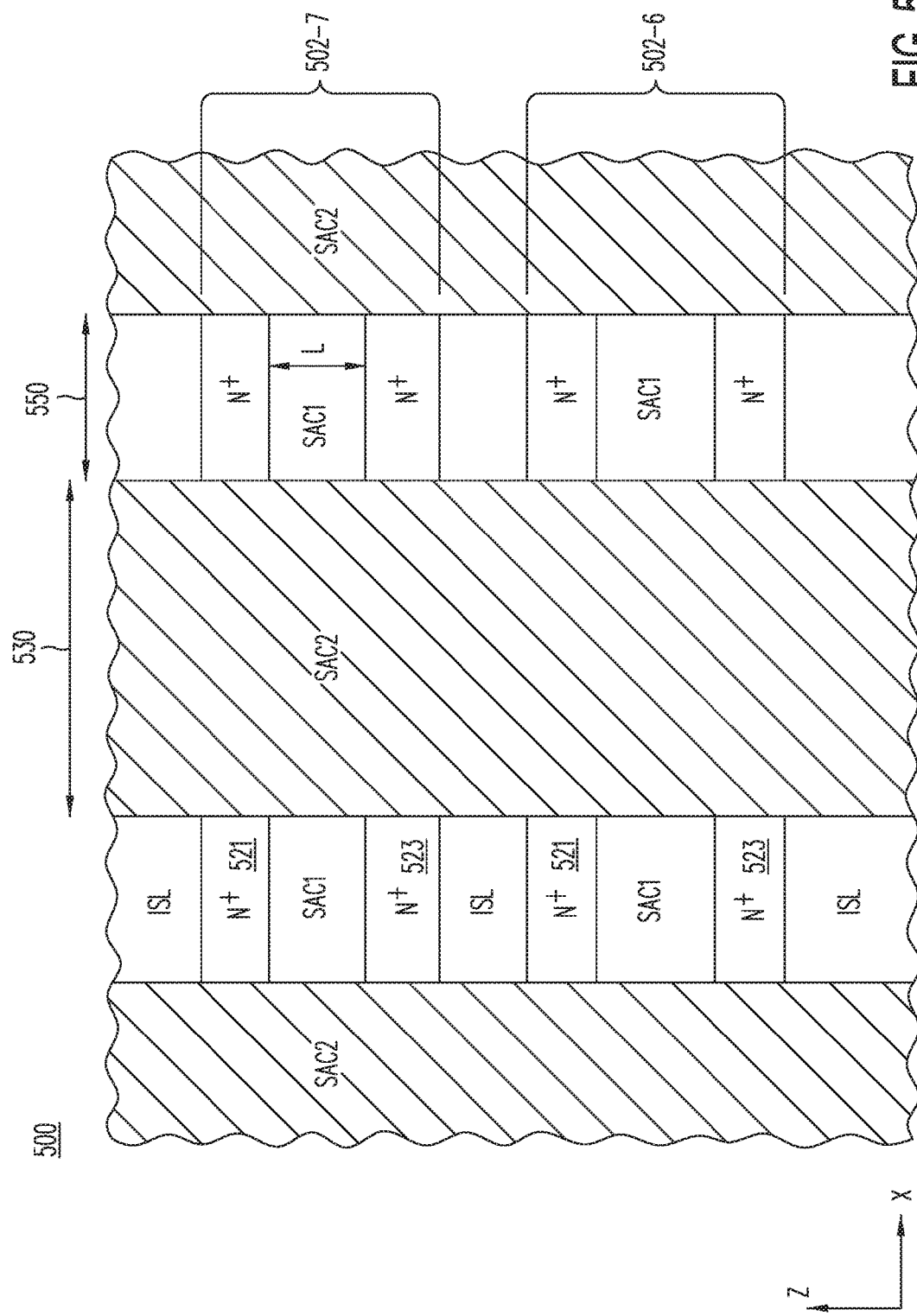
FIG. 5c is a cross section in the Z-X plane, showing planes or active layers 502-6 and 502-7 of structure 500 after trenches 530 along the Y-direction are anisotropically etched through active layers 502-7 to 502-0 to reach down to landing pads 264 of FIG. 5b; the SAC2 material filling trenches 530 has etch characteristics that are different from those of the SAC1 material.

FIG. 5c is a cross section in the Z-X plane, showing active layers 502-6 and 502-7 of structure 500 after trenches 530 along the Y-direction are anisotropically etched through active layers 502-7 to 502-0 to reach down to landing pads 264 of FIG. 5b. Deep trenches 530 are etched in an anisotropic etch using appropriate chemistry to etch through alternating layers of N$^+$ material, the SAC1 material, N$^+$ material, and the ISL material, to achieve as close as possible vertical trench sidewalls (i.e., achieving substantially the same active strip width and spacing at the top plane and the bottom plane). A hard mask material (e.g., carbon) may be used during the multi-step etch sequence.

After removing the hard mask residue, trenches 530 are filled with a second sacrificial material (SAC2) that has different etch characteristics from those of the SAC1 material. The SAC2 material may be, for example, fast etching SiO$_2$ or doped glass (e.g., BPSG). Like the ISL material, the SAC2 material is chosen to resist etching when the SAC1 material is being etched. The SAC2 material mechanically supports the tall narrow stacks of active strips, particularly at later steps that are performed during and after the SAC1 material is removed, which leaves cavities between the N+ sublayers. Alternatively, such support can be provided by local word lines 208W in implementations in which the charge-trapping material and the local word lines are formed prior to etching the SAC1 material.

Figure 5D:
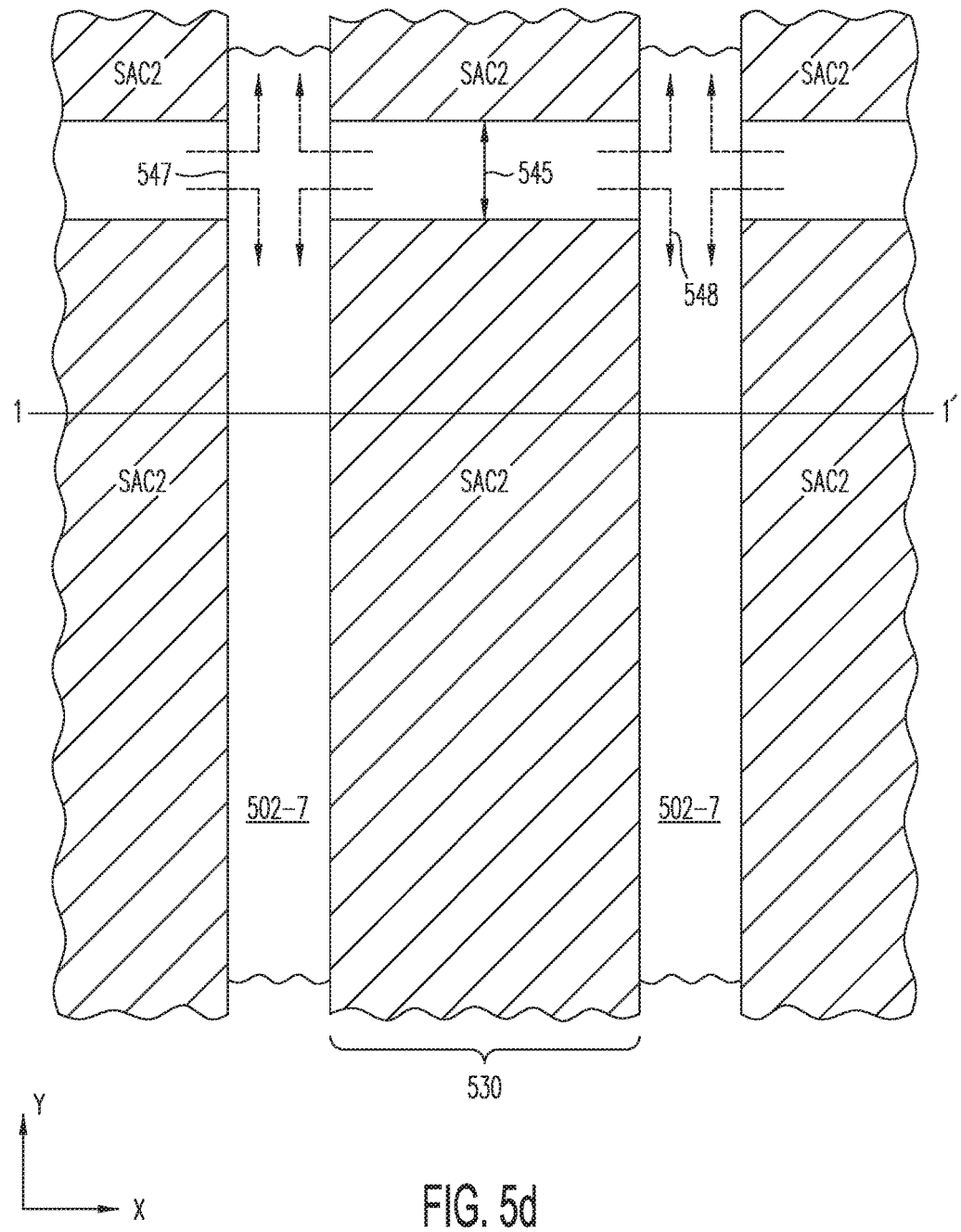
FIG. 5d shows the top plane or active layer 502-7 in an X-Y plane through sublayer 522 of the SAC1 material, showing secondary trench 545 etched anisotropically into the SAC2 material that fills trenches 530, reaching the bottom of the stack of active layers 502-7 to 502-0; the anisotropic etch exposes sidewalls 547 of the stacks to allow etchant to etch away the SAC1 material to make room for sublayer 522 by forming a cavity between N⁺ sublayer 521 and N⁺ sublayer 523 in each active strip of active layers 502-0 to 502-7.

Next, narrow openings are masked along the X-direction and etched anisotropically through the SAC2 material that filled trench 530 to form second trenches 545 within the SAC2 material occupying trenches 530, as shown in FIG. 5d. The anisotropic etch exposes vertical sidewalls 547 of the active strips throughout the active layers to allow removal of the SAC1 material in sublayer 522, thereby forming a cavity between N+ sublayer 521 and N+ sublayer 523 in each active strip of active layers 502-0 to 502-7. Secondary trenches 545 allow the formation of a conductive path from the sublayer 522 to the P+ substrate region 262-0 (labeled $V_{bb}$) in FIG. 5b. Secondary trenches 545 are preferably each 20-100 nanometers wide and may be spaced apart a distance sufficient to accommodate 64 or more side-by-side local word lines, such as local word lines 208W-s. Next, a highly selective etch is applied to the exposed sidewalls 547 of FIG. 5d to isotropically etch away all the exposed SAC1 material in sublayer 522 through the paths indicated by arrows 547 and 548. As discussed above, the SAC1 material can be silicon nitride, while both the ISL material and the SAC2 material can be silicon oxide. With these materials, hot phosphoric acid may be used to remove the SAC1 material, while leaving essentially intact all the N+ doped polysilicon in N+ sublayers 521 and 523, and the ISL and SAC2 materials in layer 503 and trenches 530. Dry-etch processes involving high-selectivity chemistry can achieve a similar result without leaving residues in the elongated cavities previously occupied by the SAC1 material, walled between the SAC2 material filling trenches 530.

After the selective removal of the SAC2 material, discussed above, there are two options in further processing: (i) a first option that first forms P− sublayers 522 in the cavities between N+ sublayers 521 and 523, to be followed by formations of charge-trapping layers and local word lines 208W; and (ii) a second option that first forms the charge-trapping layers and local word lines, followed by forming P− sublayers 522. The first option is described below in conjunction with FIG. 5e and embodiment EMB-1A of FIG. 5f. The second option is described below in conjunction with embodiment EMB-3A of FIG. 5g.

Figure 5E:
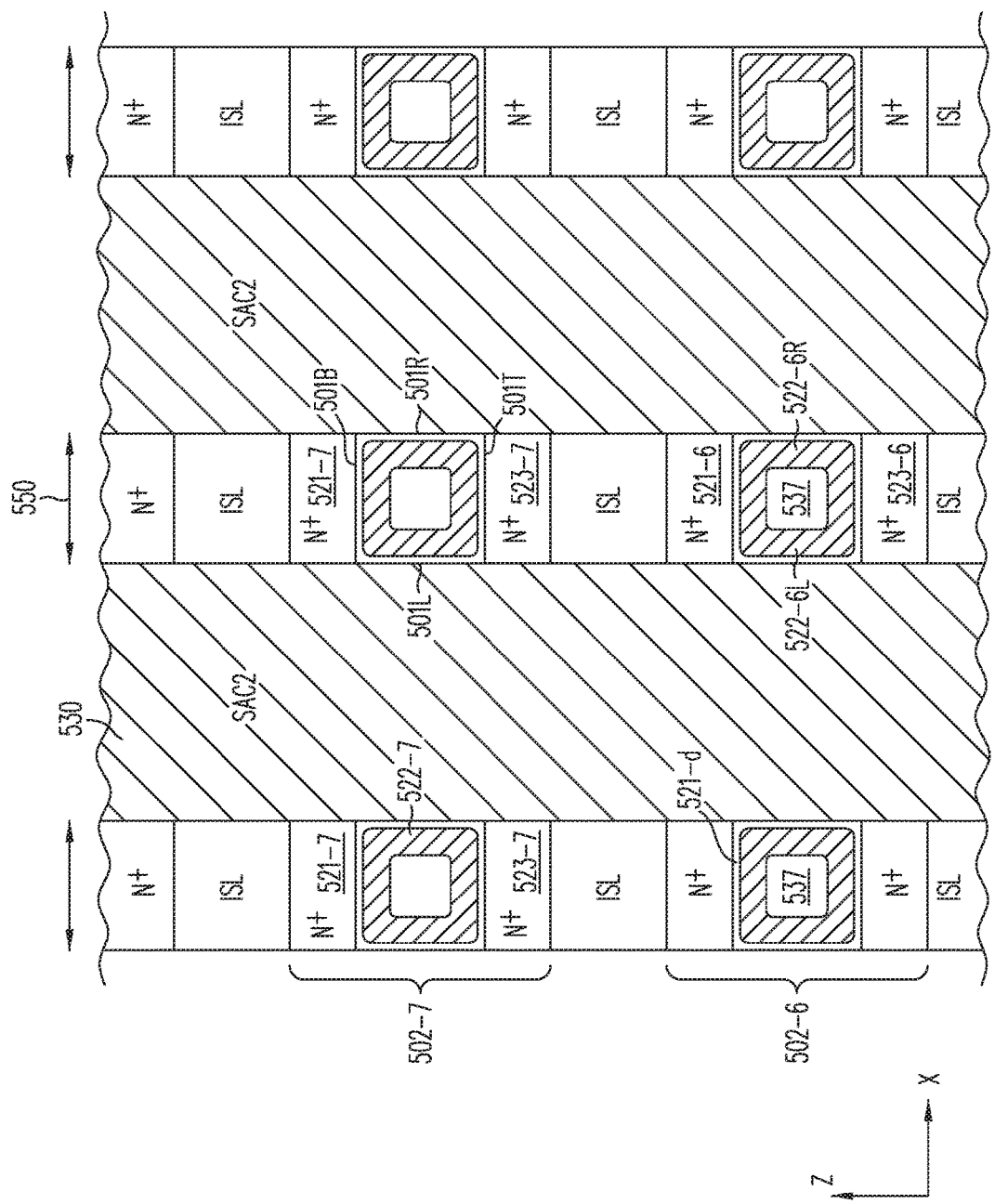
FIG. 5e is a cross section through the Z-X plane (e.g., along line 1-1' of FIG. 5d) away from trench 545, showing active strips in adjacent active layers supported by the SAC2 material on both sides of each active strip; in cavities 537, resulting from excavating the SAC1 material in sublayer 522, optional ultra-thin dopant diffusion-blocking layer 521-d is provided, over which is deposited undoped or P⁻ doped polysilicon 521.

FIG. 5e is a cross section through the Z-X plane (e.g., along line 1-1' of FIG. 5d) away from trench 545, showing active strips in adjacent active layers supported by the SAC2 material on both sides of each active strip. Cavities 537 result from excavating the SAC1 material from the space between sublayers 521 and 523 (i.e., the space that is reserved for P− sublayer 522). Optional ultra-thin dopant diffusion-blocking sublayer 521-d is then deposited on the walls of cavities 537 (e.g., left wall 501L, right wall 501R, bottom wall 501B of N+ sublayer 521-7 and top portion 501T of N+ drain sublayer 523-7, as shown in FIG. 5e). Ultrathin dopant diffusion-blocking layer 521-d may be, for example, silicon nitride, silicon-germanium (SiGe) or other materials with atomic lattice smaller than the diameter of the atoms of the N+ dopant used (e.g., phosphorous, arsenic or antimony) and may be in the thickness range of 0 to 3 nanometers. Dopant diffusion-blocking sublayer 521-d can achieve zero or near zero nanometers thickness by a controlled deposition of 1-3 atomic layers of the diffusion barrier material using, for example, atomic layer deposition (ALD) techniques. Dopant diffusion-blocking layer 521-d may provide the same dopant diffusion barrier as layers 221-d, 223-d of FIG. 2b-5a, except that, unlike the multiple depositions required of forming layers 221-d and 223-d for the multiple active layers, dopant diffusion-blocking layers 521-d are formed in a single deposition step for all active layers. The gaseous material required for the uniform deposition of dopant diffusion-blocking layer 521-d coats the walls of cavities 537 through secondary trenches 545, as shown by arrows 547 and 548 in FIG. 5d. In no event should the material or thickness of dopant diffusion-blocking layer 521-d be such that it materially degrades electron conduction across it, nor should it allow material trapping of electrons as they tunnel through it. If the leakage current between N+ sublayers 521 and 523 in the active strips is tolerably low, dopant diffusion-blocking layer 521-d may altogether be omitted.

Next, P− sublayers 522 (e.g., P− sublayer 522-7) are formed along the inside walls 501T, 501B, 501R and 501L of each cavity, extending along the entire length of each active strip. P− sublayers 522 may be doped polysilicon, undoped or P-doped amorphous silicon, (e.g., boron-doped between $1\times10^{16}/cm^3$ and $1\times10^{18}/cm^3$), silicon-germanium, or any suitable semiconductor material in a thickness range between 4 and 15 nanometers. In some implementations, P− sublayer 522 is sufficiently thin not to completely fill cavities 537, leaving air gap. In other implementations, P− sublayer 522 may be formed sufficiently thick to completely fill cavities 537. After local word lines are formed at a later step, P− sublayers 522-6R, and 522-6L (for layer 502-6) along the vertical walls 501R, and 501L serve as the P− channels of TFTs on one or both side edges of its active strip 550, with N+ sublayer 521-6 serving as an N+ source (at voltage $V_{ss}$) and N+ sublayer 523-6 serving as an N+ drain (providing voltage $V_{bl}$). At a typical thickness of 3-15 nanometers, P− sublayers 522 may be substantially thinner than the width of their corresponding active strips, which are defined lithographically or may be defined by spacers well known to a person of ordinary skill in the art. In fact, the thickness of the P− channel formed under this process is independent of the width of the active strips and, even for very thin channels, P− sublayer 522 has substantially the same thickness in each of the many active layers. At such reduced thickness, depending on its doping concentration, P− sublayers 522-6R and 522-6L are sufficiently thin to be readily completely depleted under appropriate word line voltages, thereby improving transistor threshold voltage control and reducing leakage between the N+ source and drain sublayers along the active strip.

Simultaneously, P-doped polysilicon is deposited along the vertical walls of secondary trenches 545 to form pillars 290 (not shown in FIG. 5e, but shown as pillars 290 in FIG. 5f) extending from the top plane to the bottom plane. At the bottom plane, connections are made between pillars 290 and circuitry in substrate 201 (e.g., voltage source providing voltage $V_{bb}$). If dopant diffusion-blocking sublayer 521-d is provided, prior to forming P− sublayer 522 and pillars 290, a brief anisotropic etch may be needed to etch away layer 521-d at the bottom of trench 545 to allow direct contact between the P− doped pillars 290 and the P+ circuitry that provides back-bias $V_{bb}$ and erase voltage $V_{erase}$ from substrate 201 (e.g., circuitry 262-0 in FIG. 5b). Pillars 290 are spaced apart along the length of each active strip to accommodate the formation (in a subsequent step) of 32, 64, 128 or more vertical local word lines 208W in-between the pillars (see, FIG. 5*f*) of embodiment EMB-1A. (This separation is set by the separation of secondary trenches 545.)

Pillars 290 connect P⁻ sublayers 222 (e.g., P⁻ sublayers 522-6R and 522-6L) of all the active layers—which serve as channel regions of the TFTs—to circuitry in substrate 201, so as to provide P⁻ sublayers 222 with an appropriate back-bias voltage. Circuitry in the substrate is typically shared by TFTs of all active strips in semiconductor structure 500. Pillars 290 provide back-bias voltage $V_{bb}$ during read operations and high voltage $V_{erase}$, typically 10V to 20V, during block-erase operations. However in some implementations (see below, and FIGS. 6*a*-6*c*), an erase operation can be accomplished without the use of a substrate-generated voltage, in which case pillar 290 connections to P⁺ circuitry (e.g., P⁺ circuitry 262-0) may not be needed, so that the thin polysilicon along the vertical walls of the pillars 290 may be etched away (being careful to not etch away the channel region P⁻ sublayers 522 (e.g., P⁺ sublayers 522-6R, and 522-6L of FIG. 5*e*, inside the cavities bordered by walls 501B, 501T, 501R and 501L).

Figure 5F:
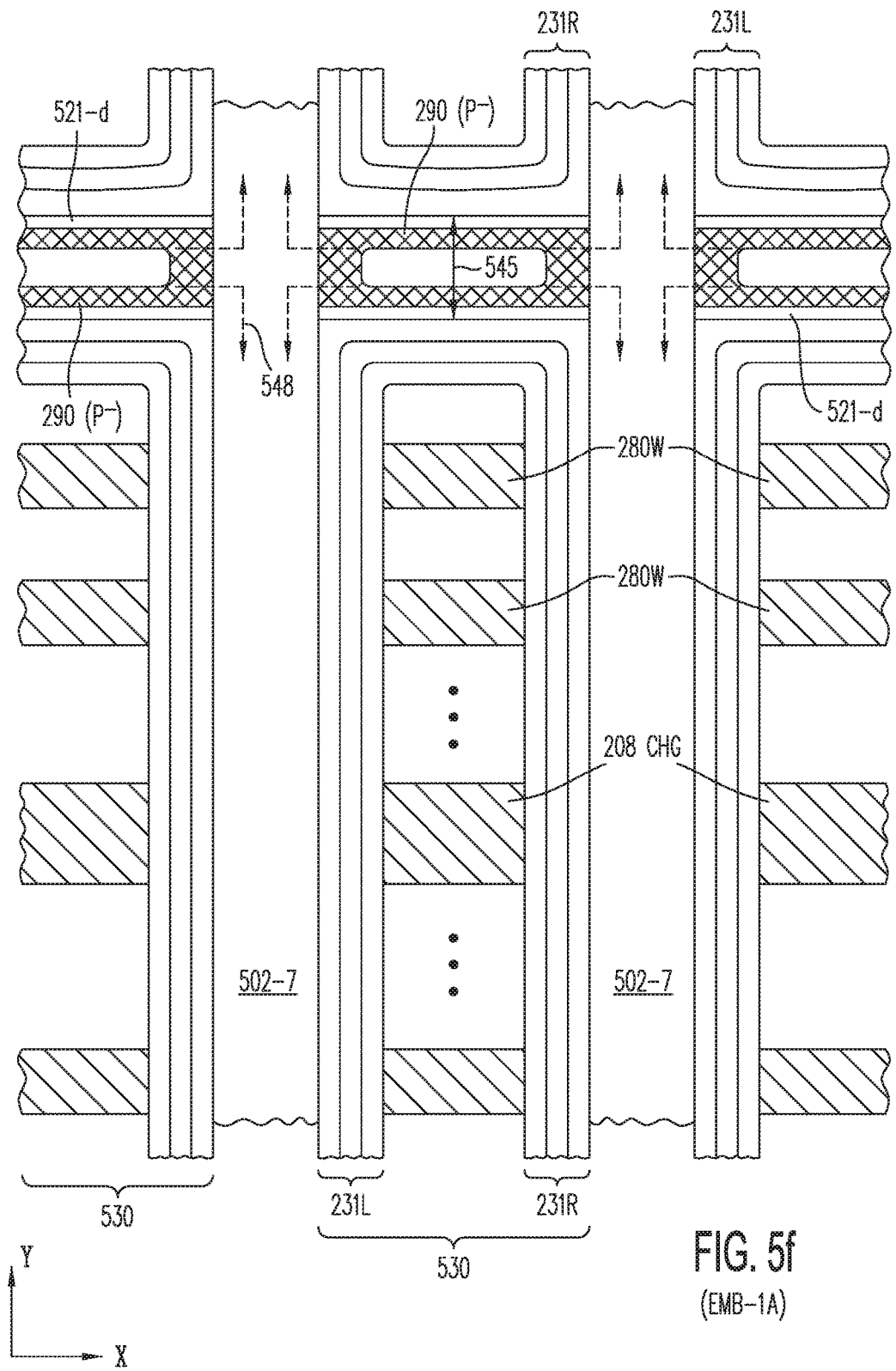
FIG. 5f illustrates, in a cross section in the X-Y plane of embodiment EMB-1A of the present invention, P-doped pillars 290, local word lines 280W and pre-charge word lines 208-CHG being provided between and along adjacent active strips of active layer 502-7, the word lines being formed after the SAC2 material in trenches 530 are selectively removed; prior to forming the word lines, charge-trapping layers 231L and 231R are deposited conformally on the side walls of the active strips (Ultra-thin dopant diffusion-blocking layer 521-d is optional).

In the next step, the SAC2 material remaining in trenches 530 are removed using, for example, a high selectivity anisotropic etch which exposes the side-walls of all active strips except where the spaced-apart pillars 290 are located. Next, charge-trapping layers 231L and 231R are deposited conformally on the exposed sidewalls of the active strips. FIG. 5*f* illustrates, in a cross section in the X-Y plane of embodiment EMB-1A of the present invention, P-doped pillars 290, local word lines 280W and pre-charge word lines 208-CHG are provided in adjacent active strips of active layer 502-7, after suitable masking, etching and deposition steps.

Figure 5G:
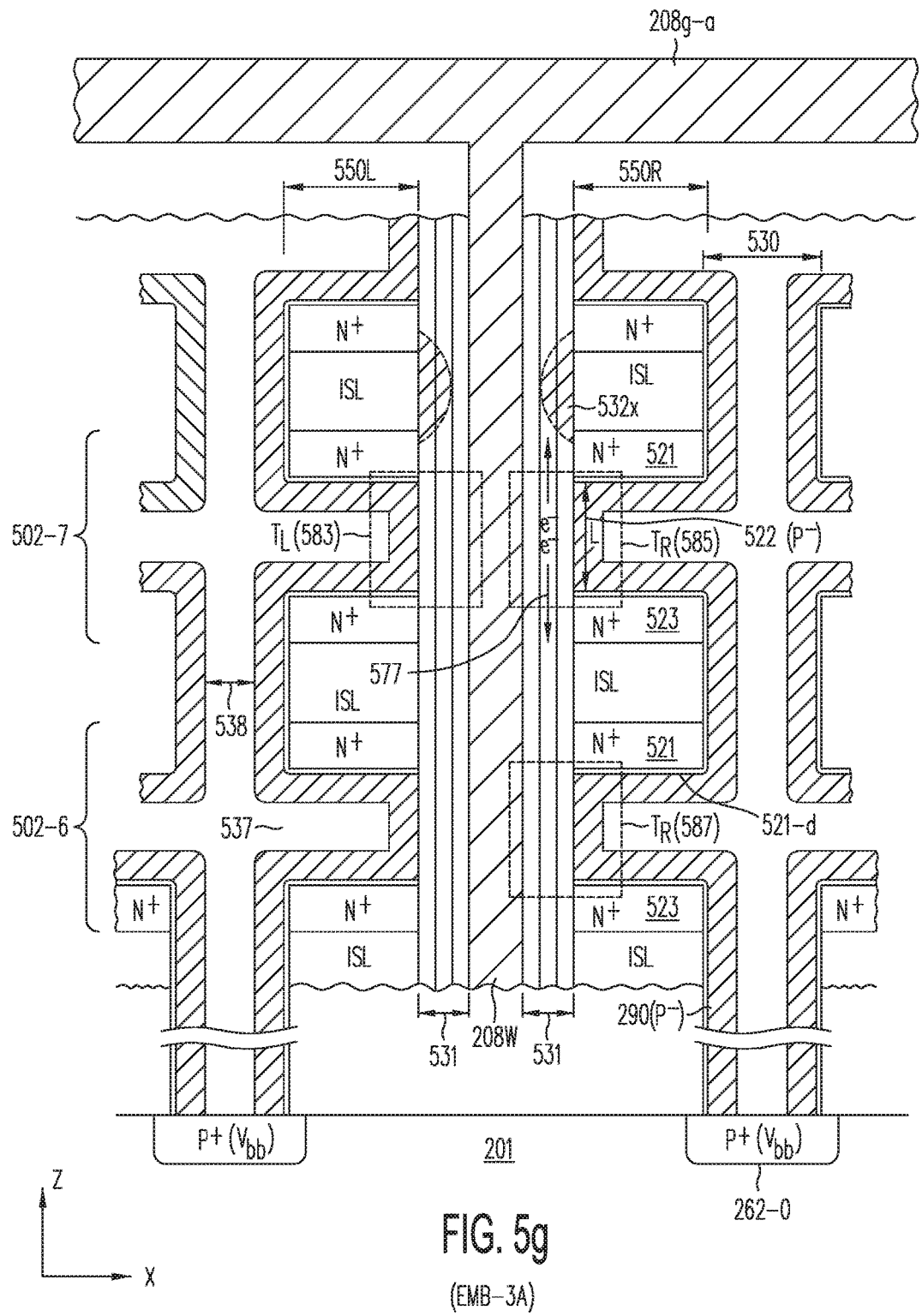
FIG. 5g shows a cross section in the Z-X plane of active layers 502-6 and 502-7 of embodiment EMB-3A, after formation of optional ultra-thin dopant diffusion blocking layer 521-d and deposition of undoped or P⁻ doped polysilicon, amorphous silicon, or silicon germanium in sublayer 522 that forms the channel regions of TFTs $T_R$ 585, $T_R$587; the sublayer 522 (P⁻) is also deposited on the trench side walls as pillars 290 to connect the channel regions in the stack (i.e., P⁻ sublayer 522) to substrate circuitry 262.

The remaining process steps follow the corresponding steps in forming embodiments EMB-1, EMB-2 and EMB-3 as previously discussed, as appropriate. Before forming charge-trapping layers 531, the exposed side edges of optional ultrathin dopant diffusion-blocking layer 521-*d* may be removed by a short isotropic etch, followed by forming charge-trapping layers 531 on one or both exposed sidewalls of the active layers, followed by forming local word lines 208W along both side edges (e.g., embodiment EMB-1A of FIG. 5*f*). Alternatively, the ultrathin dopant diffusion-blocking layers 521-*d* at the exposed side edges of the cavities are oxidized to form part or all the thickness of the tunnel dielectric layer over P⁻ sublayer 522, while at the same time forming thicker tunnel dielectric layer over the exposed side edges of N⁺ sublayers 521 and 523. The thicker tunnel dielectric layer is around 1 to 5 nanometers thicker than the tunnel dielectric layer over P⁻ sublayer 522 because the oxidation rate of N⁺ doped polysilicon is considerably faster than the oxidation rate of silicon nitride. As Fowler-Nordheim tunneling current is exponentially dependent on the tunneling dielectric thickness, even a 1 nanometer thicker tunnel oxide layer significantly impedes charge tunneling from the N⁺ regions into charge-trapping layer 531 during programming FIG. 5*g* shows a cross section in the Z-X plane of active layers 502-6 and 502-7 of embodiment EMB-3A formed using the process of the second option. FIG. 5*g* shows embodiment EMB-3A after formation of optional ultra-thin dopant diffusion-blocking layer 521-*d* and deposition of undoped or P⁻ doped polysilicon, amorphous silicon or silicon germanium in sublayer 522 that forms the channel regions of TFTs $T_R$ 585, $T_R$587. The channel material is also deposited on side walls of trenches 545 to form pillars 290 for connecting the channel regions of the TFTs (i.e., P⁻ sublayer 522) to substrate circuitry 262. The simultaneously formed P⁻ sublayers 522 in all active layers provide a channel length L. Cavity 537 and gap 538 between neighboring pillars 290 can be filled completely with a thicker P⁻ polysilicon or silicon germanium, left as partial air-gap isolation, or filled with dielectric isolation (e.g., silicon dioxide). Pillars 290 surrounding the sides of active strips 502-6, and 502-7 in embodiment EMB-3A provide desirable electrical shielding to reduce the parasitic capacitive coupling between adjacent active strips on the same plane. Capacitive shielding between active strips on adjacent planes in a stack can be enhanced by etching the ISL material in the isolation layers (e.g., isolation layers 503-6 and 503-7) in part or in whole (not shown in FIG. 5*g*).

Under the second option process, i.e., forming charge-trapping layer 531 before the P⁻ sublayer 522, the ISL material between the active layers can be etched (prior to removal of the SAC1 material) to expose the back side of charge-trapping layer 531. The exposed back side of charge-trapping layer 531 allows tunnel dielectric (typically, SiO₂) and part or all of the exposed charge-trapping material (typically silicon-rich silicon nitride), as indicated in FIG. 5*g* by area 532X, to be removed. Shaded area 532X interrupts the path by which electrons that are trapped over TFT channels (i.e., the region indicated by L) may be lost through sideways hopping conduction in the silicon-rich silicon nitride layer along arrow 577. The cavity left in area 532*x* after the ISL material and the exposed charge-trapping material are removed can be filled with another dielectric layer following removal of the SAC1 material from sublayer 522 or be left as an air gap. In embodiments where the ISL material is only partially removed, pillars 290 can fill up the etched ISL resulting spaces to partially isolate N⁺ sublayer 523 of TFT $T_R$ 585 from N⁺ sublayer 521 of TFT $T_R$ 587. As in embodiment EMB-1A, all P– sublayers 522 in the active layers are connected via pillars 290 to P⁺ circuitry 262-0 in substrate 201.

Dopant diffusion-blocking film 521-*d* can be formed (FIG. 5*g*) in a single step for all active layers prior to deposition of P⁻ sublayers 522, thus greatly simplifying the repetitive process of FIG. 2*b*-5. However, because deposition of P⁻ sublayers 522 is performed almost at the end of the process, after all high-temperature anneals have already taken place, ultra-thin dopant diffusion-blocking layer 521-*d* may be omitted. In embodiments in which connections of pillars 290 to substrate circuitry is are not needed for erase operations, the vertical walls of P⁻ pillars 290 that are within trenches 530 may be etched away, leaving only P⁻ sublayers 522 lining the cavities 537 (FIG. 5*g*) and leaving trenches 530 as air-gap isolation between adjacent active strips of all planes.

Pillars 290 and conductors 208W provide electrical shielding to suppress the parasitic capacitive coupling between adjacent thin film transistors of each plane. As seen from FIG. 5*g*, pillars 290 and P⁻ sublayers 522 may be formed prior to or following formations of charge-trapping material 531 and local word line 208W.

Figures 1, 5H:
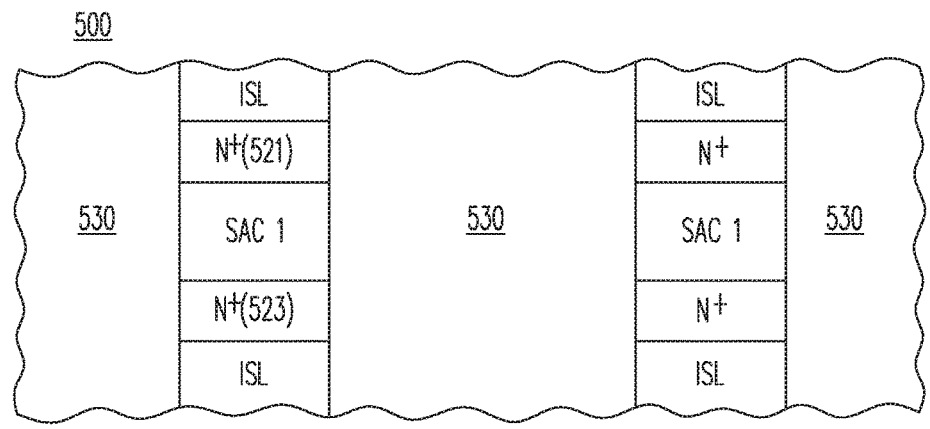
Figures 2, 5H:
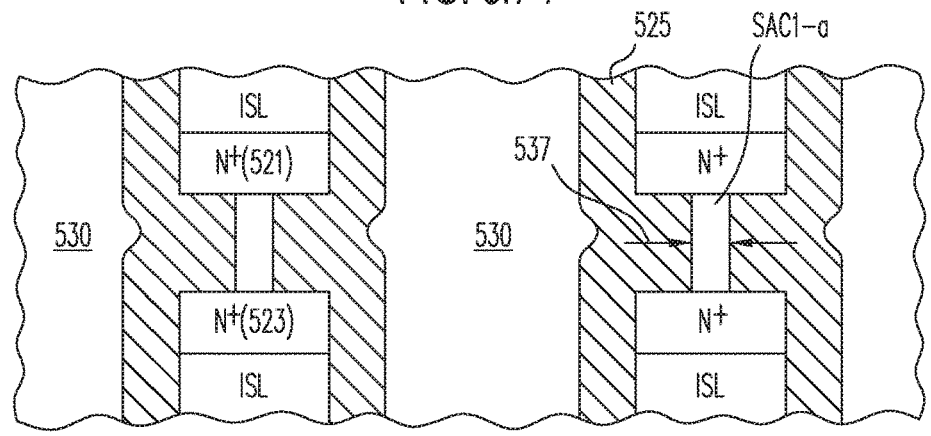
Figures 3, 5H:
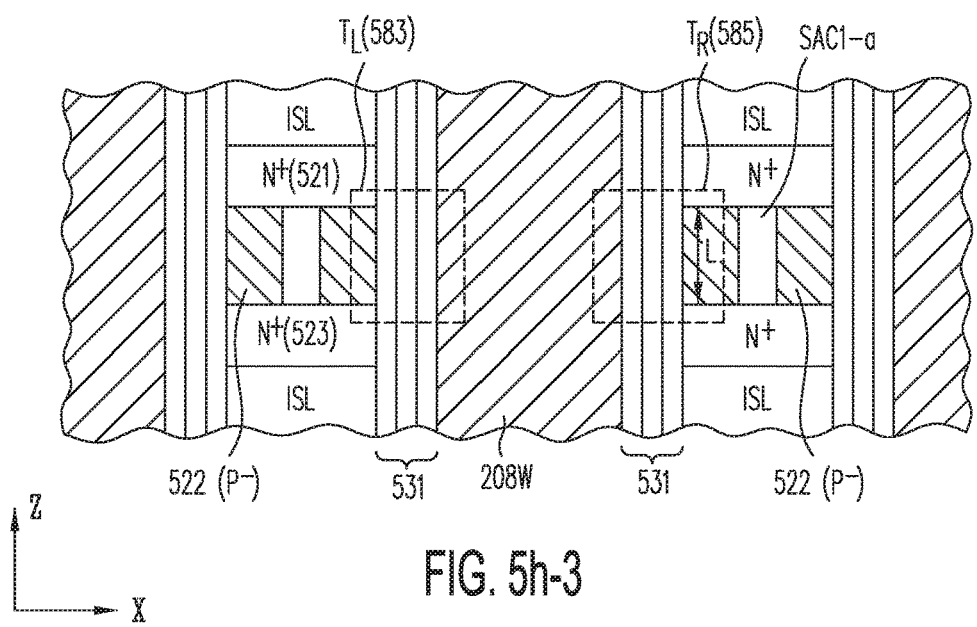

The process sequences presented above are by way of examples, it being understood that other process sequences or deviations may also be used within the scope of the present invention. For example, instead of fully excavating the SAC1 material to form the cavities for subsequently forming sublayers 522, an alternative approach is to selectively etch the SAC1 material in a controlled sideway etch to form recesses inward from one or both side edges of the stack, leaving a narrowed-down spine of the SAC1 material that mechanically supports the separation between N+ sublayers 523 and N+ sublayers 521, then simultaneously filling all planes with the channel material in first sublayer 522, followed by removing the channel material from the sidewalls of trenches 530, resulting in P⁻ sublayers 522-0 to 522-7 residing in the recesses that are now isolated from each other by the remaining spine of the SAC1 material, followed by the next process steps to form charge-trapping material 531 and conductors 208W. These steps are illustrated in FIG. 5h-1 through FIG. 5h-3. Specifically, FIG. 5h-1 shows cross section 500 in the Z-X plane, showing active strips immediately prior to etching the sacrificial SAC1 material between N⁺ sublayers 521 and 522, in accordance with one embodiment of the present invention. FIG. 5h-2 shows cross section 500 of FIG. 5h-1, after sideway selective etching of the SAC1 material (along the direction indicated by reference numeral 537) to form selective support spines out of the SAC1 material (e.g., spine SAC1-a), followed by filling the recesses with P⁻ doped channel material (e.g., polysilicon) and over the sidewalls of the active strips, according to one embodiment of the present invention. FIG. 5h-3 shows cross section 500 of FIG. 5h-2, after removal of the P⁻ material from areas 525 along the sidewalls of the active strips, while leaving P⁻ sublayer 522 in the recesses, in accordance with one embodiment of the present invention. FIG. 5h-3 also shows removal of isolation materials from trenches 530, formation of charge-trapping layer 531 and local word lines 208-W, thereby forming transistors $T_L$585 and $T_R$585 on opposite sides of the active strips.

In FIGS. 5a, 5b and 5c, N⁺ sublayers 521-0 to 521-7 and 523-0 to 523-7 can all be formed in a single deposition step under another process ("Process Flow B"). Under Process Flow B, third sacrificial layer (a dielectric material SAC3, not shown) may be deposited in place of N⁺ sublayers 521 and 523. Then, similar to the way the SAC1 material was etched to form cavities to be filled by P⁻ polysilicon, the SAC3 material may be etched away to form cavities to be filled by N⁺ doped polysilicon simultaneously for all planes in semiconductor 500. The SAC3 material should have a high etch selectivity to the ISL, SAC1 and SAC2 materials already in place. An anisotropic etch (ending with a brief isotropic etch to remove thin polysilicon stringers) to remove the N⁺ polysilicon in trenches 530 that would otherwise be shorting vertically adjacent N+ source and N+ drain sublayers. Under Process Flow B, the SAC3 material from all sublayers 521 and 523 of active layers are preferably etched simultaneously to cavities and then filled by N⁺ polysilicon, so that all N⁺ sublayers 521 and 523 can be annealed in a single high-temperature rapid anneal step. Only after the anneal step, cavities 537 (FIGS. 5e and 5g) are formed by etching the SAC1 material and then filling the resulting cavities with P⁻ polysilicon to form P⁻ sublayer 522. Under Process Flow B, all active layers 502-0 to 502-7 may preferably be connected to the substrate circuitry 206-0 and 206-1 from the top of semiconductor structure 500 through a "stair-step via" scheme, instead of the buried contacts 205-0, 205-1 of FIG. 5b.

Source-Drain Leakage in Long NOR Strings

In long NOR strings, the current of the one accessed TFT in a read operation has to compete with the cumulative subthreshold leakage currents from the thousand or more parallel unselected TFTs. Similarly, pre-charged strip capacitor C has to contend with charge leakage not just of one transistor (as in a DRAM circuit) but the charge leakage through the thousand or more transistors in the NOR string. That charge leakage reduces substantially the charge retention time on C to perhaps a few hundred microseconds, requiring counter measures to reduce or neutralize such leakage, as discussed below. However, as will be discussed below, the leakage for a thousand or so transistors only comes into play during read operations. During program, program-inhibit or erase operations, source sublayer 221 and bit line sublayer 223 are preferably held at the same voltage, therefore transistor leakage between the two sublayers is insignificant (the leakage of charge from capacitor C during program, program-inhibit or erase operations is primarily to the substrate through the substrate selection circuitry, which is formed in single-crystal or epitaxial silicon where transistor leakage is very small). For a read operation, even a relatively short 100-microsecond retention time of charge on the source and bit line capacitors is ample time to complete the sub-100 nanosecond read operation (see below) of the TFTs of the present invention. A key difference between a TFT in a NOR string of the present invention and a DRAM cell is that the former is a non-volatile memory transistor, so that even if parasitic capacitor C is completely discharged the information stored in the selected TFT is not lost from the charge storage material (i.e., charge-trapping layers 231 in embodiments EMB-1, EMB-2 and EMB-3), unlike a DRAM cell where it is forever lost unless refreshed. Capacitor C is used solely to temporarily hold the pre-charge voltage on N⁺ sublayers 221 and 223 at one of voltages $V_{ss}$, $V_{bl}$, $V_{progr}$, $V_{inhibit}$, or $V_{erase}$; C is not used to store actual data for any of the non-volatile TFTs in the string. Pre-charge transistor 303, controlled by word line 151n (208-CHG) (FIG. 3a) is activated momentarily immediately preceding read, program, program-inhibit or erase operations to transfer through connections 270 the voltage $V_{bl}$ from the substrate circuitry (not shown) to capacitor C of sublayer 221. For example, voltage $V_{bl}$ can be set at ~0V to pre-charge N⁺ sublayer 221 to a virtual ground voltage ~0V during read, or to pre-charge both N⁺ sublayers 221 and 223 to between ~5V and ~10V during program inhibit. The value of cumulative capacitors C may be increased by lengthening the active string to accommodate thousands more TFTs along each side of the string, correspondingly increasing the retention time of pre-charge voltage $V_{ss}$ on N⁺ sublayer 221. However, a longer NOR string suffers from an increased resistance R as well as higher leakage current between N⁺ sublayer 221 and N⁺ sublayer 223; such leakage current may interfere with the sensed current when reading the one TFT being addressed with all other TFT's in their "off" (but somewhat leaky) state. To speed up the pre-charging of the capacitance C of a long active strip, several pre-charge TFTs 303 may be provided spaced apart along either side of the active strip (e.g., once every 128, 256 or more TFTs).

Non-Volatile Memory TFTs with Highly Scaled Short Channels

Ultra-thin diffusion-blocking layer 521-d enables a highly scaled channel length in non-volatile memory TFTs ("ultra-short channel TFTs"; e.g., the channel length L in TFT $T_R$ 585 of FIG. 5f) by reducing the thickness of the SAC1 material. For example, the highly scaled channel length may be 40 nanometers or less, while the thickness of the SAC1 material standing in place for P⁻ sublayer 522 may be reduced to 20 nanometers or less. TFT channel scaling is enhanced by having extremely thin P⁻ sublayer 522, in the range of 3-10 nanometers, sufficient to support the TFT channel inversion layer but thin enough to be depleted through its entire depth under appropriate control gate voltage. A read operation for an ultra-short channel TFT requires P⁻ sublayer 522 to be relatively heavily P⁻ doped (e.g., between $1\times10^{17}/cm^3$ and $1\times10^{18}/cm^3$). A shorter channel length results in a higher read current at a lower drain voltage, thus reducing power dissipation for read operations.

A highly scaled channel has the added benefit of a lesser total thickness in the active layers, thus making the easier to etch from the top active layer to the bottom active layer. Ultra-short channel TFTs also can be erased through a lateral-field-assisted charge-hopping and tunnel-erase mechanism, which is discussed below in conjunction with FIG. 7.

Exemplary operations for the NOR strings of the present invention are described next.

Read Operations.

Figure 3B:
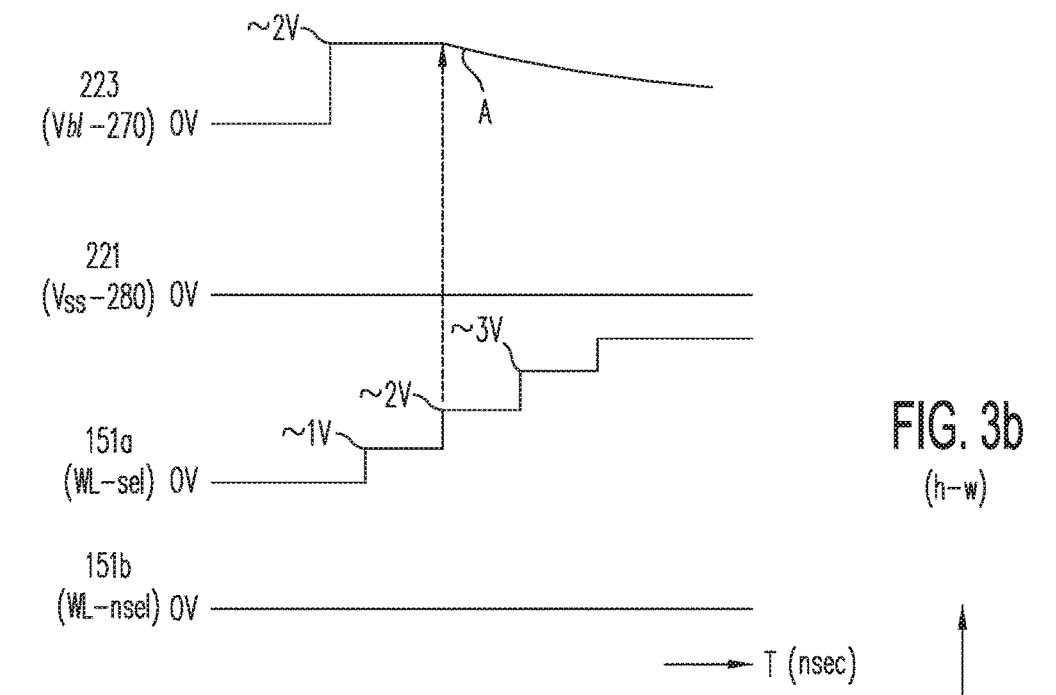
FIG. 3b shows exemplary waveforms of the source, drain, selected word line and non-selected word line voltages for the circuit of FIG. 3a during a read operation, in which N⁺ sublayer 221 is applied source voltage $V_{ss}$ through hard-wired connections 280.
Figure 3C:
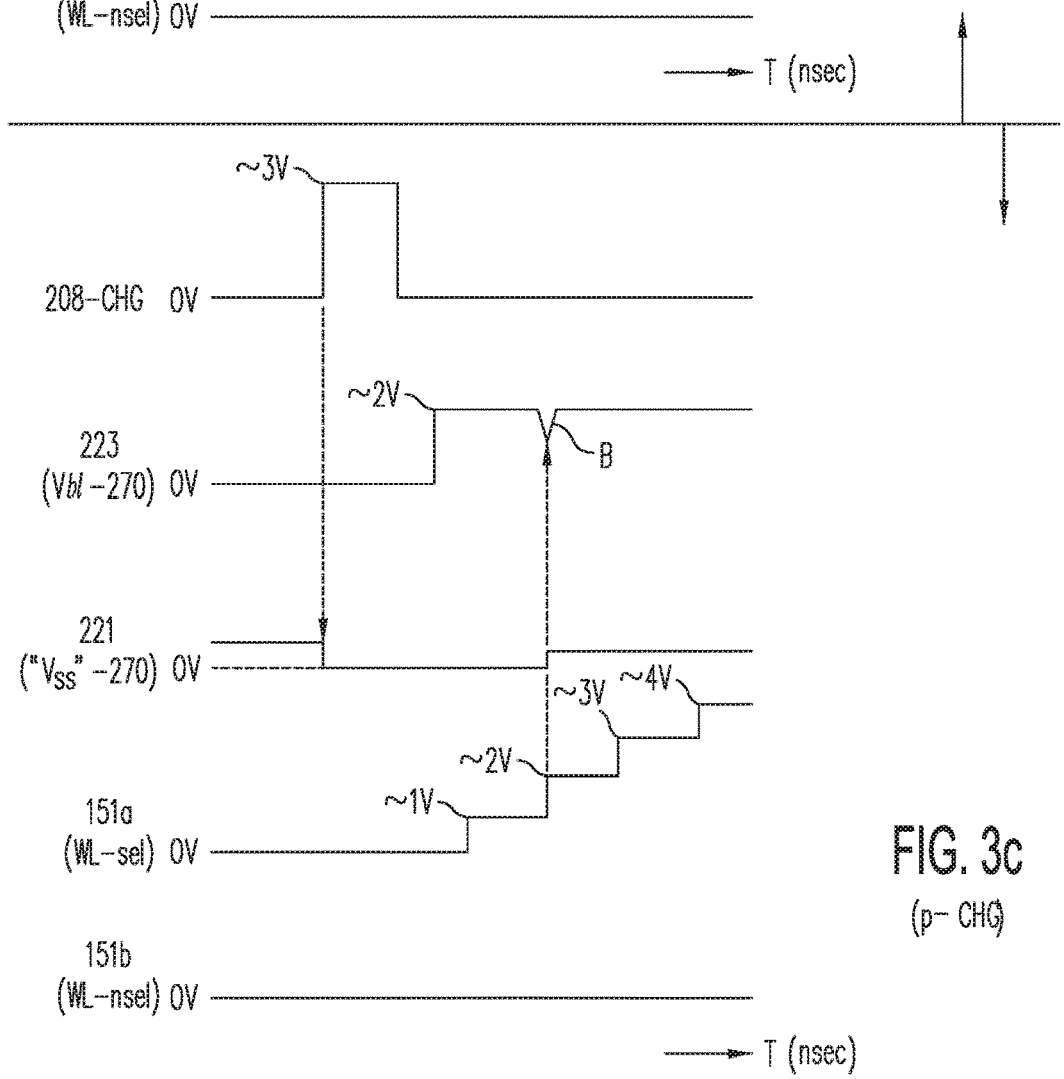
FIG. 3c shows exemplary waveforms for the source, drain, selected word line, non-selected word line and pre-charge word line voltages for the circuit of FIG. 3a during a read operation, in which N⁺ sublayer 221 provides a semi-floating source region after being momentarily pre-charged to $V_{ss}$ (~0V) by pre-charge word line 208-CHG, with the non-selected word line 151b being held at ~0V.

To read any one TFT among the many TFTs along a NOR string, the TFTs on both sides of an active strip are initially set to a non-conducting or "off" state, so that all global and local word lines in a selected block are initially held at 0 volts. As shown in FIG. 3a, the addressed NOR string (e.g. NOR string 202-1) can either share a sensing circuit among several NOR strings through a decoding circuitry in substrate 201, or each NOR string may be directly connected to a dedicated sensing circuit, so that many other addressed NOR strings sharing the same plane can be sensed in parallel. Each addressed NOR string has its source line (i.e., $N^+$ sublayer 221) initially set at $V_{ss}$~0V. (To simplify this discussion, in the context of FIG. 3a-3c, the $N^+$ sublayers 221 and 223 are referred to as source line 221 and bit line or drain line 223, respectively). In an implementation using a hard-wired source connection, voltage $V_{ss}$ is supplied from substrate 201 to source line 221 through hard-wired connections 280. FIG. 3b illustrates a typical read cycle for a NOR string with hard-wired source voltage $V_{ss}$. Initially, all word lines are at 0V and the voltage on source line 221 is held at 0V through connections 280. The voltage on bit line 223 is then raised to $V_{bl}$~0.5 V to 2V, supplied through connections 270 from the substrate, and is also the voltage at an input to a sense amplifier ($V_{SA}$). After bit line 223 is raised to $V_{bl}$, the selected word line (word line 151a; labeled "WL-sel") is ramped up (shown in FIG. 3b as incremental stepped voltages) while all other non-selected word lines (word line 151b; labeled "WL-nsel") remain in their "off" state (0V). When the voltage on the selected gate electrode exceeds the threshold voltage programmed into the selected TFT (e.g. transistor 152-1 on strip 202-1) it begins conducting, and thus begins to discharge voltage $V_{bl}$ (event A in FIG. 3b) which is detected by the sense amplifier connected to addressed string 202-1.

In embodiments EMB-1, EMB-2 and EMB-3 employing pre-charging of parasitic cumulative capacitance C (i.e., the total capacitance of all capacitors labeled 360 in each NOR string in FIG. 3a) to a "virtual $V_{ss}$" voltage, pre-charge TFT 303 (FIG. 3b) shares source line 221 and bit line or drain line 223 of the NOR string (pre-charge TFT 303 may have the same construction as the memory TFTs, but is not used as a memory transistor and may have a wider channel to provide a greater current during the pre-charge pulse) and has its drain line 223 connected through connections 270 to bit line voltage $V_{bl}$ in substrate 201. In a typical pre-charge/read cycle (see FIG. 3c) $V_{bl}$ is initially set at 0V. Pre-charge word line 208-CHG of TFT 303 is momentarily raised to around 3V to transfer $V_{bl}$~0V from bit line 223 to source line 221 to establish a "virtual $V_{ss}$" voltage ~0V on source line 221. Following the pre-charge pulse, bit line 223 is set to around $V_{bl}$~2V through bit line connection 270. The $V_{bl}$ voltage is also the voltage at the sense amplifier for the addressed NOR string. The one selected global word line and all its associated vertical local word lines 151a (labeled "WL-sel") (i.e. slice 114 of FIG. 1a-2) are ramped from 0V to typically 3V-4V (shown as stepped voltages in FIG. 3d) or higher if a larger window of operation is desired between the erased and programmed $V_{th}$ voltages, while all other global word lines and their local word lines in the block are in their "off" state (0V). If the selected TFT is in an erased state (i.e., $V_{th}=V_{erase}$~1 volt), bit line voltage $V_{bl}$ will begin to discharge toward source voltage $V_{ss}$ when its word line voltage rises above ~1V. If the selected TFT has been programmed to $V_{th}$~2V, the bit line voltage will begin discharging only when its word line rises above ~2V. A voltage dip in voltage $V_{bl}$ (event B in FIG. 3c) is detected at the sense amplifier when the charge stored on bit line 223 begins to discharge through the selected TFT towards voltage $V_{ss}$ on source line 221. All non-selected word lines 151b (labeled "WL-nsel") in the NOR string are "off" at 0V, even though they may each contribute a sub-threshold leakage current between $N^+$ sublayer 223 and $N^+$ sublayer 221. Accordingly, it is important that the read operation follows closely the pre-charge pulse before this leakage current begins to seriously degrade the $V_{ss}$ charge on capacitors C of the NOR string. The pre-charge phase typically has a duration between 1 and 10 nanoseconds, depending on the magnitude of distributed capacitance C and distributed resistance R of $N^+$ sublayers 221 and 223, and the pre-charge current supplied through pre-charge TFTs 303. The pre-charge can be sped up by augmenting the current through pre-charge TFTs 303 using some of the memory TFTs along the NOR string to serve temporarily as pre-charge transistors, although care must be taken to avoid driving their gate voltages high enough during the pre-charge pulse as to cause a disturb condition on their programmed threshold voltage.

All TFTs 152-0 to 152-3 within slice 114 (FIG. 1a-2) experience the same ramping voltage on their local word line 151a (WL-sel), and therefore TFTs on different active strips on different planes can be read simultaneously (i.e., in parallel) during a single read operation, provided that the active strips on different active layers 202-0 to 202-7 are all pre-charged (either individually or at the same time) when the read operation begins from their respective substrate circuitry through their pre-charge TFTs 303, and provided that the active strips on the different active layers have dedicated sense amplifiers connected through individual connections 270. This slice-oriented read operation increases the read bandwidth by a factor corresponding to the number of planes in memory block 100.

Multibit (MLC), Archival, and Analog Thin-Film Transistor Strings

In an embodiment where MLC is used (i.e., Multi-Level cell, in which more than one bit of information is stored in a TFT), the addressed TFT in a NOR string may be programmed to any of several threshold voltages (e.g., 1V (for an erased state), 2V, 3V or 4V, for the four states representing two bits of data). The addressed global word line and its local word lines can be raised in incremental voltage steps until conduction in the selected TFTs is detected by the respective sense amplifiers. Alternatively, a single word line voltage can be applied (e.g., ~5V), and the rate of discharge of voltage $V_{bl}$ can be compared with the rate of discharge of each of several programmable reference voltages representative of the four voltage states of the two binary bits stored on the TFT. This approach can be extended to store eight states (for 3-bit MLC TFTs), sixteen states or a continuum of states, which effectively provides analog storage. The programmable reference voltages are stored on reference NOR strings, typically in the same block, preferably located in the same plane as the selected NOR string to best track manufacturing variations among active strips on different planes. For MLC applications, more than one programmable reference NOR string may be provided to detect each of the programmed states. For example, if 2-bit MLC is used, three reference NOR strings, one for each intermediate programmable threshold voltage (e.g. 1.5V, 2.5V, 3.5 V in the example above) may be used. Since there may be thousands of active strips on each plane in a block, the programmable reference NOR strings can be repeated, for example, with one set shared between every 8 or more NOR strings in a block.

Alternatively, the reference NOR string can be programmed to a first threshold voltage (e.g., ~1.5V that is slightly above the erased voltage of ~1V), so that the additional ~2.5V and ~3.5 V reference programmed voltage levels can be achieved by pre-charging the virtual source voltage $V_{ss}$ (source line 221) of the reference NOR string with a stepped or ramped voltage starting from ~0V and raising it to ~4V, while correspondingly increasing the voltage $V_{bl}$ on the reference NOR string bit line 223 to be ~0.5 V higher than the $V_{ss}$ voltage. All the while the word line voltage applied to the reference TFT and the word line voltage applied to the memory TFT being read are the same, as they both are driven by the same global word line. This "on the fly" setting of the various reference voltages is made possible because each reference NOR string can be readily set to its individual gate-source voltage, independent of all other NOR strings in the block.

The flexibility for setting the reference voltages on a reference NOR string by adjusting its $V_{ss}$, and $V_{bl}$ voltages, rather than by actually programming the reference TFT to one or another of the distinct threshold voltages, enables storing of a continuum of voltages, providing analog storage on each storage TFT of a NOR string. As an example, during programming, the reference NOR string can be set to a target threshold voltage of 2.2V, when programming the storage TFT to ~2.2 V. Then during reading the reference string's voltages $V_{ss}$ and $V_{bl}$ are ramped in a sweep starting at ~0V and ending at ~4V, with the word lines for both the reference TFT and the storage TFT at ~4V. So long as the ramping reference voltage is below 2.2V, the signal from the reference TFT is stronger than that of the programmed memory TFT. When the reference TFT has ramped past 2.2V, the signal from the reference TFT becomes weaker than the signal from the storage TFT, resulting in the flipping of the output signal polarity from the differential sense amplifier, indicating 2.2V as the stored value of the programmed TFT.

The NOR strings of the present invention can be employed for archival storage for data that changes rarely. Archival storage requires the lowest cost-per-bit possible, therefore selected archival blocks of the NOR string of the current invention can be programmed to store, for example, 1.5, 2, 3, 4 or more bits per TFT. For example, storing 4 bits per TFT requires 16 programmed voltages between ~0.5V and ~4V. The corresponding TFT in the reference NOR string can be programmed at ~0.5V, while programming the storage TFT to the target threshold. During a read operation, the reference string's source and drain voltages $V_{ss}$ and $V_{bl}$ are stepped up in ~0.25V increments until the output polarity of the sense amplifier flips, which occurs when the signal from the reference NOR string becomes weaker than the signal from the storage or programmed TFT. Strong ECC at the system controller can correct any of the intermediate programmed states that have drifted during long storage or after extensive number of reads.

When the NOR strings in a block suffer from excessive source to drain leakage even when all TFTs of the NOR string are turned off, such leakage can be substantially neutralized by designation leakage reference strings in which the leakage current of the reference string is modulated by adjusting the voltages on its shared source $V_{ss}$ and shared drain $V_{bl}$ until its leakage substantially matches the leakage currents of the non-reference NOR strings in the same block.

Revolving Reference NOR String Address Locations to Extend Cycle Endurance.

In applications requiring a large number of write/erase operations, the threshold-voltage window of operation for the TFTs in the NOR strings may drift with cycling, away from the threshold-voltage window that is programmed into the TFTs of the reference NOR strings at the device's beginning of life. The growing discrepancy between TFTs on the reference NOR strings and TFTs on the addressed memory NOR strings over time, if left unattended, can defeat the purpose of having reference NOR strings. To overcome this drift, reference NOR strings in a block need not always be at the same physical address, and need not be permanently programmed for the entire life of the device. Since the programmable reference NOR strings are practically identical to the memory NOR strings sharing the same plane in a block, reference NOR strings need not be dedicated for that purpose in any memory array block. In fact, any one of the memory NOR strings can be set aside as a programmable reference NOR string. In fact, the physical address locations of the programmable reference NOR strings can be rotated periodically (e.g. changed once every 100 times the block is erased) among the sea of memory NOR strings, so as to level out the performance degradation of memory NOR strings and reference NOR strings as a result of extensive program/erase cycles.

According to the current invention, any NOR string can be rotated periodically to be designated as a programmable reference NOR string, and its address location may be stored inside or outside the addressed block. The stored address may be retrieved by the system controller when reading the NOR string. Under this scheme, rotation of reference NOR strings can be done either randomly (e.g., using a random number generator to designate new addresses), or systematically among any of the active memory NOR strings. Programming of newly designated reference NOR strings can be done as part of the erase sequence when all TFTs on a slice or a block are erased together, to be followed by setting anew the reference voltages on the newly designated set of reference NOR strings. In this manner, all active memory NOR strings and all reference NOR strings in a block drift statistically more or less in tandem through extensive cycling.

Programmable Reference Slices.

Figure 6A:
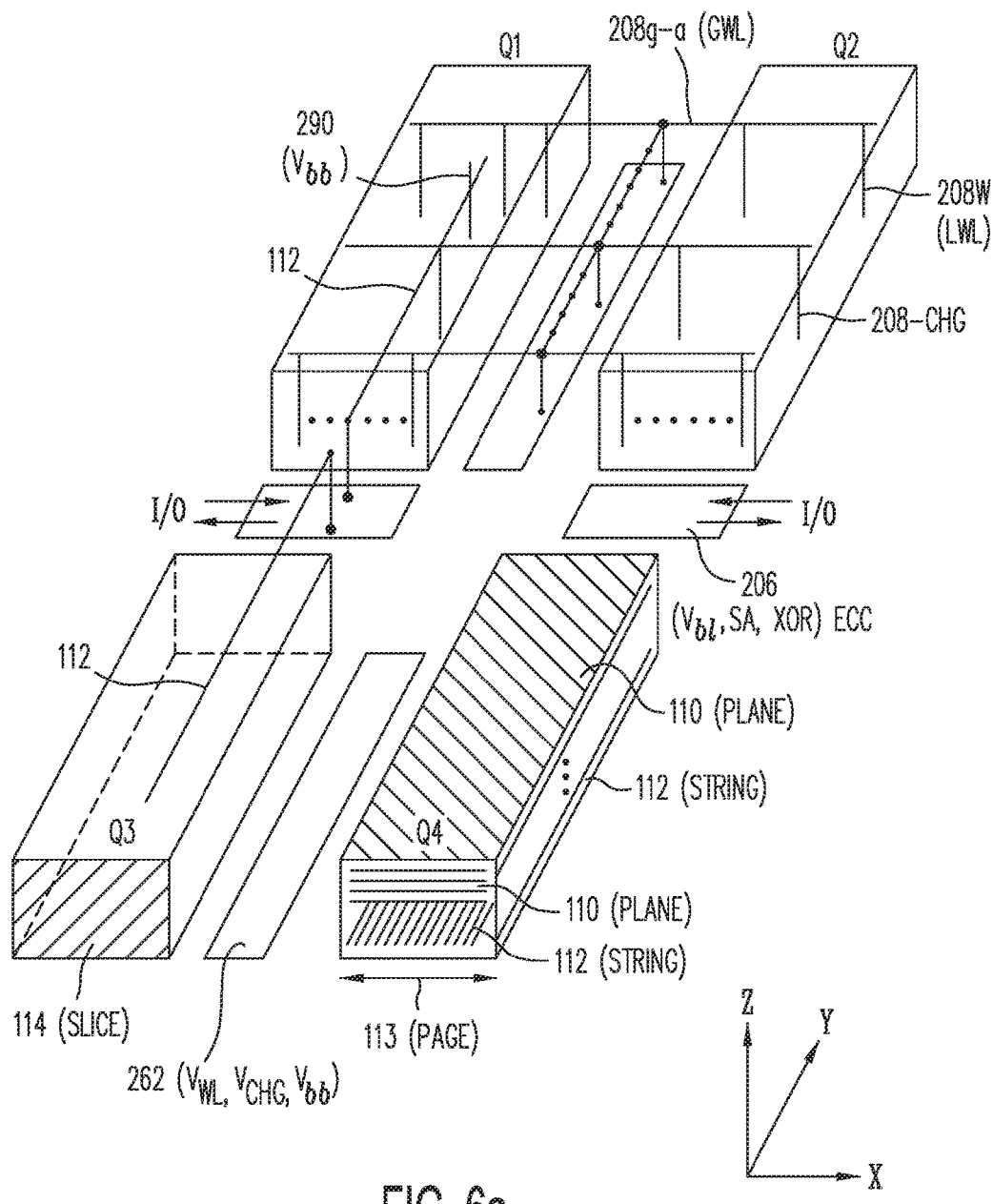
FIG. 6a shows semiconductor structure 600, which is a three-dimensional representation of a memory array organized into quadrants Q1-Q4; in each quadrant, (i) numerous NOR strings are each formed in an active strip extended along the Y-direction (e.g., NOR string 112), (ii) pages extending along the X-direction (e.g., page 113), each page consisting of one TFT from each NOR string at a corresponding Y-position, the NOR strings in the page being of the same corresponding Z-position (i.e., of the same active layer); (iii) slices extending in both the X- and Z-directions (e.g., slice 114), with each slice consisting of the pages of the same corresponding Y-position, one page from each of the planes, and (iv) planes extending along both the X- and Y-directions (e.g., plane 110), each plane consisting of all pages at a given Z-position (i.e., of the same active layer).

In some embodiments of the present invention, a block may be partitioned into four equal-size quadrants, as illustrated in FIG. 6a. FIG. 6a show semiconductor structure 600, which is a three-dimensional representation of a memory array organized into quadrants Q1-Q4. In each quadrant, (i) numerous NOR strings are each formed in active strips extending along the Y-direction (e.g., NOR string 112), (ii) pages extending along the X-direction (e.g., page 113), each page consisting of one TFT from each NOR string at a corresponding Y-position, the NOR strings in the page being of the same corresponding Z-position (i.e., of the same active layer); (iii) slices extending in both the X- and Z-directions (e.g., slice 114), with each slice consisting of the pages of the same corresponding Y-position, one page from each of the planes, and (iv) planes extending along both the X- and Y-directions (e.g., plane 110), each plane consisting of all pages at a given Z-position (i.e., of the same active layer).

Figure 6B:
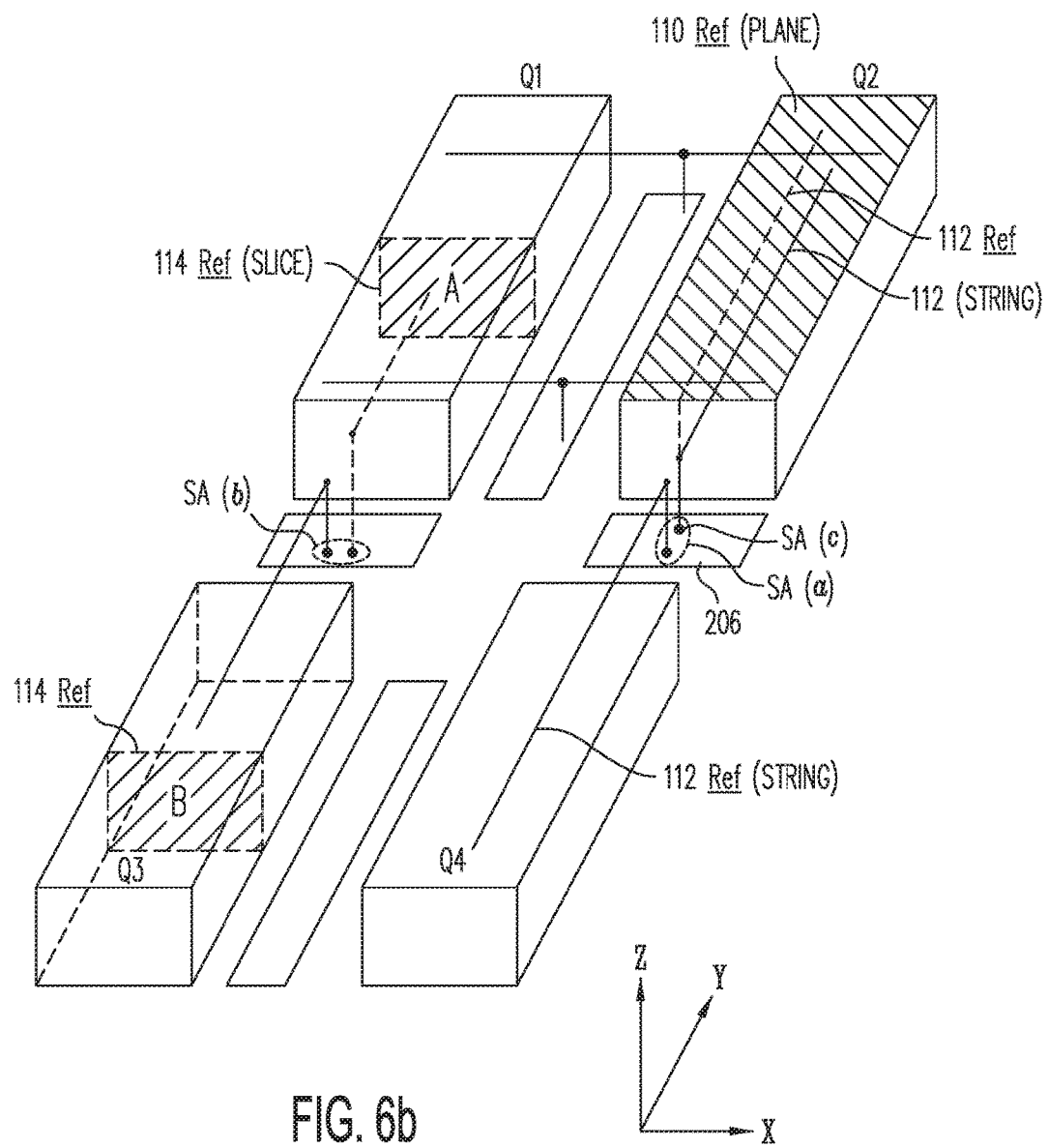
FIG. 6b shows structure 600 of FIG. 6a, showing TFTs in programmable reference string 112-Ref in quadrant Q4 and TFTs in NOR string 112 in quadrant Q2 coupled to sense amplifiers SA(a), Q2 and Q4 being "mirror image quadrants"
Figure 6C:
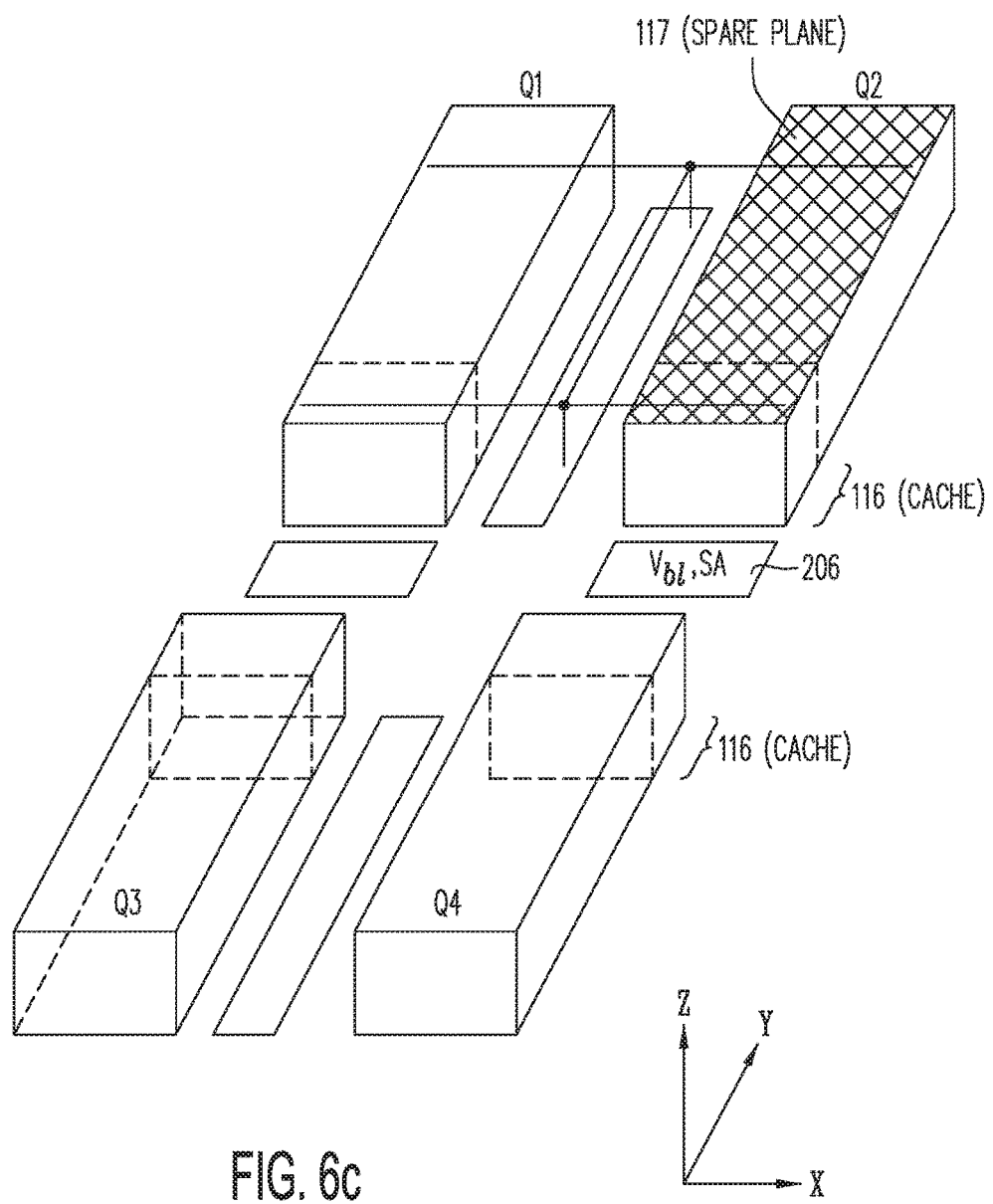
FIG. 6c shows structure 600 of FIG. 6a, showing slices 116 being used as a high speed cache because of their close proximity to their sense amplifiers and voltage sources 206.

FIG. 6b shows structure 600 of FIG. 6a, showing TFTs in programmable reference NOR string 112-Ref in quadrant Q4 and TFTs in NOR string 112 in quadrant Q2 coupled to sense amplifiers SA(a), Q2 and Q4 being "mirror image quadrants." FIG. 6b also shows (i) programmable reference slice 114-Ref (indicated by area B) in quadrant Q3 similarly providing corresponding reference TFTs for slice 114 in mirror image quadrant Q1, sharing sense amplifiers SA(b), and (ii) programmable reference plane 110-Ref in quadrant Q2 providing corresponding reference TFTs to plane 110 in mirror image quadrant Q1, sharing sense amplifiers SA(c), and also providing corresponding reference TFTs for NOR strings in the same quadrant (e.g., NOR string 112).

As shown in FIG. 6b, programmable reference NOR strings 112Ref may be provided in each quadrant to provide reference voltages for the memory NOR strings on the same plane in the same quadrant, in the manner already discussed above. Alternatively, programmable reference slices (e.g., reference slice 114Ref) are provided on mirror-image quadrants for corresponding memory slices. For example, when reading a memory slice in quadrant Q1, programmed reference slice 114Ref (area B) in quadrant Q3 is simultaneously presented to sense amplifiers 206 that are shared between quadrants Q1 and Q3. Similarly, when reading a memory slice in quadrant Q3, reference slice 114Ref (area A) of quadrant Q1 is presented to the shared sense amplifiers 206. There can be more than one reference slice distributed along the length of NOR strings 112 to partially accommodate mismatched in RC delay between the slice being read and its reference slice. Alternatively, the system controller can calculate and apply a time delay between the global word line of the addressed slice and that of the reference slice, based on their respective physical locations along their respective NOR strings. Where the number of planes is a high number (e.g. 8 or more planes), one or more planes can be added at the top of the block to serve either as a redundant plane (i.e., to substitute for any defective plane) in the quadrant, or as programmable reference pages, providing reference threshold voltages for the addressed pages sharing the same global word line conductor 208g-a. The sense amplifier at the end of each NOR string receives the read signal from the addressed page at the same time as it receives the signal from the reference page at the top of the block, since both pages are activated by the same global word line.

In one embodiment, each memory block consists of two halves, e.g., quadrants Q1 and Q2 constitute an "upper half" and quadrants Q3 and Q4 constitute a "lower half." In this example, each quadrant has 16 planes, 4096 (4K) NOR strings in each plane, and 1024 (1K) TFTs in each NOR string. It is customary to use the unit "K" which is 1024. Adjacent quadrants Q1 and Q2 share 1K global word lines (e.g., global word line 208g-a) driving 2048 (2K) local word lines 208W per quadrant (i.e., one local word line for each pair of TFTs from two adjacent NOR strings). 4K TFTs from quadrant Q1 and 4K TFTs from quadrant Q2 form an 8K-bit page of TFTs. 16 pages form a 128K-bit slice, and 1K slices are provided in a half-block, thus providing 256 Mbits of total storage per block. (Here, 1 Mbits is 1K×1 Kbits.) The 4K strings in each plane of quadrants Q2 and Q4 share substrate circuitry 206, including voltage sources for voltage $V_{bl}$ and sense amplifiers (SA). Also included in each quadrant are redundant NOR strings that are used as spares to replace faulty NOR strings, as well to store quadrant parameters such as program/erase cycle count, quadrant defect map and quadrant ECC. Such system data are accessible to a system controller. For blocks with high plane counts, it may be desirable to add one or more planes to each block as spares for replacing a defective plane.

Programmable Reference Planes, Spare Planes

High capacity storage systems based on arrays of the NOR strings of the present invention require a dedicated intelligent high-speed system controller to manage the full potential for error-free massively parallel erase, program and program-inhibit, and read operations that may span thousands of "chips" including millions of memory blocks. To achieve the requisite high speed, off-chip system controllers typically rely on state machines or dedicated logic functions implemented in the memory circuits. As well, each memory circuit stores system parameters and information related to the files stored in the memory circuit. Such system information is typically accessible to the system controller, but not accessible by the user. It is advantageous for the system controller to quickly read the memory circuit-related information. For a binary memory system in which 1 bit is stored per TFT (e.g., in the block organization of FIG. 6a), the storage capacity in each block accessible to the user is given by 4 quadrants×16 planes per block×4K NOR strings per plane per quadrant×1K TFTs per NOR string, which equals 256M bits.

A block under this organization (i.e., 256 Megabits) provides 2K slices. A terabit memory circuit may be provided by including 4K blocks.

As shown in FIGS. 6a and 6b, the TFTs in quadrants Q2 and Q4 share voltage source $V_{bl}$, sense amplifiers SA, data registers, XOR gates and input/output (I/O) terminals to and from substrate circuitry 206. According to one organization, FIG. 6a shows NOR strings 112, quarter-planes 110, half-slices 114, and half-pages 113. Also shown are pillars 290 supplying back-bias voltage $V_{bb}$ from the substrate. FIG. 6b shows examples of locations of reference strings 112 (Ref), reference slices 114 (Ref) and reference planes 110 (Ref). In the case of reference strings, reference string 112 (Ref) of quadrant Q4 can serve as a reference string to NOR string 112 on the same plane in quadrant Q2, the two NOR strings being presented to a shared differential sense amplifier SA in circuitry 206. Similarly, reference slice 114 Ref (area A) in quadrant Q1 can serve as reference for a slice in quadrant Q3, while a reference slice B in quadrant Q1 can serve as reference for slices in quadrant Q3, again sharing differential sense amplifiers SA provided between quadrants Q1 and Q3. Global word lines 208g-a are connected to local word lines 208W and local pre-charge word lines 208-CHG. Substrate circuitry and input/output channels 206 are shared between TFTs in quadrants Q2 and Q4. Under this arrangement, their physical locations allow cutting by half the resistance and capacitance of NOR strings 112. Similarly, global word line drivers 262 are shared between quadrants Q1 and Q2 to cut by half the resistance and capacitance of the global word lines, and pillars 290 (optional) connect P⁻ sublayers of NOR strings 112 to the substrate voltage.

Since silicon real estate on an integrated circuit is costly, rather than adding reference strings or reference pages to each plane, it may be advantageous to have some or all reference strings or reference pages provided in one or more additional planes. The additional plane or planes consume minimal additional silicon real-estate and the reference plane has the advantage that the addressed global word line 208g-a accesses a reference page at the same time it accesses an addressed page on any of the planes at the same address location along the active strings in the same quadrant. For example, in FIG. 6b, reference string 112Ref, which is shown as dashed line in quadrant Q2, resides in reference plane 110Ref in this example. NOR string 112Ref tracks memory NOR string 112 being selected for read in the same quadrant and the read signals from the two NOR strings reach the differential sense amplifiers SA for that quadrant practically at the same time. Although reference plane 110Ref is shown in FIG. 6b as being provided in the top plane, any plane in the quadrant can be designated a reference plane. In fact, it is not be necessary for every NOR string on the reference plane to be a reference string: e.g., every one in eight NOR strings can be designated as a reference NOR string that is shared by eight NOR strings in other planes. The remainder of NOR strings in the reference plane may serve as spare strings to substitute for defective strings on the other planes in the block.

Alternatively, one or more additional planes (e.g., plane 117 in FIG. 6c) can be set aside to serve as spare memory resources to substitute for defective NOR strings, defective pages or defective planes in the same quadrant.

As related to electrically programmable reference strings, slices, pages or planes, once set in their designated threshold voltage states, care must be exercised at all times to inhibit their inadvertent programming or erasing during programming, erasing or reading the non-reference strings.

A very large storage system of 1 petabyte ($8\times10^{15}$ bits) requires 8,000 1-terabit memory circuits ("chips"), involving 32M blocks or 64G slices. (1 Gbits is 1K×1 Mbits). This is a large amount of data to be written (i.e. programmed) or read. Therefore, it is advantageous to be able to program and read in parallel a great many blocks, slices or pages on numerous chips at once, and to do so with minimum power dissipation at the system level. It is also advantageous for a terabit capacity memory chip to have many input/output channels such that requested data can be streamed in and out in parallel from and to a large number of blocks. The time required to track down the physical location of the most current version of any given stored file or data set would require a significant amount of time for the system controller to maintain, such as the translation the logical address into the most current physical addresses. The translation between logical to physical addresses would require, for example, a large centralized look-up FAT (file allocation table) to access the right slice in the right block on the right chip. Such a search could add considerable read latency (e.g., in the range of 50-100 microseconds) which would defeat a fast read access goal (e.g., under 100 nanoseconds). Accordingly, one aspect of the present invention significantly reduces the search time by introducing a system-wide parallel on-chip rapid file searches, so as to dramatically reduce the latency associated with a centralized large FAT, as described below.

Fast Reads: Pipelined Streaming and Random Access

At system initiation of a virgin multi-chip storage system of the present invention, all chips are erased and reference strings, reference slices or reference planes are programmed to their reference states. The system controller designates as cache storage the memory slices (e.g., slice 116 in FIG. 6c) that are physically closest to the sense amplifiers and voltage sources 206. Because of the RC delays along the length of each NOR string, the TFTs in each string that are physically closest to substrate circuitry 206 will have their voltages $V_{bl}$ established a few nanoseconds sooner than the TFTs furthest from substrate circuitry 206. For example, the first ~50 slices or so (shown as slice 116 in FIG. 6c) out of the 1K slices in each quadrant have the shortest latency and can be designated as a cache memory or storage, to be used for storing quadrant operational parameters, as well as information regarding the files or data set stored in the quadrant. For example, each memory page (2×4 Kbits) or slice (2×4 Kbits×16=128 Kbits) written into the upper half-block (i.e., quadrants Q1 and Q2) can have a unique identifier number assigned to it by the system controller, together with an index number that identifies the type of file that is stored.

The cache storage may be used to store on-chip resource management data, such as file management data. A file can be identified, for example, as "hot file" (i.e., associated with a large number of accesses, or a "high cycle count"), "cold file" (i.e., has not been altered for a long time, and is ready to be moved to slower storage or archival memory at a future time), "delete file" (i.e., ready for future erase in background mode), "defective file" (i.e., to be skipped over), or "substitute file" (i.e., replacing a defective file). Also included in the identifier may be a time stamp representing the last time and date the file associated with the identifier was written into the quadrant. Such unique identifier, typically between 32-bit and 128-bit long can be written into one or more of the cache slices as part of the writing of the file itself into the other memory slices in the same half-block. Files are written sequentially into available erased space, and the identifiers can be assigned by incrementing the previous unique identifier by one for each new file written into memory. If desired, new files can be written into partial slices and the unwritten part of the slice can be used for writing part or whole of the next file, to avoid wasting storage space. Writing sequentially until the entire memory space of the system is used helps level out the wear-out of TFTs throughout the system. Other on-chip resource management data may include chip, block, plane, slice, page and string parameters, address locations of faulty strings and their replacement strings, defective pages, defective planes, defective slices and defective blocks and their substitute replacements, file identifiers for all files resident in the block, look up tables and link lists for skipping over unusable memory, block-erase cycle counts, optimum voltages and pulse shape and durations for erase, program, program-inhibit, program scrub, read, margin read, read refresh, read scrub operations, error correcting codes, and data recovery modes, and other system parameters.

Because of the modularity of each chip at the block level and the low power operation attendant to Fowler-Nordheim tunneling for program and erase, it is possible to design the chip to execute simultaneously erase of some blocks, programming at some other blocks, and reading one or more of remaining blocks. The system controller can use that parallelism of operations at the block level to work in background mode; for example, the system controller may delete (i.e. erase, so as to free up space) some blocks or entire chips, de-fragment fragmented files into consolidated files, move files, blocks or chips that have been inactive for longer than a predetermined time to slower or archival storage, or to chips that group together files with close dates and time stamps, while rewriting the original file identifier with the latest time stamp into cache storage 116 of the next available physical block.

To facilitate high-speed searches for the location of the most current version of any one file out of the many millions such files in a petabyte storage system, it is important that the unique identifier for each file, wherever it has been physically relocated to, be accessed quickly by the system controller. According to one embodiment of the present invention, a system controller broadcasts the unique identifier (i.e., the 32-128 bits word) for the file being searched simultaneously to some or all the chips in the system. Each chip is provided with a buffer memory to temporarily store that identifier and, using on-chip Exclusive-Or (XOR) circuits, compare the identifier in the buffer memory with all the identifiers stored on cache 116 of each block and report to the system controller when a match has been found, together with the location where the corresponding file is located. If more than one match is found, the system controller picks the identifier with the most recent timestamp. The search can be narrowed to just a few chips if the file being searched has been written within a known time period. For a 1-terabit chip, just one 128-Kbit slice or 16×8 Kb pages would be sufficient to store all the 64-bit identifiers for all 2K slices of each block.

TFT Pairs for Fast Read Cache Memory.

To reduce read latency for cache storage 116, TFTs in NOR strings that are physically nearest to sense amplifiers 206 can be arranged in pairs. For example, in adjacent NOR strings, two TFTs related by a common local word line may be shared to store a single data bit between them. For example, in embodiment EMB-3 (FIG. 2k), plane 202-7 includes a pair of TFTs from adjacent active strips share local word lines 208-W (e.g., TFT 281 on one NOR string can serve as a reference TFT for TFT 283, or vice versa). In a typical programming operation, TFTs on both NOR strings are initialized to the erased state, then one of the TFTs, say TFT 281, is programmed to a higher threshold voltage, while TFT 283 is program-inhibited, so as to remain in the erased state. Both TFTs on the two adjacent active strips are read simultaneously by a differential sense amplifier in substrate circuitry when their shared local word line 208W is raised to the read voltage, the first TFT that start to conduct tips the sense amplifier into state '0' or state '1', depending on whether TFT 281 or TFT 283 is the programmed TFT.

This TFT-pair scheme has the advantage of high-speed sensing and higher endurance because TFTs of two adjacent NOR strings are almost perfectly matched, so that at the sense amplifier even a small programmed voltage differential between the two TFTs being read will suffice to correctly trip the sense amplifier. In addition, as the threshold voltage of a programmable reference TFT may drift over many write/erase cycle during the life of the device, under this scheme the reference TFT and the read TFT are both reset with each new cycle. In fact, either one of the two TFTs in the pair can serve as the reference TFT. If the two TFTs making the pair are randomly scrambled to invert or not invert the data written in each cycle, to ensure that statistically each TFT in each pair serves as the reference TFT for approximately the same number of cycles as the other TFT. (The invert/not invert code can be stored in the same page as the page being programmed, to assist in the descrambling during a read operation). Because the paired TFTs are in close proximity to each other, i.e., on two adjacent active strips on the same plane, the TFTs can best track each other for local variations in the manufacturing process or to best neutralize (i.e. cancel out) the strip leakage during a read operation.

Alternatively, the TFT pairing scheme may be applied to TFTs on different planes where the pair shares a common vertical local word line. The one drawback of this scheme is that it cuts the silicon efficiency by nearly 50%, as the two TFTs are required to store one bit between them. For this reason, each block can be organized such that only a small percentage (e.g. 1% to 10%) of the block is used as high-speed dual TFT pairs, while the rest of the block is operated as regular NOR strings and programmable reference TFT strings. The actual percentage set aside for the TFT-pair scheme can be altered on the fly by the system controller, depending on the specific usage application. The high level of flexibility for operating the NOR strings of the present invention result from the fact that the TFTs in a NOR string are randomly addressable and operate independently of each other, or of TFTs in other NOR strings, unlike conventional NAND strings.

Numerous applications of data storage, such as video or high resolution imaging require data files that occupy many pages or even many slices. Such files can be accessed rapidly in a pipelined fashion, i.e., the system controller stores the first page or first slice of the file in the cache memory while storing the remaining pages or slices of the file in a low-cost memory and streaming out the data in a pipeline sequence. The pages or slices may thus be linked into a continuous stream, such that the first page of the file is read quickly into the sense amplifiers and transferred to a data buffer shift register to clock the first page out of the block while pre-charging and reading the next, slower page in a pipeline sequence, thereby hiding the read access time of each page following the first page. For example, if the first page of 8 Kbits stored in the cache memory is read in 10 nanoseconds and then clocked out at 1 Gbit per second, the entire 8K bits would take approximately 1 microsecond to complete clocking out, which is more than sufficient time for the second page to be read from the slower, lower-cost pages. The flexibility afforded by pre-charging randomly selected TFT strings makes it possible for one or more data files from one or more blocks to be read concurrently, with their data streams routed on-chip to one or more data input/output ports.

Random Access Reads

The pre-charging scheme of the current invention allows data to be programmed to be serially clocked into, or randomly accessed, and likewise read out serially in a stream or randomly accessed by words. For example, an addressed page in one plane can be read in one or more operations into the sense amplifiers, registers or latches of the addressed plane, after which it can be randomly accessed in 32-bit, 64-bit or 128-bit words, one word at a time, for routing to the input/output pads of the chip. In this manner, the delay attendant to streaming the entire page sequentially is avoided.

In all embodiments, for example FIG. 2h, only TFTs on one of the two sides of an active strip can participate in any one read operation; every TFT on the other side of an active strip must be set to the "off" state. For example, if TFT 285 is being read then TFT 283 on the same active strip must be shut off. Other schemes to read the correct state of a multi-state TFT are known to those of ordinary skill in the art.

Reading TFTs of the present invention is much faster than reading conventional NAND flash memory cells because, in a NOR string, only the TFT to be read is required to be "on", as compared to a NAND string, in which all the TFTs in series with the one TFT being read must also be "on". In embodiments in which metallic sublayer 224 is not provided as integral part of the active layer (see, e.g., memory structure 220a of FIG. 2b-1), for a string with 1,024 non-volatile TFTs on each side, a typical line resistance for each active strip is ~500,000 Ohm and a typical capacitance of the active strip (e.g., capacitor 360 in FIG. 3a) is ~5 femtofarads, to provide an RC time delay in the order of under 10 nanosecond. The time delay may be significantly reduced if metallic sublayer 224 is provided to reduce the line resistance of the active strip. To further reduce read latency, some or all the planes in selected memory blocks may be kept pre-charged to their read voltages $V_{ss}$ (source line) and $V_{bl}$ (bit line), thereby rendering them ready to immediately sense the addressed TFT (i.e., eliminating the time required for pre-charge immediately before the read operation). Such ready-standby requires very little standby power because the current required to periodically re-charge capacitor 360 to compensate for charge leakage is very small. Within each block, all NOR strings on all eight or more planes can be pre-charged to be ready for fast read; for example, after reading TFTs in NOR strings of plane 207-0 (FIG. 2*a*), TFTs in NOR strings of plane 207-1 can be read in short order because its source and bit line voltages $V_{ss}$ and $V_{bl}$ are already previously set for a read operation.

In memory block 100, only one TFT per NOR string can be read in a single operation. In a plane with eight thousand side by side NOR strings, the eight thousand TFTs that share a common global word line may all be read concurrently, provided that each NOR string is connected to its own sense amplifier 206 in substrate 201 (FIG. 2*c*). If each sense amplifier is shared among, for example, four NOR strings in the same plane using a string decode circuit, then four read operations are required to take place in four successive steps, with each read operation involving two thousand TFTs. Each plane can be provided its own set of dedicated sense amplifiers or, alternatively one set of sense amplifiers can be shared among NOR strings in the eight or more planes through a plane-decoding selector. Additionally, one or more sets of sense amplifiers can be shared between NOR strings in quadrants and their mirror image quadrants (see, e.g., sense amplifiers (SA) 206 in FIGS. 6*a*, 6*b*, and 6*c*). Providing separate sense amplifiers for each plane allows concurrent read operations of NOR strings of all planes, which correspondingly improves the read operation throughput. However, such higher data throughput comes at the expense of greater power dissipation and the extra chip area needed for the additional sense amplifiers (unless they can be laid out in substrate 201 underneath block 100). In practice, just one set of sense amplifiers per stack of NOR strings may suffice because of the pipeline clocking or data in and out of the memory block, so that while a first page in one plane is being transferred out of its sense amplifiers to a high speed shift register, the first page of the second plane is being read into the second set of sense amplifiers, with the two sets sharing one set of input/output shift registers.

Parallel operations may also create excessive electrical noise through ground voltage bounces when too many TFTs are read all at once. This ground bounce is substantially suppressed in all embodiments that rely on pre-charging capacitor 360 to set and temporarily hold the virtual $V_{ss}$ voltage for each active strip. In this case, source voltage $V_{ss}$ of all NOR strings is not connected to the chip's $V_{ss}$ ground line, allowing any number of active strips to be sensed simultaneously without drawing charge from the chip ground supply Program (Write) and Program-Inhibit Operations.

There are several methods to program an addressed TFT in a NOR string to its intended threshold voltage. The most common method, employed by the industry for the past 40 years, is by channel hot-electron injection. The other commonly used method is by tunneling, whether direct tunneling or Fowler-Nordheim tunneling. Either one of these tunneling and charge-trapping mechanisms is highly efficient, so that very little current is needed to program a TFT in a NOR string, allowing parallel programming of hundreds of thousands of such TFTs with minimal power dissipation. For illustration purpose, let us assume that programming by tunneling requires a 20V pulse of 100 microseconds (us) duration to be applied to the addressed word line (control gate), with 0V applied to the active strip (e.g., an active strip formed out of active layer 202-0 in FIG. 2*a*). Under these conditions, $N^+$ sublayers 221 and 223 (FIG. 2*b*-1), serving respectively as source and drain regions, are both set at 0V. $P^-$ channel sublayer 222 of the TFT is inverted at the surface, so that electrons tunnel into the corresponding charge-trapping layer. TFT Programming can be inhibited by applying a half-select voltage (e.g., 10V in this example) between the local word line and the source and drain regions. Program-inhibit can be accomplished, for example, either by lowering the word line voltage to 10V, while keeping the strip voltage at 0 volt, or by raising to 10V the active strip voltage, while keeping the word line voltage at 20V, or some combination of the two.

Only one TFT in one addressed active strip can be programmed at one time, but TFTs on other active strips can be programmed concurrently during the same programming cycle. When programming one of the many TFTs on one side edge of an addressed active strip (e.g., one TFT in the even-addressed NOR string), all other TFTs in the NOR string are program-inhibited, as are all TFTs on the other side edge of the active strip (e.g., all TFTs in the odd-addressed NOR string).

Once the addressed TFT is programmed to the target threshold voltage of its designated state, program-inhibition of that TFT is required, as overshooting that target voltage will exert unnecessary stress on the TFT. When MLC is used, overshooting the target voltage may cause overstepping or merging with the threshold voltage of the next higher target threshold voltage state, and the TFT that has reached its intended threshold voltage must therefore be program-inhibited. It should be noted that all TFTs in the adjacent active strips on the same plane that share the same global word line and its associated local word lines are exposed to the 20V programming voltage—and are required to be program-inhibited once they have been programmed to their target threshold voltages. Also, TFTs that are in the erased state and that are to remain erased need to be program-inhibited. Similarly, all TFTs on other planes that are within the same block and that share the same global word line and its associated local word lines (i.e. all TFTs in a slice 114)—and thus, are also exposed to the 20V programming voltage—are also required to be program-inhibited. These program and program-inhibit conditions can all be met for the memory blocks of the present invention because the even and odd sides of each active strip are controlled by different global word lines and their associated local word lines, and because the voltages on the shared source and bit lines of each active strip regardless of its plane can be set independently from all other active strips on the same plane or on other planes.

In one example of a programming sequence, all TFTs in a block are first erased to a threshold voltage of around 1V. The voltage on the active strip of each addressed TFT is then set to 0V (e.g., through connections 270 in conjunction with pre-charge word line 208-CHG, or through hard-wire connections 280, as illustrated in FIG. 3*a*), if the addressed TFT is to be programmed; otherwise, the voltage on the shared source line of the active strip of the addressed TFT is set to ~10V if it is to remain in its erased state (i.e., program-inhibited). The global word line associated with the addressed TFT is then raised to ~20V, either in one step or in short-duration steps of incrementally increasing voltages, starting at around 14V. Such incremental voltage steps reduce the electrical stress across the charge-trapping layer of the TFT and avoid overshooting the target programmed threshold voltage. All other global word lines in the block are set at half-select 10V. All active strips on all planes that are not being addressed in the memory block, as well as all active strips within the addressed plane that are not individually addressed, are also set at 10V, where they may be floated by ensuring that their access transistors (not shown) to substrate circuitry 206-0 and 206-1 of FIG. 2c are off. Of importance, if any of the active strips on all planes that are not being addressed in the memory block, as well as all active strips within the addressed plane that are not individually addressed, are floated with their voltage set at ~0V, i.e. not in program-inhibit mode, they may be erroneously programmed. These active strips are strongly capacity-coupled to their local word lines, which are at 10V, and thus float at close to 10V. Each of the incrementally higher voltage programming pulses is followed by a read cycle to determine if the addressed TFT has reached its target threshold voltage. When the target threshold voltage is reached, the active strip voltage is raised to ~10V (alternatively the strip is floated, and rises close to 10V when all but the one addressed global word lines in the block are raised to 10V) to inhibit further programming, while the global word line continues to program other addressed strips on the same plane that have not yet attained their target threshold voltages. This program/read-verify sequence terminates when all addressed TFTs have been read-verified to be correctly programmed. All blocks on a chip that are dormant, i.e. they are not frequently accessed, should preferably be powered down, for example by setting the voltage on their active strips and conductors at ground potential.

When MLC is used, programming of the correct one of the multiple threshold voltage states can be accelerated by parallel programming of all target voltage states in parallel. First, capacitors 360 of all addressed active strips (see, e.g., through connections 270 and pre-charge word lines 208-CHG of FIG. 3a) are pre-charged to one of several voltages (e.g., 0, 1.5, 3.0, or 4.5V, if two bits of information are to be stored in each TFT). A ~20V pulse is then applied to the addressed global word line, which expose the charge-trapping layers of the TFTs to different effective tunneling voltages (i.e., 20, 18.5, 17, or 15.5V, respectively), resulting in the correct one of the four threshold voltages being programmed in a single coarse programming step. Thereafter, fine programming pulses may be applied at the individual TFT level.

Because of the intrinsic parasitic capacitance C of every active strip in the block, all active strips on all planes in a block can have their pre-charge voltage states set in place (either in parallel or sequentially) in advance of applying the high voltage pulsing on the addressed global word line. Consequently, concurrent programming of a great many TFTs can be achieved. For example, in FIG. 1a-2, all TFTs in one page 113, or all pages in one slice 114 can be course-programmed in one high voltage pulsing sequence. Thereafter, individual read-verify, and where necessary, resetting properly programmed active strips into program-inhibit mode can be carried out. Pre-charging is advantageous, as programming time is relatively long (e.g., around 100 microsecond) while pre-charging all capacitors 360 or read-verifying of addressed TFTs can be carried out over a time period that is around 100 nanoseconds, or 1,000 times faster. Thus, it is advantageous to program a large number of TFTs in a single global word line programming sequence, and this is made possible because the programming mechanisms of direct tunneling or Fowler-Nordheim tunneling require only a small current per TFT being programmed. The programming typically requires trapping a hundred or less electrons in the charge-trapping material to shift. The TFT threshold by one or more volts, and these electrons can readily be supplied from the reservoir of electrons pre-charged onto the parasitic capacitor of the active string, provided that the string has sufficient number of TFTs contributing to parasitic capacitance.

It is important to note that, because of the poor efficiency of programming TFTs with the conventional channel hot-electron injection mechanism—requiring several orders of magnitude more electrons, as compared to programming by tunneling—to adequately shift the threshold voltage of one TFT, channel hot-electron injection is not suitable for use with embodiments relying on pre-charging multiple active strips. Instead, channel hot-electron injection programming requires hard-wired connections to the addressed source and drain regions during programming, thus severely limiting the ability to perform parallel programming.

Erase Operations

With some charge-trapping layers, erase is accomplished through reverse-tunneling of the trapped electron charge, or tunneling of holes to electrically neutralize the trapped electrons. Erase is slower than programming and may require tens of milliseconds of erase pulsing. Therefore, the erase operation is frequently implemented at the block, or at the multiple blocks level, often in a background mode. The blocks to be erased are tagged to be pre-charged to their predetermined erase voltages, followed by concurrently erasing all the tagged blocks and discontinuing erase of those blocks that have been verified to be properly erased, while continuing to erase the other tagged blocks. Typically, block erase can be carried out by applying ~20V to the P− sublayer 222 (FIG. 2b-1) of every active strip through connection through pillars 290 (FIGS. 3a, 4d, 2k-1), while holding all global word lines in the block at 0V. However, since pillars 290 cannot be employed in embodiments where metallic sublayers 224 are used, as they provide a path for excessive leakage between different planes, one alternative method to erase all TFTs in the block in the absence of substrate contact to P− channels 222 is by doping the P− sublayers 222 to the relatively high range of $1\times10^{17}/cm^3$ to $1\times10^{18}/cm^3$ so as to increase the N+P− reverse bias conduction characteristics. Then, when N+ sublayers 221 and 223 of all active strips that are to be erased are raised to ~20V (through substrate connection 206-0 of FIG. 2c), reverse junction leakage brings the voltage on P− sublayers 222 (channel region) to close to 20V, initiating tunnel erase by ejecting electrons trapped in the charge-trapping layer into the P− sublayer 222 for all TFTs with local word lines held at ~0V.

Partial block erase is also possible. For example, if only TFTs on one or more selected slices 114 (FIG. 6b) are to be erased, pillars 290 that typically are shared by all active strips in block 100 are connected to the substrate circuitry (e.g., substrate circuitry 262-0 in FIG. 5b) to supply the high erase voltage $V_{erase}$ to the P− sublayer 222 (channels) of all TFTs in the block. The global word lines of all slices in the block other than the slices selected for erase are held at half-erase voltage ~10V or they are floated. The one or more slices to be erased have their global word line brought to ~0V for the duration of the erase pulse. This scheme requires that strip-select decoders employ high voltage transistors that can withstand erase voltage $V_{erase}$~20 volts at their junctions. Alternatively, all but the addressed global word line are held at zero volts, while pulsing the addressed global word line to −20V supplied from the substrate and charging all active strips in planes 202-0 through 202-7 to 0V. This method allows partial-block erase of one or more Z-X slices 114 of all TFTs sharing the addressed global word lines.

Other schemes are possible for partial block erase. For example, if one or more selected Z-X slices is to be erased while all others are to be erase-inhibited; all global word lines in the block are first held at 0V, while all strings in the block are charged from the substrate to the half-select voltage ~10V and then are left isolated (floated) by switching off their access select transistors (not shown) in substrate 270. Then, all global word lines in the block are raised to ~10V, thereby boosting the voltage on all active strings to ~20V by capacitive coupling. Then, the global word lines of the one or more Z-X slices to be erased are brought to 0V while the remaining global word lines continue to be held at 10V for the duration of the erase pulse. Note that, to select active strips for partial block erase, their access transistors in substrate 270 may need to be high-voltage transistors, able to hold the ~20V of charge on the active strip for a duration in excess of the time required for the program or erase operation. The magnitude and duration of erase pulses should be such that most TFTs are erased to a slight enhancement mode threshold voltage, between zero and one volts. Some TFTs may overshoot and be erased into depletion mode (i.e., having a slightly negative threshold voltage). Such TFTs are required to be soft-programmed into a slight enhancement mode threshold voltage subsequent to the termination of the erase pulses, as part of the erase sequence.

Fringing-Field Assisted Lateral Hopping Tunnel Erase in Highly Scaled Short-Channel TFTs.

Figure 7:
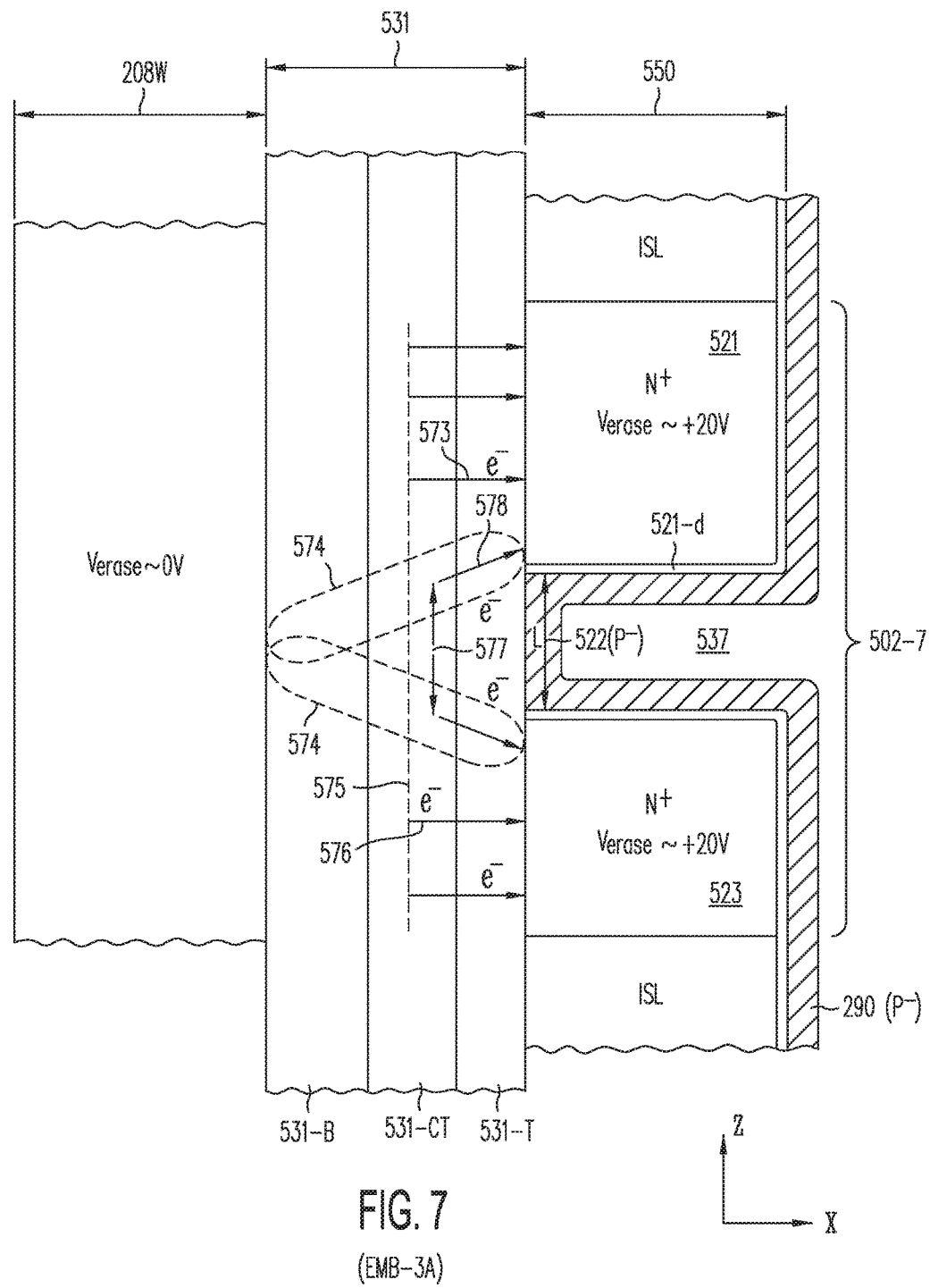
FIG. 7 is a cross section in the Z-X plane of active layer 502-7 of embodiment EMB-3A, showing in greater detail short-channel TFT $T_R$ 585 of FIG. 5g, in which N⁺ sublayer 521 serves as source and N⁺ sublayer 523 serves as drain and P⁻ sublayer 522 serves as channel in conjunction with charge storage material 531 and word line 208W.

As previously discuss in this disclosure, active strips of the present invention can be made with ultra-short channel TFTs (e.g., P$^-$ sublayer 522 of TFT $T_R$ 585 of embodiment EMB-3A in FIG. 5g may have an effective channel length L as short as 10 nm). FIG. 7 is a cross section in the Z-X plane of active layer 502-7 of embodiment EMB-3A, showing in greater detail short-channel TFT $T_R$ 585 of FIG. 5g, in which N$^+$ sublayer 521 serves as source and N+ sublayer 523 serves as drain and P$^-$ sublayer 522 serves as channel in conjunction with charge storage material 531 and word line 208W. FIG. 7 illustrates erasing TFTs of a sufficiently short channel length L using the lateral-hopping of trapped electrons mechanism within charge-trapping material 531-CT (as indicated by arrow 577), accompanied by electron-tunneling into N$^+$ sublayer 521 and N$^+$ sublayer 523 (as indicated by arrow 578) under the fringing electric fields in ellipsoid space 574 that is provided by the voltage (~0V) on word line 208W and the voltage (~20V) on both N$^+$ sublayers 521 and 523.

As shown in FIG. 7, the charge-trapping layer 531 consists of tunnel dielectric sublayer 531-T, Charge-trapping sublayer 531-CT (e.g., silicon-rich silicon nitride), and blocking dielectric sublayer 531-B. Because of its very short channel length, the overlying channel (i.e., P− sublayer 522) becomes strongly influenced by fringing electric fields (indicated in FIG. 7 by dashed ellipsoids 574) between local word line 208W and N$^+$ sublayer 521 (the source region) and N$^+$ sublayer 523 (the drain region).

During erase, electrons (indicated by dashed line 575) that are trapped in charge-trapping sublayer 531-CT are removed by tunneling, as indicated by arrows 573 and 576, to the source region (N+ sublayer 521) and the drain region (N$^+$ sublayer 523), respectively, which are both held at a high erase voltage $V_{erase}$~20V. In some circumstances, voltage $V_{erase}$ on P− channel 522 may be lower than ~20V, particularly if P$^-$ pillars 290 are not provided, or are unable to supply the full ~20V from the substrate, so that tunnel-erase of electrons trapped close to the P$^-$ sublayer 522 may be less effective. However, fringing fields 574 assist in lateral migration (i.e., sideways, as indicated by arrows 577) of electrons in the silicon-rich silicon nitride of charge-trapping sublayer 531-CT. This lateral migration is often referred to as hopping or Frankel-Poole conduction, resulting from electrons being attracted to the ~20V on the nearby source and drain regions. Once electrons have migrated sufficiently close to the source and drain regions, the electrons can tunnel out of charge-trapping sublayer 531-CT, as indicated by arrow 578. This fringing field-assisted erase mechanism becomes increasingly more effective with shorter channel length (e.g., in the range of 5 nanometers to 40 nanometers), provided the source-drain leakage is tolerable for the short channel. For highly-scaled channel length, the source-drain leakage is suppressed by making the P$^-$ sublayer 522 as thin as possible (e.g., in the range of 8 to 80 nanometers thick), so that it is readily depleted all the way through its thickness, when the transistor is in its "off" state.

Quasi-Volatile Random Access TFT Memory Strings in Three Dimensional Arrays.

The charge-trapping material (e.g., an ONO stack) described above has a long data retention time (typically measured in many years), but low endurance. Endurance is a measure of a storage transistor's performance degradation after some number of write-erase cycles. Endurance of less than around 10,000 cycles is considered too low for some storage applications requiring frequent data rewrites. However, the NOR strings of embodiments EMB-1, EMB-2, and EMB-3 of the present invention may be provided a charge-trapping material that substantially reduces retention times, but significantly increases endurance (e.g., reducing retention time from many years to minutes or hours, while increasing endurance from ten thousand to tens of millions of write/erase cycles). For example, in an ONO film or a similar combination of charge-trapping layers, the tunnel dielectric layer, typically 5-10 nm of silicon oxide, can be thinned to 3 nanometers or less, replaced altogether by another dielectric (e.g., silicon nitride or SiN) or no be simply eliminated. Similarly, the charge-trapping material layer may be a more silicon-rich silicon nitride (e.g., $Si_{1.0}N_{1.1}$), which is more silicon-rich than conventional $Si_3N_4$. Under a modest positive control gate programming voltage, electrons may directly tunnel through the thinner tunnel dielectric layer into the silicon nitride charge-trapping material layer (as distinct from Fowler-Nordheim tunneling, which typically requires higher voltages to program). The electrons may be temporarily trapped in the silicon nitride charge-trapping layer for a few minutes, a few hours, or a few days. The charge-trapping silicon nitride layer and the blocking layer (e.g., silicon oxide, aluminum oxide, or other high-K dielectrics) keep electrons from escaping to the control gate (i.e., word line). However, the trapped electrons will eventually leak back out to N$^+$ sublayers 221 and 223, and P$^-$ sublayer 222 of the active strip, as the electrons are negatively charged and repel each other. Even if the 3 nm or less tunnel dielectric layer breaks down locally after extended cycling, the trapped electrons are slow to depart from their traps in the charge-trapping material.

Other combinations of charge storage materials may also result in a high endurance but lesser retention ("semi-volatile" or "quasi-volatile") TFT. Such a TFT may require periodic write refresh or read refresh to replenish the lost charge. Because the TFTs of embodiments EMB-1, EMB-2 and EMB-3 provide DRAM-like fast read access time with low latency, by including any of the high endurance charge-trapping layers in the TFTs, NOR string arrays having such TFTs may be used in some applications that currently require DRAMs. The advantages of such NOR string arrays over DRAM include: a much lower cost-per-bit because DRAMs cannot be readily built in three-dimensional blocks, and a much lower power dissipation, as the refresh cycles need only be run approximately once every few minutes or once every few hour, as compared to every ~64 milliseconds required in current DRAM technology. Quasi-volatile embodiments of the NOR string arrays of the present invention appropriately adapt the program/read/erase conditions to incorporate the periodic data refreshes. For example, because each quasi non-volatile TFT is frequently read-refreshed or program-refreshed, it is not necessary to "hard-program" TFTs to provide a large threshold voltage window between the '0' and '1' states that is typical for non-volatile TFTs where a minimum 10 years data retention is required. For example, a quasi-volatile threshold voltage window can be as little as 0.2V to 1V, as compared to 1V to 3V typical for TFTs that support 10-years retention.

Read, Program, Margin Read, Refresh and Erase Operations for Quasi-Volatile NOR Strings.

The quasi-volatile NOR strings or slices of the current invention may be used as alternatives to some or all DRAMs in many memory applications, e.g., the memory devices for supporting central processing unit (CPU) or microprocessor operations on the main board ("motherboard") of a computer. The memory devices in those applications are typically required to be capable of fast random read access and to have very high cycle-endurance. In that capacity, the quasi-volatile NOR strings of the present invention employ similar read/program/inhibit/erase sequences as the non-volatile NOR implementation. In addition, since the charge stored on programmed TFTs slowly leaks out, the lost charge needs to be replenished by reprogramming the TFTs in advance of a read error. To avoid the read error, one may employ "margin read" conditions to determine if a program-refresh operation is required, as are well known to a person skilled in the art. Margin read is an early-detection mechanism for identifying which TFT will soon fail, before it is too late to restore it to its correct programmed state. Quasi-volatile TFTs typically are programmed, program-inhibited or erased at reduced programming voltage ($V_{pgm}$), program inhibit voltage ($V_{inhibit}$) or erase voltage ($V_{erase}$), or are programmed using shorter pulse durations. The reduced voltages or shorter pulse durations result in a reduced dielectric stress on the storage material and, hence, improvement by orders of magnitude in endurance. All slices in a block may require periodic reads under margin conditions to early-detect excessive threshold voltage shifts of the programmed TFTs due to charge leakage from their charge storage material. For example, the erase threshold voltage may be 0.5V±0.2 V and the programmed threshold voltage may be 1.5V±0.2V, so that a normal read voltage may be set at ~1V while the margin-read may be set at ~1.2V. Any slice that requires a program-refresh needs to be read and then correctly reprogrammed into the same slice or into an erased slice in the same block or in another previously erased block. Multiple reads of quasi-volatile TFTs can result in disturbing the erase or program threshold voltages, and may require rewriting the slice into another, erased slice. Read disturbs are suppressed by lowering the voltages applied to the control gate, and the source and drain regions during reads. However, repetitive reads may cumulatively cause read errors. Such errors can be recovered by requiring the data to be encoded with error correcting codes ("ECC").

One challenging requirement for the proper operation of the quasi-volatile memory of the present invention is the ability to read and program-refresh a large number of TFTs, NOR strings, pages or slices. For example, a quasi-volatile 1-terabit chip has ~8,000,000 slices of 128K bits each. Assuming that 8 slices (~1 million) of TFTs can be program-refreshed in parallel (e.g., one slice in each of 8 blocks), and assuming a program-refresh time of 100 microseconds, then an entire chip can be program-refreshed in ~100 seconds. This massive parallelism is made possible in memory devices of the present invention primarily because of two key factors; 1) Fowler-Nordheim tunneling or direct tunneling requires extremely low programming current per TFT, allowing an unprecedented 1 million or more TFTs to be programmed together without expanding excessive power; and 2) the parasitic capacitor intrinsic to a long NOR string enables pre-charging and temporarily holding the pre-charged voltage on multiple NOR strings. These characteristics allow a multitude of pages or slices on different blocks to be first read in margin-read mode to determine if a refresh is required, and if so, the pages or slices are individually pre-charged for program or program-inhibit and then program-refreshed in a single parallel operation. A quasi-volatile memory with average retention time of ~10 minutes or longer will allow the system controller to have adequate time for properly program-refresh, and to maintain a low error rate that is well within the ECC recovery capability. If the entire 1-terabit chip is refreshed every 10 minutes, such a chip compares favorably with a typical 64 milliseconds-to-refresh DRAM chip, or a factor of more than 1,000 times less frequently, hence consuming far less power to operate.

Figure 8A:
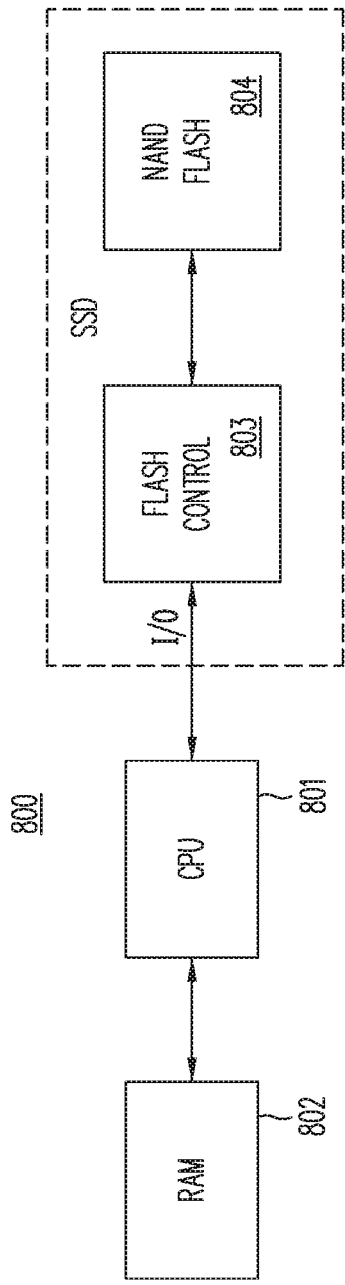
FIG. 8a shows in simplified form prior art storage system 800 in which microprocessor (CPU) 801 communicates with system controller 803 in a flash solid state drive (SSD) that employs NAND flash chips 804; the SSD emulates a hard disk drive and NAND flash chips 804 do not communicate directly with CPU 801 and have relatively long read latency.
Figure 8B:
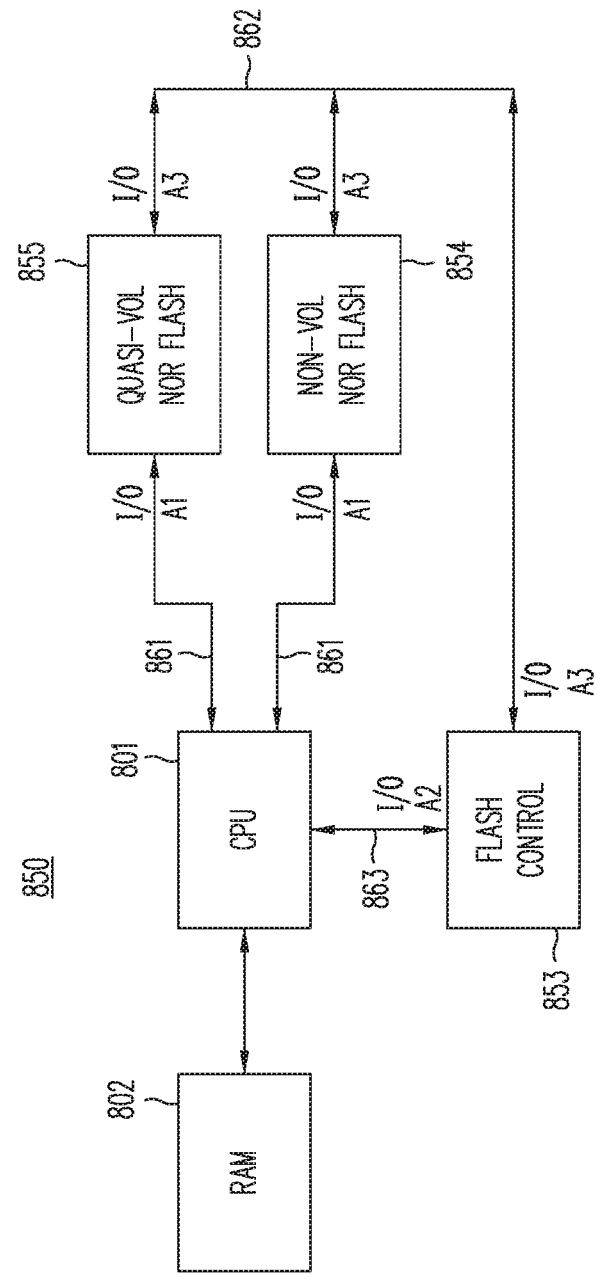
FIG. 8b shows in simplified form system architecture 850 using the memory devices of the present invention, in which non-volatile NOR string arrays 854, or quasi-volatile NOR string arrays 855 (or both) communicate directly with CPU 801 through one or more input and output (I/O) ports 861, and indirectly through controller 863.

FIG. 8a shows in simplified form prior art storage system 800 in which microprocessor (CPU) 801 communicates with system controller 803 in a flash solid state drive (SSD) that employs NAND flash chips 804. The SSD emulates a hard disk drive and NAND flash chips 804 do not communicate directly with CPU 801 and have relatively long read latency. FIG. 8b shows in simplified form system architecture 850 using the memory devices of the current invention, in which non-volatile NOR string arrays 854, or quasi-volatile NOR string arrays 855 (or both) are accessed directly by CPU 801 through one or more of input and output (I/O) ports 861. I/O ports 861 may be one or more high speed serial ports for data streaming in or out of NOR string arrays 854 and 855, or they may be 8-bit, 16-bit, 32-bit, 64-bit, 128-bit, or any suitably sized wide words that are randomly accessed, one word at a time. Such access may be provided, for example, using DRAM-compatible DDR4, and future higher speed industry standard memory interface protocols, or other protocols for DRAM, SRAM or NOR flash memories. I/O ports 862 handle storage system management commands, with flash memory controller 853 translating CPU commands for memory chip management operations and for data input to be programmed into the memory chips. In addition, CPU 801 may use I/O ports 862 to write and read stored files using one of several standard formats (e.g., PCIe, NVMe, eMMC, SD, USB, SAS, or multi-Gbit high data-rate ports). I/O ports 862 communicate between system controller 853 and NOR string arrays in the memory chips.

It is advantageous to keep the system controller (e.g., system controller 853 of FIG. 8b) off the memory chips, as each system controller typically manages a number of memory chips, so that it is disengaged as much as possible from the continuous ongoing margin-read/program-refresh operations, which can be more efficiently controlled by simple on-chip state machines, sequencers or dedicated microcontrollers. For example, parity-check bit (1-bit) or more powerful ECC words (typically, between a few bits to 70 bits or more) can be generated for the incoming data by the off-chip controller or on-chip by dedicated logic or state machines and stored with the page or slice being programmed. During a margin-read operation the parity bit generated on-chip for the addressed page is compared with the stored parity bit. If the two bits do not match, the controller reads again the addressed page under a standard read (i.e. non-margin). If that gives a parity bit match, the controller will reprogram the correct data into the page, even though it is not yet fully corrupted. If the parity bits do not match, then on-chip dedicated ECC logic or the off-chip controller will intervene to detect and correct the bad bits and rewrite the correct data preferably into another available page or slice, and permanently retiring the errant page or slice. To speed up the on-chip ECC operations, it is advantageous to have on-chip Exclusive-Or, or other logic circuitry to find ECC matches quickly without having to go off-chip. Alternatively, a memory chip can have one or more high-speed I/O ports dedicated for communication with the controller for ECC and other system management chores (e.g., dynamic defect management), so as not to interfere with the low latency data I/O ports. As the frequency of read or program-refresh operations may vary over the life of the memory chip due to TFT wear-out after excessive program/erase cycling, the controller may store in each block (preferably in the high-speed cache slices) a value indicating the time interval between refresh operations, This time interval tracks the cycle count of the block. Additionally, the chip or the system may have a temperature monitoring circuit whose output data is used to modulate the frequency of refreshes with chip temperature. It should be clear that the example used here is just one of several sequences possible for achieving automatic program-refresh with rapid correction or replacement of errant pages or slices.

In the example of a 1-terabit chip having only 8 blocks out of 4,000 blocks, or 0.2% or less of all blocks are being refreshed at any one time, program-refresh operations can be performed in a background mode, while all other blocks can proceed in parallel with their pre-charge, read, program and erase operations. In the event of an address collision between the 0.2% and the 99.8% of blocks, the system controller arbitrates one of the accesses is more urgent. For example, the system controller can interrupt a program-refresh to yield priority to a fast read, then return to complete the program-refresh.

In summary, in the integrated circuit memory chip of the present invention, each active strip and its multiple associated conductive word lines are architected as a single-port isolated capacitor that can be charged to pre-determined voltages which are held semi-floating (i.e., subject to charge leaking out through the string-select transistor in the substrate circuitry) during read, program, program-inhibit or erase operations. That isolated semi-floating capacitor of each active strip, coupled with the extremely low Fowler-Nordheim or direct tunneling current required to program or erase the TFTs in a NOR string associated with the active strip, makes it possible to program, erase or read a massive number of randomly selected blocks, sequentially or concurrently. Within the integrated circuit memory chip, the NOR strings of one or more of a first group of blocks are first pre-charged and then erased together, while the NOR strings of one or more other groups of blocks are first pre-charged and then programmed or read together. Furthermore, erasing of the first group of blocks and programming or reading of a second group of blocks can take place sequentially or concurrently. Blocks that are dormant (e.g., blocks that store rarely-changed archival data) are preferably held at a semi-floating state, preferably isolated from the substrate circuits after having their NOR strings and conductors set at ground potential. To take advantage of the massively parallel read and program bandwidths of these quasi-floating NOR strings, it is advantageous for the integrated circuit memory chip to incorporate therein multiple high-speed I/O ports. Data can be routed on-chip to and from these I/O ports, for example, to provide multiple channels for word-wide random access, or for serial data streams out of the chip (reading) or into the chip (programming or writing).

The above detailed description is provided to illustrate specific embodiments of the present invention and is not intended to be limiting. Numerous variations and modification within the scope of the present invention are possible. The present invention is set forth in the accompanying claims.

We claim:

1. A method for a system controller to rapidly determine the location of the most current version of a data file stored on one of many memory circuits, comprising:
   in each memory circuit:
   (a) associating a designated one or more pages of the data file with a unique identifier index number generated by the system controller and appending the unique identifier index number to the data file; and
   (b) associating a time-stamp with the unique identifier index number every time the data file is stored or updated in the memory circuit, wherein all unique identifier index numbers for all files stored in each memory circuit are stored in a lookup table in the memory circuit with the latest time-stamp and the location in the memory circuit at which the file is stored;
   sending from the system controller a search request which is broadcast simultaneously to one or more of the memory circuits, the search request specifying unique identifier index number of the file to be located; and
   in each memory circuit, using exclusive-or (XOR) circuits or content addressable memory (CAM) circuits to compare the broadcasted unique identifier index number with the unique identifier index numbers stored in the look-up table of the memory circuit and reporting to the system controller when a match has been found along with its time-stamp and location, wherein when more than one match is found, the system controller selects from the reported locations the location whose associated time-stamp is the latest among the time-stamps reported.

2. The method of claim 1, wherein each memory circuit comprises a portion which is configured to operate as a low read-latency cache memory, and wherein the look-up table is stored in the cache memory.

3. The method of claim 1, wherein each memory circuit comprises a data integrity circuit which, upon detecting an error in the memory circuit, communicates the error to an on-chip error-correcting circuitry or to the system controller, thereby enabling the on-chip error-correcting circuitry or the system controller to carry out a data recovery and program-refresh operation.

4. The method of claim 1, wherein each memory circuit comprises an interface circuit that allows direct access to the memory circuit using one or more conventional DRAM, SRAM, NOR flash, NAND flash, Flash solid state drive, word-wide or serial bit steaming protocols.

5. The method of claim 1, further comprising, in each memory circuit, performing a read-refresh or program-refresh operation on a portion of the memory circuit in a background mode, while carrying out concurrently read, program, or erase operations in a second portion of the memory circuit and powering down a third portion of the memory circuit.

6. The method of claim 1, further comprising storing on-chip resource management data in each memory circuit, the on-chip resource management data includes one or more of: an updatable file allocation table for files stored in the memory circuit, a program/erase cycle count, chip temperature, and a time-stamp that is appended to each stored data file when it is updated.

7. The method of claim 1, further comprising providing, in each memory circuit, a pipeline streaming circuitry that overlaps sensing a memory page of stored data in sense amplifiers and transferring the sensed data to a data buffer for serial bit stream, or parallel word-wide output from the memory circuit, with concurrently reading a next memory page of the stored data from the memory structure for sensing in the sense amplifies.

8. The method of claim 7, wherein the data buffer is provided between portions of the memory circuit that operates under different speeds.

9. A memory circuit organized into a plurality of memory pages, comprising:
   control circuitry for (a) associating a designated one or more memory pages to a data file and associating with the data file a unique identifier index number generated by a system controller; and associating a time-stamp with the unique identifier index number every time the data file is stored or updated in the memory circuit, wherein all unique identifier index numbers for all files stored in the memory circuit are stored in a lookup table in the memory circuit with the latest time-stamp and the location in the memory circuit at which the file is stored; and
   circuitry for concurrently carrying out (i) a read-refresh or program-refresh operation on a portion of the memory circuit in a background mode, (ii) read, program, or erase operations in a second portion of the memory circuit and (iii) powering down a third portion of the memory circuit.

10. The memory circuit of claim 9, wherein the control circuitry comprises exclusive-or (XOR) circuits or content addressable memory (CAM) circuits for comparing the unique identifier index number of a data file to be located sent from the system controller with the unique identifier index numbers stored in the look-up table and wherein the control circuitry reports to the system controller when a match is found, sending along a time-stamp and a location of the data file found matching.

11. The memory circuit of claim 9, wherein the memory circuit further comprises a portion which is configured to operate as a low read-latency cache memory, and wherein the look-up table is stored in the cache memory.

12. The memory circuit of claim 9, wherein the memory circuit further comprises a data integrity circuit which, upon detecting an error in the memory circuit, communicates the error to an on-chip error-correcting circuitry or to the system controller, thereby enabling the on-chip error-correcting circuitry or the system controller to carry out a data recovery and program-refresh operation.

13. The memory circuit of claim 9, wherein the memory circuit further comprises an interface circuit that allows direct access to the memory circuit using one or more conventional DRAM, SRAM, NOR flash, NAND flash, Flash solid state drive, word-wide or serial bit steaming protocols.

14. The memory circuit of claim 9, further comprising storage for on-chip resource management data, the on-chip resource management data includes one or more of: an updatable file allocation table for files stored in the memory circuit, a program/erase cycle count, chip temperature, and a time-stamp that is appended to each stored data file when it is updated.

15. The memory circuit of claim 9, further comprising pipeline streaming circuitry that overlaps sensing a memory page of stored data in sense amplifiers and transferring the sensed data to a data buffer for serial bit stream, or parallel word-wide output from the memory circuit, with concurrently reading a next memory page of the stored data from the memory structure for sensing in the sense amplifies.

16. The memory circuit of claim 15, wherein the data buffer is provided between portions of the memory circuit that operates under different speeds.

* * * * *